(12) United States Patent
Leung et al.

(10) Patent No.: US 12,240,864 B2
(45) Date of Patent: Mar. 4, 2025

(54) PHOSPHINE OXIDE GROUP-CONTAINED TRANSITION METAL COMPLEX, AND POLYMER, MIXTURE, COMPOSITION, AND ORGANIC ELECTRONIC DEVICE THEREOF

(71) Applicants: GUANGZHOU CHINARAY OPTOELECTRONIC MATERIALS LTD., Guangdong (CN); THE UNIVERSITY OF HONG KONG, Hong Kong (CN)

(72) Inventors: Chi Ming Leung, Guangdong (CN); Wing-Wah Vivian Yam, Hong Kong (CN); Sihang Chen, Guangdong (CN); Hong Huang, Guangdong (CN); Junyou Pan, Guangdong (CN); Caijuan Yan, Guangdong (CN)

(73) Assignees: GUANGZHOU CHINARAY OPTOELECTRONIC MATERIALS LTD., Guangdong (CN); THE UNIVERSITY OF HONG KONG, Hong Kong (CN)

( * ) Notice: Subject to any disclaimer, the term of this patent is extended or adjusted under 35 U.S.C. 154(b) by 716 days.

(21) Appl. No.: 17/415,605

(22) PCT Filed: Dec. 16, 2019

(86) PCT No.: PCT/CN2019/125714
§ 371 (c)(1),
(2) Date: Jun. 17, 2021

(87) PCT Pub. No.: WO2020/125589
PCT Pub. Date: Jun. 25, 2020

(65) Prior Publication Data
US 2022/0064197 A1 Mar. 3, 2022

(30) Foreign Application Priority Data
Dec. 17, 2018 (CN) .......................... 201811542628.9

(51) Int. Cl.
| | | |
|---|---|---|
| *C07F 15/00* | (2006.01) | |
| *H10K 50/11* | (2023.01) | |
| *H10K 85/30* | (2023.01) | |
| *H10K 101/10* | (2023.01) | |
| *H10K 101/30* | (2023.01) | |
| *H10K 101/40* | (2023.01) | |

(52) U.S. Cl.
CPC ....... *C07F 15/0033* (2013.01); *H10K 85/342* (2023.02); *H10K 50/11* (2023.02); *H10K 2101/10* (2023.02); *H10K 2101/30* (2023.02); *H10K 2101/40* (2023.02)

(58) Field of Classification Search
CPC ............. C07F 15/0033; H10K 85/342; H10K 2101/10; H10K 2101/40; H10K 2101/30; H10K 50/11; C08G 2261/124; C08G 2261/1424; C08G 2261/148; C08G 2261/312; C08G 2261/3142; C08G 2261/41; C08G 2261/512; C08G 2261/514; C08G 2261/76; C08G 2261/91; C08G 61/121; H01L 51/0039; H01L 51/5056; H01L 51/5072; H01L 51/0043
See application file for complete search history.

(56) References Cited

U.S. PATENT DOCUMENTS

2009/0134784 A1   5/2009  Lin et al.
2018/0287077 A1  10/2018  Joseph et al.

FOREIGN PATENT DOCUMENTS

| CN | 106928283 A | 7/2017 |
|---|---|---|
| KR | 20110113467 A | 10/2011 |
| WO | 2010135519 A1 | 11/2010 |
| WO | 2011110277 A1 | 9/2011 |
| WO | 2011141110 A2 | 11/2011 |
| WO | 2016091217 A1 | 6/2016 |
| WO | 2018113782 A1 | 6/2018 |

OTHER PUBLICATIONS

Bartolome' et al. (Eur. J. Inorg. Chem. 2004, 2326-2337).*
Baldo et al. "Very high-efficiency green organic light-emitting devices based on electrophosphorescence" Appl. Phys. Lett., Jul. 5, 1999, vol. 75, pp. 4-6.
Adachi et al., "Endothermic energy transfer: A mechanism for generating very efficient high-energy phosphorescent emission in organic materials" Appl. Phys. Lett. 2001, vol. 79, pp. 2082-2084.
Bulovic et al. "Transparent light-emitting devices" Nature, Mar. 7, 1996, vol. 380, pp. 29.
Gu et al. "Transparent organic light emitting devices" Appl. Phys. Lett., May 6, 1996, vol. 68, pp. 2606-2608.
Alcock et al., "Synthesis and easy racemisation of an atropisomerically chiral phosphinamine", vol. 3, Dec. 31, 1992, p. 17-20.
Mukai et al., "4_5-Bis(diphenylphosphinoyl)-1_2_3-triazole ligand_ Studies on metal complex formations in liquid-liquid distribution systems", vol. 362, Jun. 13, 2009, pp. 4526-4533.
International Application No. PCT/CN2019/125714, International Search Report mailed Mar. 18, 2020, 2 pages.

* cited by examiner

*Primary Examiner* — Shane Fang
(74) *Attorney, Agent, or Firm* — PV IP PC; Wei Te Chung

(57) ABSTRACT

A phosphine oxide group-contained transition metal complex represented by chemical formula (1), and a polymer, a mixture, a composition, and an organic electronic device.

18 Claims, No Drawings

PHOSPHINE OXIDE GROUP-CONTAINED TRANSITION METAL COMPLEX, AND POLYMER, MIXTURE, COMPOSITION, AND ORGANIC ELECTRONIC DEVICE THEREOF

TECHNICAL FIELD

The present disclosure relates to the field of organic electroluminescence, in particular to a phosphine oxide-containing transition metal complex, polymer, mixture, formulation and organic electronic device thereof.

BACKGROUND

In flat-panel display and lighting applications, organic light-emitting diode (OLED) has the advantages of low cost, light weight, low operating voltage, high brightness, color adjustability, wide viewing angle, ease of assembly onto flexible substrates, and low energy consumption, thus it has become the most promising display technology. In order to improve the luminescence efficiency of the organic light-emitting diode, various light-emitting material systems based on fluorescence and phosphorescence have been developed. The organic light-emitting diodes using fluorescent materials have high reliability, but their internal electroluminescence quantum efficiency under electric field excitation is limited to 25%. In contrast, since the ratio of singlet state exciton to triplet state exciton is 1:3, the organic light-emitting diodes using phosphorescent materials can achieve an internal luminescence quantum efficiency of almost 100%. For small molecule OLEDs, the triplet excitation is effectively obtained by doping heavy metal centers, which improves the spin orbit coupling and thus intersystem crossing to the triplet state.

Complexes based on the metal iridium (III) are a class of materials widely used for high efficiency OLEDs, which have relatively high efficiency and stability. Baldo et al. reported an OLED with high quantum efficiency using fac-tris(2-phenylpyridine)iridium(III) [Ir(ppy)$_3$] as the phosphorescent material, and 4,4'-N, N'-dicarbazole-biphenyl (CBP) as the matrix material (Appl. Phys. Lett. 1999, 75, 4). Another example of phosphorescent materials is the sky blue complex, bis[2-(4',6'-difluorophenyl)pyridinato-N,C$^2$]-picolinate iridium (III) (FIrpic), which exhibits an extremely high photoluminescence quantum efficiency of approximately 60% in solution and almost 100% in solid film when it is doped into a high triplet energy matrix (Appl. Phys. Lett. 2001, 79, 2082). Although iridium (III) systems based on 2-phenylpyridine and its derivatives have been widely used for the preparation of OLEDs, the device performance, particularly the lifetime, still needs to be improved.

Phosphine oxide group-based compounds have excellent electron transport capabilities. Generally speaking, organic light-emitting devices using phosphine oxide-containing compounds have the characteristics of high efficiency, low driving voltage, and high brightness. At present, most of the phosphine oxide-based compounds are used on the electron transport layer of OLED devices, which can improve the electron transport characteristics, increase the luminescence efficiency of the device, and reduce the starting voltage, thereby increasing the life span of the device.

Hence, it is desirable to develop such new high-performance metal complexes containing phosphine oxide group to further improve the performance and life span of the device.

SUMMARY

In view of the above-mentioned shortcomings of the prior art, it is necessary to improve the stability of metal organic complexes and the lifetime of organic light-emitting devices. The purpose of the present disclosure is to provide a phosphine oxide-containing transition metal complex, polymer, mixture, formulation and organic electronic device thereof. This is a kind of metal-organic complex light-emitting material with simple synthesis, novel structure and good performance.

The technical solutions of the present disclosure are described below.

A phosphine oxide-containing transition metal complex having a structural formula represented by Chemical Formula (1) is provided:

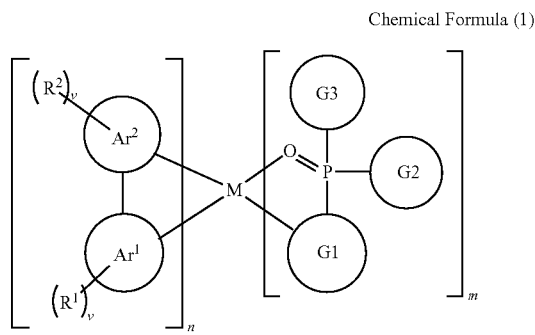

Chemical Formula (1)

wherein:
P is a phosphorus atom, O is an oxygen atom, P and O form a phosphine oxide group with a double bond;

M is a metal atom selected from the group consisting of iridium, gold, platinum, ruthenium, rhodium, osmium, rhenium, nickel, copper, silver, zinc, tungsten or palladium;

n is 0, 1 or 2; m is selected from 1, 2 or 3;

at each occurrence, Ar$^1$, Ar$^2$, and G1 are independently selected from the group consisting of substituted or unsubstituted aromatic groups containing 5 to 20 ring atoms, substituted or unsubstituted heteroaromatic groups containing 5 to 20 ring atoms, or substituted or unsubstituted non-aromatic ring systems containing 5 to 20 ring atoms;

at each occurrence, G2 is independently selected from the group consisting of hydrogen, deuterium, a halogen atom, a linear alkane containing 1 to 30 carbon atoms, a branched or cyclic alkane containing 3 to 30 carbon atoms, and a linear alkene containing 1 to 30 carbon atoms, a branched alkene containing 1 to 30 carbon atoms, an alkane ether containing 1 to 30 carbon atoms, an aromatic group containing 6 to 30 carbon atoms, a heteroaromatic group containing 5 to 30 ring atoms or a non-aromatic ring system containing 3 to 30 ring atoms;

at each occurrence, G3 is independently selected from the group consisting of hydrogen, deuterium, a halogen atom, a linear alkane containing 1 to 30 carbon atoms, a branched or cyclic alkane containing 3 to 30 carbon atoms, and a linear alkene containing 1 to 30 carbon atoms, a branched alkene containing 1 to 30 carbon atoms, an alkane ether containing 1 to 30 carbon atoms, an aromatic group containing 6 to 30 carbon atoms, a heteroaromatic group containing 5 to 30 ring atoms or a non-aromatic ring system containing 3 to 30 ring atoms;

at each occurrence, R$^1$ and R$^2$ are independently selected from the group consisting of deuterium, a halogen atom, a linear alkane containing 1 to 30 carbon atoms, a branched or cyclic alkane containing 3 to 30 carbon atoms, and a linear alkene containing 1 to 30 carbon atoms, a branched alkene containing 1 to 30 carbon atoms, an alkane ether containing 1 to 30 carbon atoms, an aromatic group containing 6 to 30 carbon atoms, a heteroaromatic group containing 5 to 30 ring atoms or a non-aromatic ring system containing 3 to 30 ring atoms, $R^1$ and $R^2$ may be directly connected to each other to form a ring;

v is selected from any integer from 0 to 4.

A polymer comprising at least one transition metal complex as described above as a repeating unit.

A mixture comprising the transition metal complex or the polymer as described above and at least one another organic functional material. The another organic functional material described may be selected from the group consisting of a hole injection material (HIM), a hole transport material (HTM), an electron transport material (ETM), an electron injection material (EIM), an electron blocking material (EBM), a hole blocking material (HBM), an emitter (Emitter), a host material (Host), or a dopant material (Dopants).

A formulation comprising the phosphine oxide-containing transition metal complex or the polymer or the mixture as described above, and at least one organic solvent.

An organic electronic device comprising at least one functional layer, and the functional layer comprising the phosphine oxide-containing transition metal complex or the polymer or the mixture as described above or being prepared from the above mentioned formulation.

Beneficial effects: the use of the transition metal complex according to the present invention in OLEDs, in particular as a dopant material of a light-emitting layer, can provide a relatively high luminescence efficiency and a relatively long life span of the device. Since compounds containing a phosphine oxide group have excellent electron transport capabilities, complexes containing such group can also improve the brightness and current efficiency of the device, and at the same time reduce the starting voltage to increase the life span of the device.

DETAILED DESCRIPTION OF THE EMBODIMENTS

The present disclosure provides a phosphine oxide-containing transition metal complex, a polymer, a mixture, a formulation and an organic electronic device thereof. In order to make the purpose, technical solution and effects of the present disclosure clearer and more specific, the present disclosure will be furthermore described in detail below. It should be understood that the specific embodiments illustrated herein are merely for the purpose of explanation, and should not be deemed to limit the disclosure.

In the present disclosure, formulation, printing ink, or ink, have the same meaning and are interchangeable.

In the present disclosure, host material, matrix material, Host or Matrix material have the same meaning and are interchangeable.

In the present disclosure, metal organic clathrate, metal organic complex, organometallic complex, and transition metal complex have the same meaning and are interchangeable.

In the present disclosure, "substituted" means that the hydrogen atom in the substituted group is replaced by a substituent.

In the present disclosure, the "ring atom number" means the atom number of the atoms constituting the ring itself of the structural compound (such as, a monocyclic compound, a fused ring compound, a cross-linked compound, a carbocyclic compound, a heterocyclic compound) obtained by bonding atoms into rings. When the ring is substituted with a substituent, the atoms contained in the substituent are not included in the ring-constituting atoms. As for the "ring atom number" described below is the same unless otherwise specified. For example, the ring atom number of benzene ring is 6, the ring atom number of naphthalene ring is 10, and the ring atom number of thienyl is 5.

The present disclosure relates to a phosphine oxide-containing transition metal complex having a structure of the general formula represented by Chemical Formula (1):

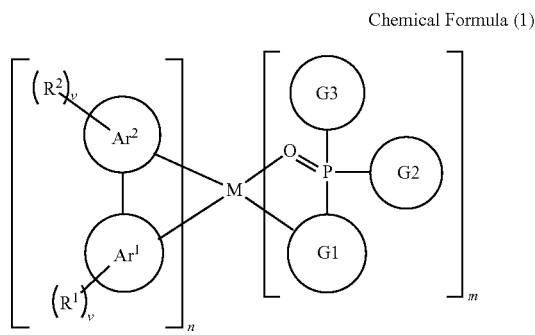

Chemical Formula (1)

wherein:
P is a phosphorus atom, O is an oxygen atom, P and O form a phosphine oxide group with a double bond;

M is a metal atom selected from the group consisting of iridium, gold, platinum, ruthenium, rhodium, osmium, rhenium, nickel, copper, silver, zinc, tungsten or palladium;

n is 0, 1 or 2; m is selected from 1, 2 or 3;

at each occurrence, $Ar^1$, $Ar^2$, and G1 are independently selected from the group consisting of substituted or unsubstituted aromatic groups containing 5 to 20 ring atoms, substituted or unsubstituted heteroaromatic groups containing 5 to 20 ring atoms, or substituted or unsubstituted non-aromatic ring systems containing 5 to 20 ring atoms;

at each occurrence, G2 is independently selected from the group consisting of hydrogen, deuterium, a halogen atom, a linear alkane containing 1 to 30 carbon atoms, a branched or cyclic alkane containing 3 to 30 carbon atoms, and a linear alkene containing 1 to 30 carbon atoms, a branched alkene containing 1 to 30 carbon atoms, an alkane ether containing 1 to 30 carbon atoms, an aromatic group containing 6 to 30 carbon atoms, a heteroaromatic group containing 5 to 30 ring atoms or a non-aromatic ring system containing 3 to 30 ring atoms;

at each occurrence, G3 is independently selected from the group consisting of hydrogen, deuterium, a halogen atom, a linear alkane containing 1 to 30 carbon atoms, a branched or cyclic alkane containing 3 to 30 carbon atoms, and a linear alkene containing 1 to 30 carbon atoms, a branched alkene containing 1 to 30 carbon atoms, an alkane ether containing 1 to 30 carbon atoms, an aromatic group containing 6 to 30 carbon atoms, a heteroaromatic group containing 5 to 30 ring atoms or a non-aromatic ring system containing 3 to 30 ring atoms;

at each occurrence, $R^1$ and $R^2$ are independently selected from the group consisting of deuterium, a halogen atom, a linear alkane containing 1 to 30 carbon atoms, a branched or cyclic alkane containing 3 to 30 carbon atoms, and a linear alkene containing 1 to 30 carbon atoms, a branched alkene containing 1 to 30 carbon atoms, an alkane ether containing 1 to 30 carbon atoms, an aromatic group containing 6 to 30 carbon atoms, a heteroaromatic group containing 5 to 30 ring atoms or a non-aromatic ring system containing 3 to 30 ring atoms, $R^1$ and $R^2$ may be directly connected to each other to form a ring;

v is selected from any integer from 0 to 4.

The aromatic group refers to a hydrocarbyl containing at least one aromatic ring, including monocyclic group and polycyclic ring system. The heteroaromatic group refers to a hydrocarbyl (containing a heteroatom) containing at least one heteroaromatic ring, including monocyclic group and polycyclic ring system. Such polycyclic rings may have two or more rings, wherein two carbon atoms are shared by two adjacent rings, i.e., a fused ring. At least one ring of these polycyclic rings is aromatic or heteroaromatic. For the purpose of the present disclosure, the aromatic or heteroaromatic groups include not only aromatic or heteroaromatic systems, but also systems in which a plurality of aryls or heteroaryls may be interrupted by short non-aromatic units (<10% of non-H atoms, particularly less than 5% of non-H atoms, such as C, N or O atoms). Therefore, groups such as 9,9'-spirobifluorene, 9,9-diarylfluorene, triarylamine, diaryl ether and the like are also considered to be the aromatic groups for the purpose of the present disclosure.

Specifically, examples of the aromatic group include: benzene, naphthalene, anthracene, phenanthrene, perylene, tetracene, pyrene, benzopyrene, triphenylene, acenaphthene, fluorene, and derivatives thereof.

Specifically, examples of the heteroaromatic group include: furan, benzofuran, thiophene, benzothiophene, pyrrole, pyrazole, triazole, imidazole, oxazole, oxadiazole, thiazole, tetrazole, indole, carbazole, pyrroloimidazole, pyrrolopyrrole, thienopyrrole, thienothiophene, furopyrrole, furofuran, thienofuran, benzisoxazole, benzisothiazole, benzimidazole, pyridine, pyrazine, pyridazine, pyrimidine, triazine, quinoline, isoquinoline, o-diazonaphthalene, quinoxaline, phenanthridine, perimidine, quinazoline, quinazolinone, and derivatives thereof.

In some embodiments, groups $Ar^1$, $Ar^2$, G1, G2, and G3 are selected from unsubstituted or R substituted non-aromatic ring systems containing 5 to 20 ring atoms. One possible benefit of this embodiment is that the triplet energy level of the metal complexes can be increased so as to facilitate the acquisition of green or blue light emitters.

For the purpose of the present disclosure, the non-aromatic ring system contains 1 to 10, further 1 to 6 carbon atoms in the ring system, and include saturated and partially unsaturated cyclic groups, which may be unsubstituted or monosubstituted or polysubstituted with one of the groups $R^8$~$R^{13}$, the group R may be the same or different at each occurrence, and may further contain one or more heteroatoms. Further, the heteroatom is selected from Si, N, P, O, S, and/or Ge, and still further, the heteroatom is selected from Si, N, P, O, and/or S. These may be, for example, cyclohexyl-like or piperidine-like groups, also may be cyclooctadiene-like cyclic groups. The term is also suitable for the fused non-aromatic ring systems.

One of R, $R^1$, and $R^2$ may be selected from the group consisting of: (1) a C1-C10 alkyl, further, may be selected from the following groups: methyl, ethyl, n-propyl, isopropyl, cyclopropyl, n-butyl, isobutyl, sec-butyl, tert-butyl, cyclobutyl, 2-methylbutyl, n-pentyl, n-hexyl, cyclohexyl, n-heptyl, cycloheptyl, n-octyl, cyclooctyl, 2-ethylhexyl, trifluoromethyl, pentafluoromethyl, 2,2,2-trifluoroethyl, vinyl, propenyl, butenyl, pentenyl, cyclopentenyl, hexenyl, cyclohexenyl, heptenyl, cycloheptenyl, octenyl, cyclooctenyl, ethynyl, propynyl, butynyl, pentynyl, hexynyl, and octynyl; (2) a C2 to C10 aryl or heteroaryl, which may be monovalent or divalent depending on the use, and may also be substituted with the above-mentioned group R and may be attached to an aromatic or heteroaromatic ring by any desired position in each case, particularly may be selected from the following groups: benzene, naphthalene, anthracene, pyrene, dihydropyrene, chrysene, perylene, fluoranthene, naphthacene, pentacene, benzopyrene, furan, benzofuran, isobenzofuran, dibenzofuran, thiophene, benzothiophene, isobenzothiophene, dibenzothiophene, pyrrole, indole, isoindole, carbazole, pyridine, quinoline, isoquinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthoimidazole, phenanthroimidazole, pyridinimidazole, pyrazinoimidazole, quinoxalinimidazole, oxazole, benzoxazole, naphthoxazole, anthracoxazole, phenanthroxazole, isoxazole, 1,2-thiazole, 1,3-thiazole, benzothiazole, pyridazine, benzopyridazine, pyrimidine, benzopyrimidine, quinoxaline, pyrazine, phenazine, 1,5-naphthyridine, nitrocarbazole, benzocarboline, phenanthroline, 1,2,3-triazole, 1,2,4-triazole, benzotriazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2, 5-thiadiazole, 1,3,4-thiadiazole, 1,3, 5-triazine, 1,2,4-triazine, 1,2,3-triazine, tetrazole, 1,2,4,5-tetrazine, 1,2,3,4-tetrazine, 1,2,3,5-tetrazine, purine, pteridine, indolizine, and benzothiadiazole. For the purpose of the present disclosure, the aromatic and heteroaromatic ring systems further refer to biphenylene, triphenylene, fluorene, spirobifluorene, dihydrophenanthrene, tetrahydropyrene and cis- or trans-indenofluorene, in addition to the above-mentioned aromatic and heteroaromatic groups.

In an embodiment, at each occurrence, $R^1$ and $R^2$ are independently selected from the group consisting of a linear alkane containing 1 to 30 carbon atoms, a branched or cyclic alkane containing 3 to 30 carbon atoms, and an alkane ether containing 1 to 30 carbon atoms, an aromatic group containing 6 to 30 carbon atoms, or a heteroaromatic group containing 5 to 30 ring atoms, $R^1$ and $R^2$ may be directly connected to each other to form a ring. In another embodiment, at each occurrence, $R^1$ and $R^2$ are independently selected from the group consisting of a linear alkane containing 1 to 30 carbon atoms, a branched or cyclic alkane containing 3 to 30 carbon atoms, or an alkane ether containing 1 to 30 carbon atoms.

In an embodiment, v is selected from any integer from 1 to 4. In an embodiment, v is selected from 1 or 2.

In an embodiment, at each occurrence, v is 1. In another embodiment, $R^1$ and $R^2$ are directly connected to each other to form a ring. In another embodiment, the Chemical Formula (1) is selected from the following general formulas:

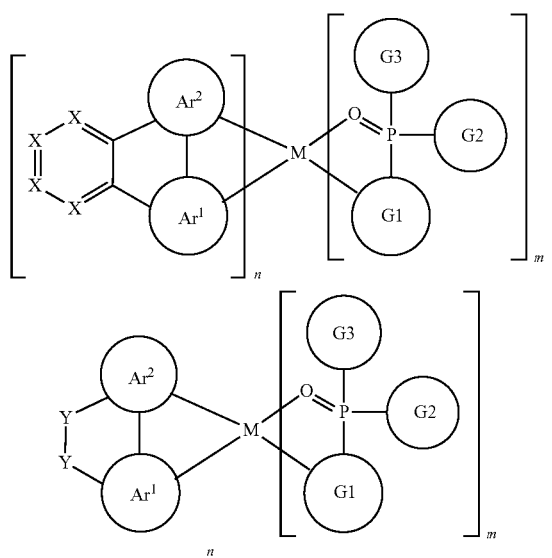

wherein,

X is selected from CR$^3$, N or C;

Y is selected from CR$^4$R$^5$, NR$^5$, O, S, PR$^5$, BR$^5$ or SiR$^4$R$^5$, at each occurrence, R$^3$ to R$^5$ are independently selected from the group consisting of hydrogen, deuterium, a linear alkyl containing 1 to 20 carbon atoms, a linear alkoxy group containing 1 to 20 carbon atoms, or a linear thioalkoxy group containing 1 to 20 carbon atoms, a branched or cyclic alkyl containing 3 to 20 carbon atoms, a branched or cyclic alkoxy group containing 3 to 20 carbon atoms, or a branched or cyclic thioalkoxy group containing 3 to 20 carbon atoms, or a branched or cyclic silyl group containing 3 to 20 carbon atoms, or a substituted keto group containing 1 to 20 carbon atoms, alkoxycarbonyl group containing 2 to 20 carbon atoms, aryloxycarbonyl group containing 7 to 20 carbon atoms, cyano group (—CN), carbamoyl group (—C(=O)NH$_2$), haloformyl group, formyl group (—C(=O)—H), isocyano group, isocyanate group, thiocyanate group, or isothiocyanate group, hydroxyl group, nitro group, CF$_3$ group, Cl, Br, F, a cross-linkable group, a substituted or unsubstituted aromatic or heteroaromatic ring system containing 5 to 40 ring atoms, an aryloxy or heteroaryloxy group containing 5 to 40 ring atoms, and combination of these systems, wherein one or more of the groups R$^3$ to R$^5$ may form a monocyclic or polycyclic aliphatic or aromatic ring with each other and/or with a ring bonded thereto.

In an embodiment, at each occurrence, Ar$^1$, Ar$^2$, and G1 are each independently selected from the following groups:

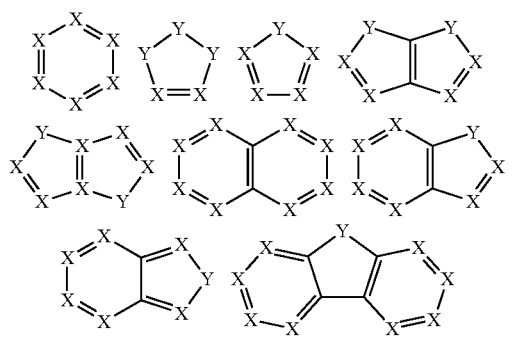

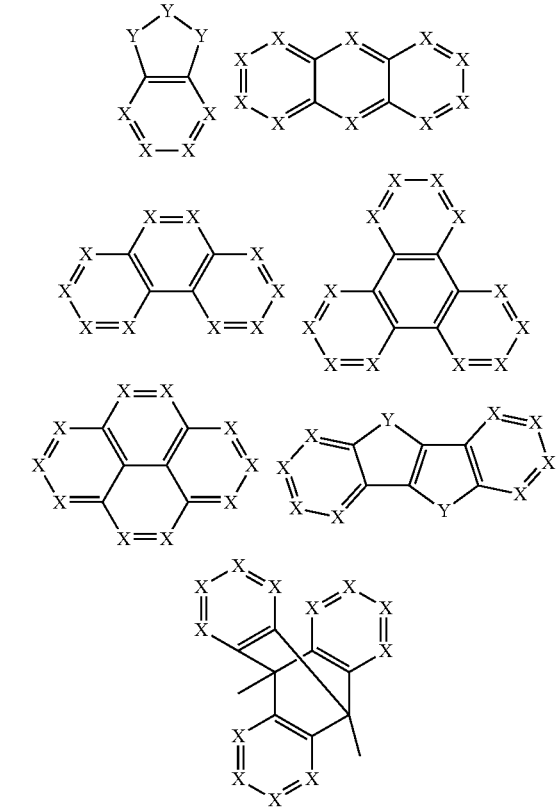

wherein X and Y are defined as above.

In another embodiment, at each occurrence, Ar$^1$, Ar$^2$, and G1 are each independently selected from the following groups:

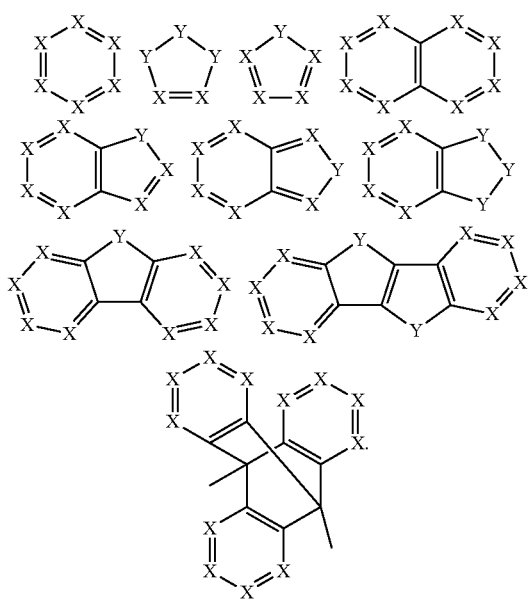

In another embodiment, at each occurrence, Ar$^1$, Ar$^2$, and G1 are each independently selected from the following groups:

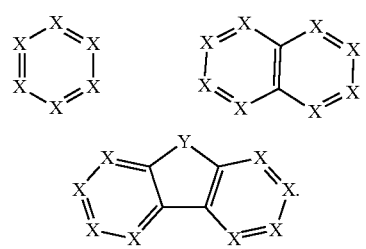
In a particular embodiment, at each occurrence, $Ar^1$, $Ar^2$, and G1 are each independently selected from the following groups, wherein H atom on the ring may be further replaced:
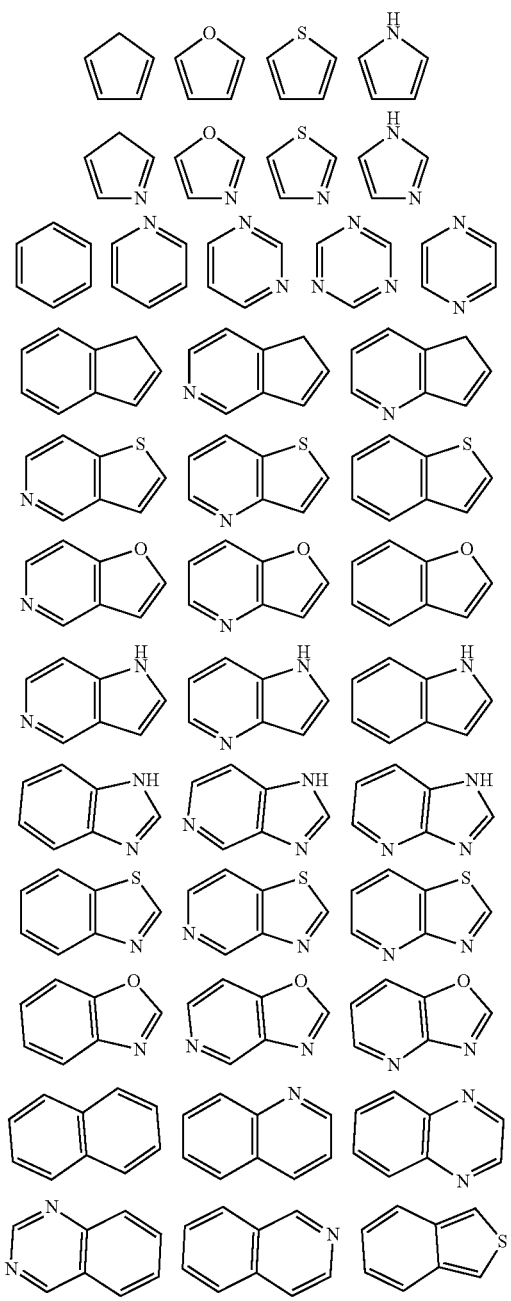
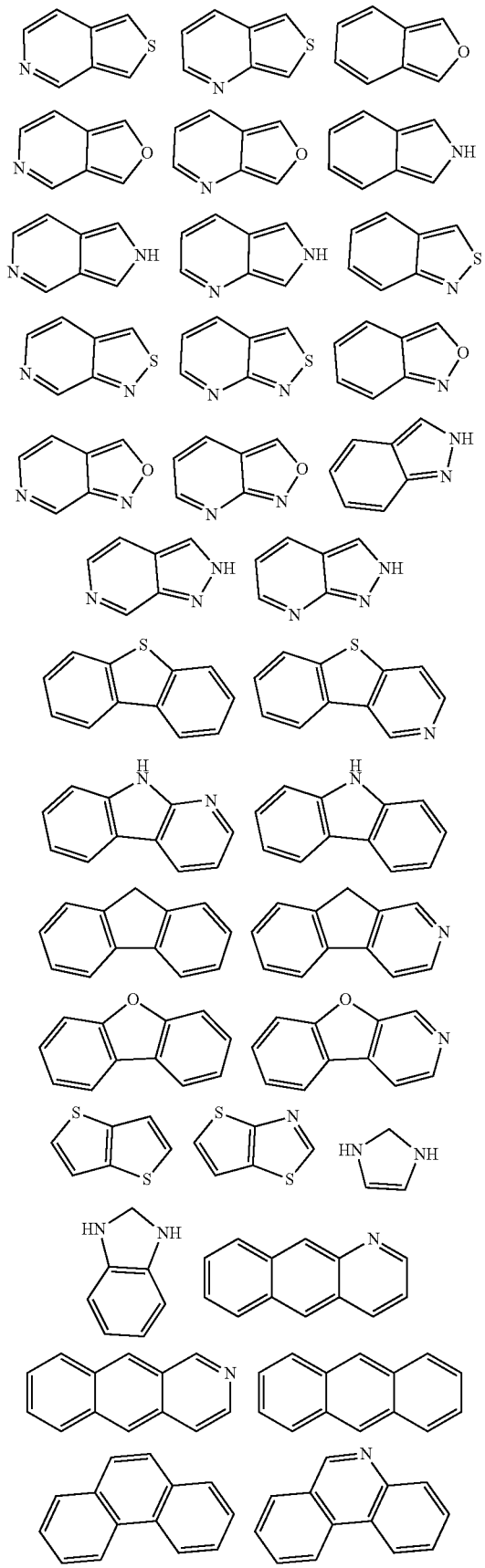

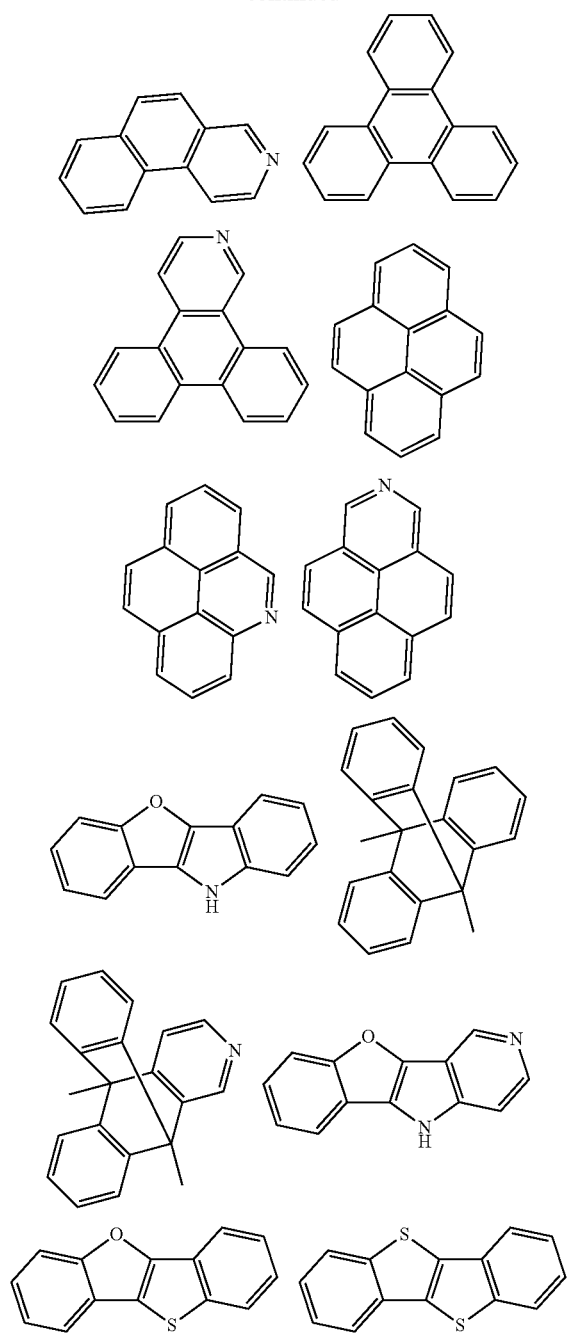
In an embodiment, Ar¹ and Ar² are independently selected from the following groups:
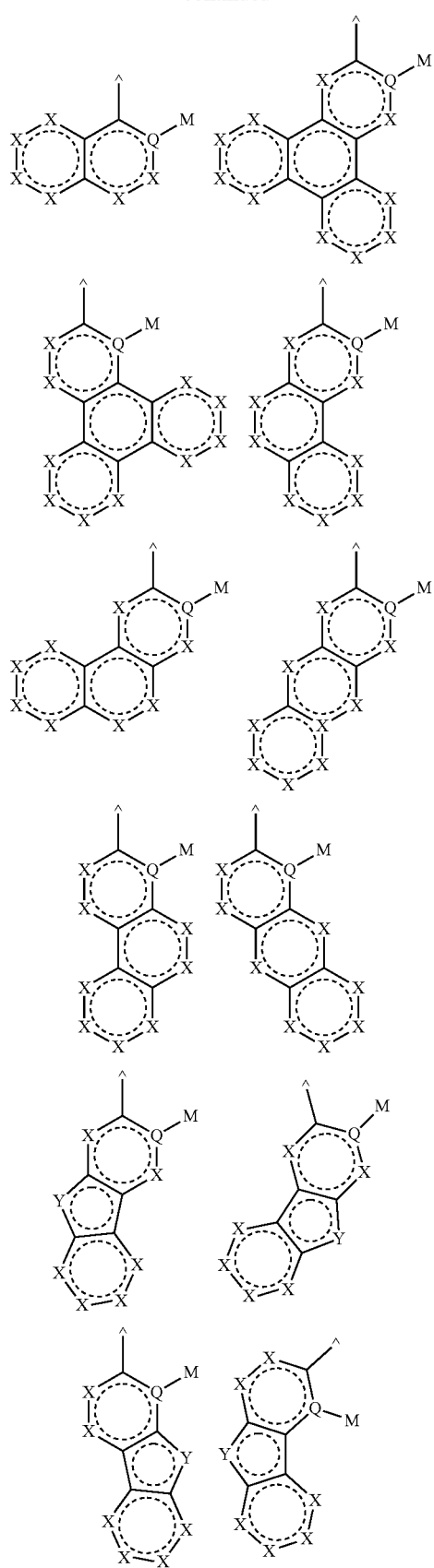

-continued

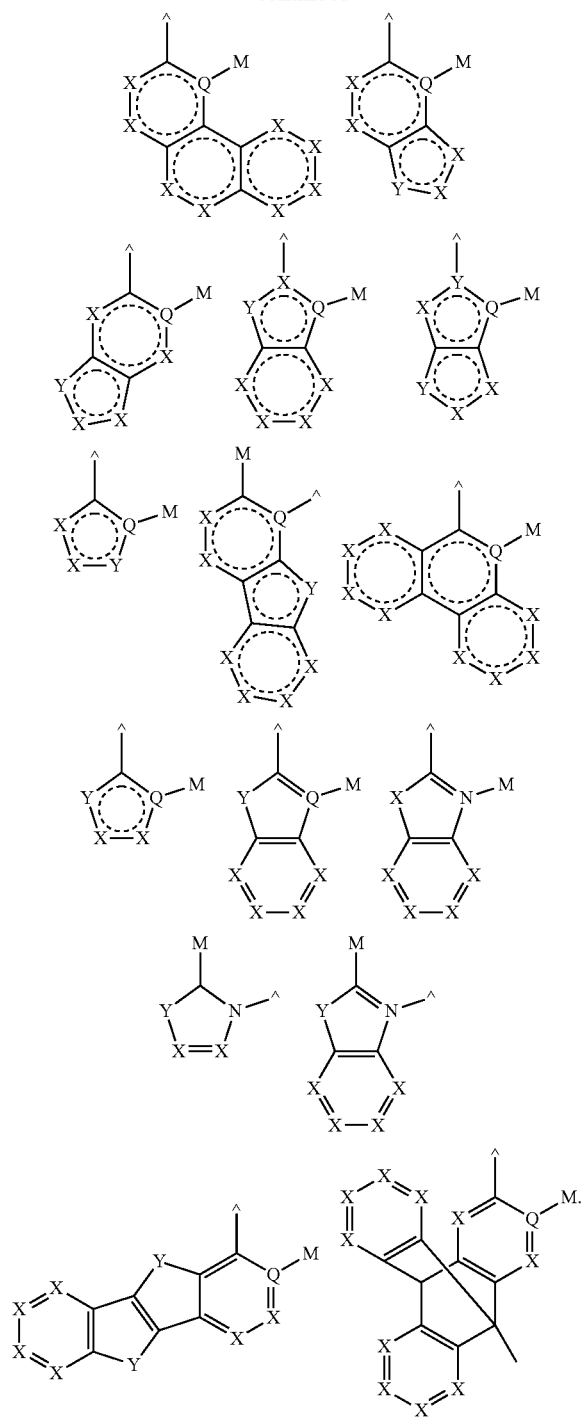
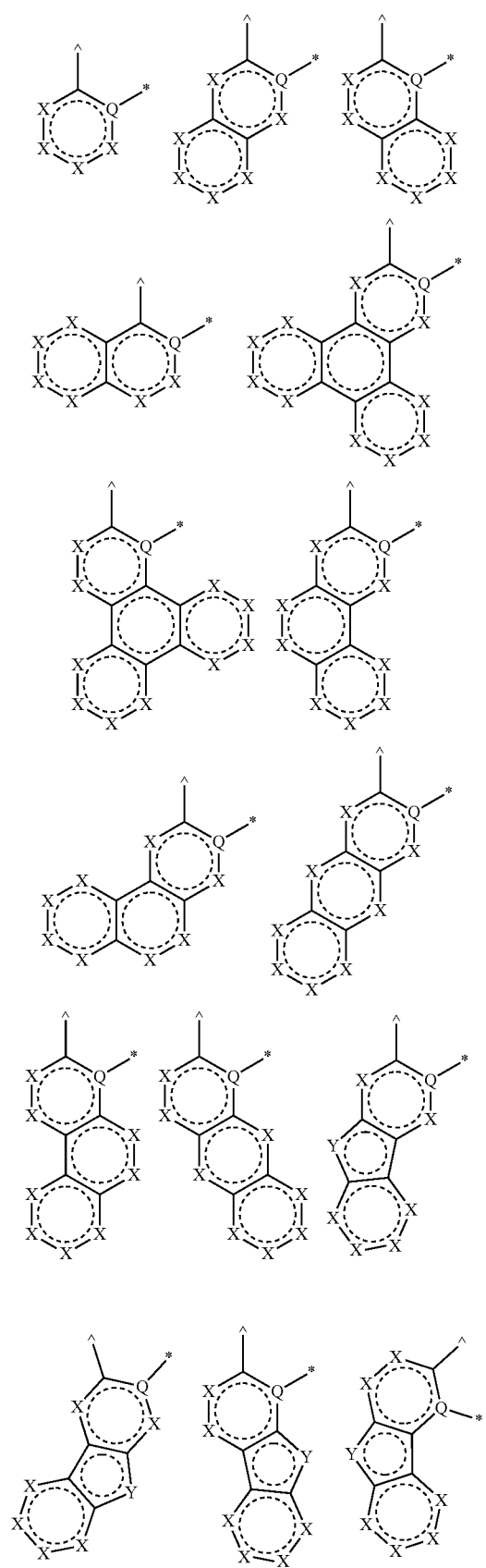

wherein X and Y are defined as above; Q is selected from C or N; ^ represents a connection site between Ar¹ and Ar²; M represents a connection site between Ar¹ or Ar² and metal M.

In a further embodiment, in the aforementioned groups from which Ar¹ and Ar² are selected, X is selected from $CR^3$.

In an embodiment, Ar¹ and Ar² are independently selected from the following groups:

-continued

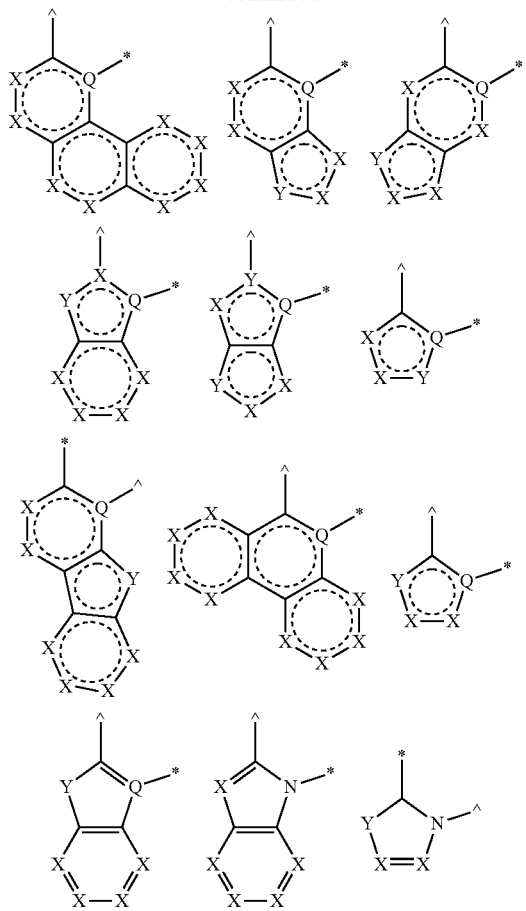

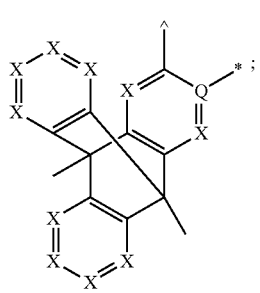

wherein X and Y are defined as above; Q is selected from C or N; ^represents a connection site between Ar¹ and Ar²; * represents a connection site between Ar¹ or Ar² and M in Chemical Formula (1).

In an embodiment,

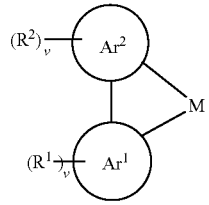

is a monovalent anionic ligand. In another embodiment, in (A-1) to (A-16), (A-19), (A-20), (A-22) to (A-24), one of Q is C, and the other Q is N.

In an embodiment, in (A-1) to (A-24), X is selected from $CR^3$.

In an embodiment,

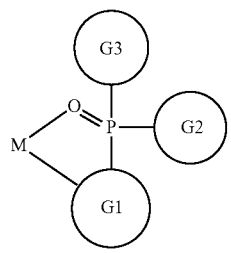

is a monovalent anionic ligand. In another embodiment,

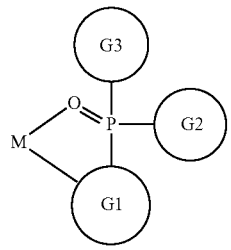

is selected from the following groups:

(B-1)

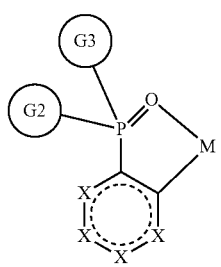

-continued
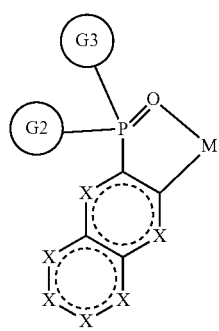
(B-2)
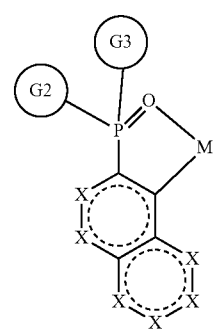
(B-3)
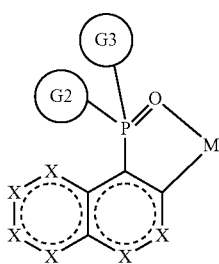
(B-4)
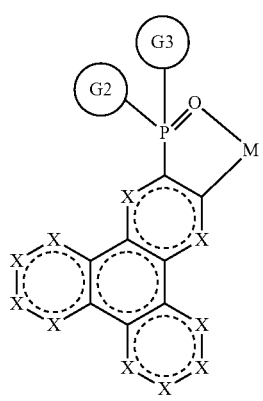
(B-5)
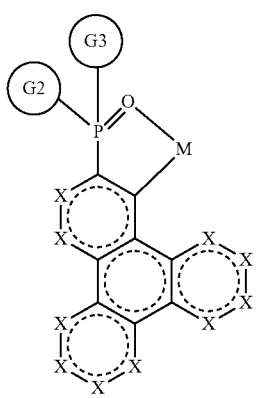
(B-6)
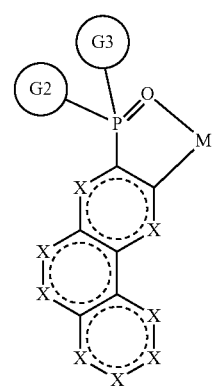
(B-7)
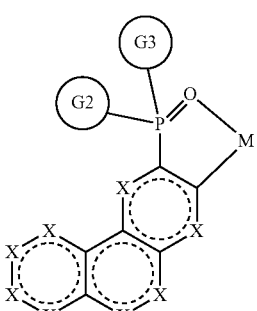
(B-8)
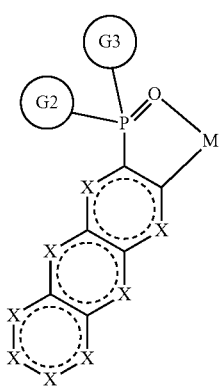
(B-9)

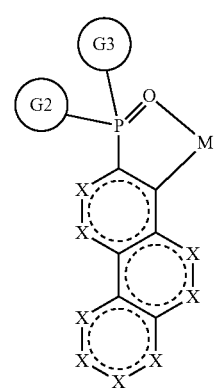
(B-10)
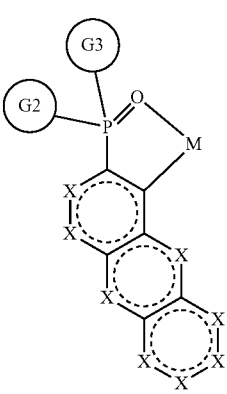
(B-11)
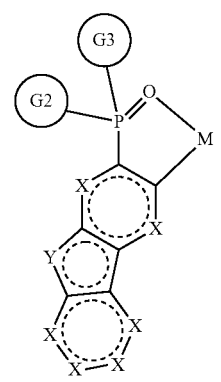
(B-12)
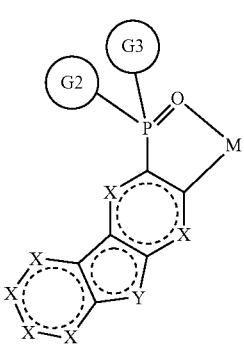
(B-13)
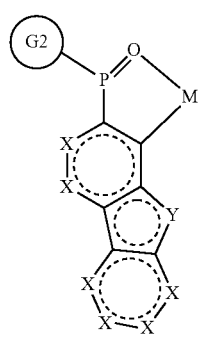
(B-14)
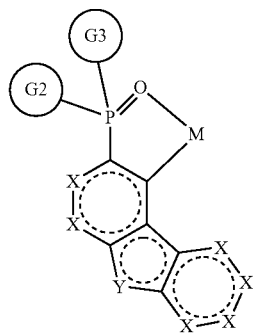
(B-15)
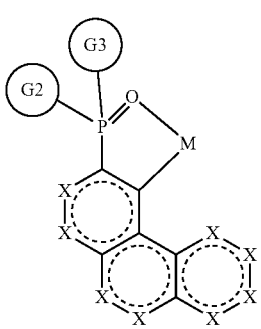
(B-16)
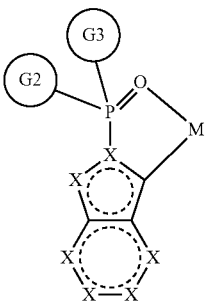
(B-17)
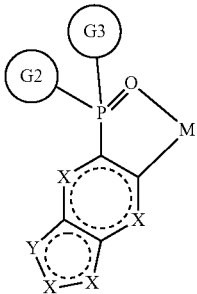
(B-18)

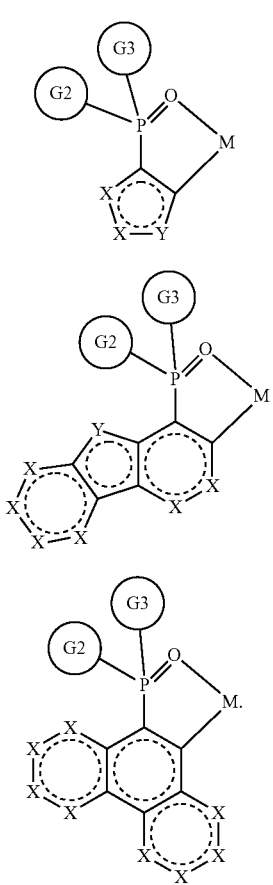

(B-19)

(B-20)

(B-21)

wherein X and Y are defined as above.

In an embodiment, is (B-1) or (B-2).

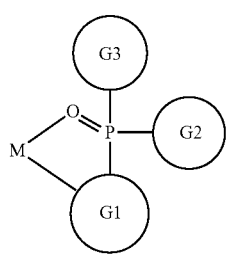

In an embodiment, at each occurrence, G2 and G3 are independently selected from the group consisting of a linear alkane containing 1 to 30 carbon atoms, a branched or cyclic alkane containing 3 to 30 carbon atoms, an aromatic group containing 6 to 30 carbon atoms, a heteroaromatic group containing 5 to 30 ring atoms or a non-aromatic ring system containing 3 to 30 ring atoms;

In another embodiment, at each occurrence, G2 and G3 are independently selected from the following groups:

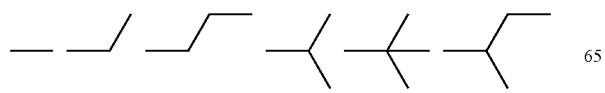

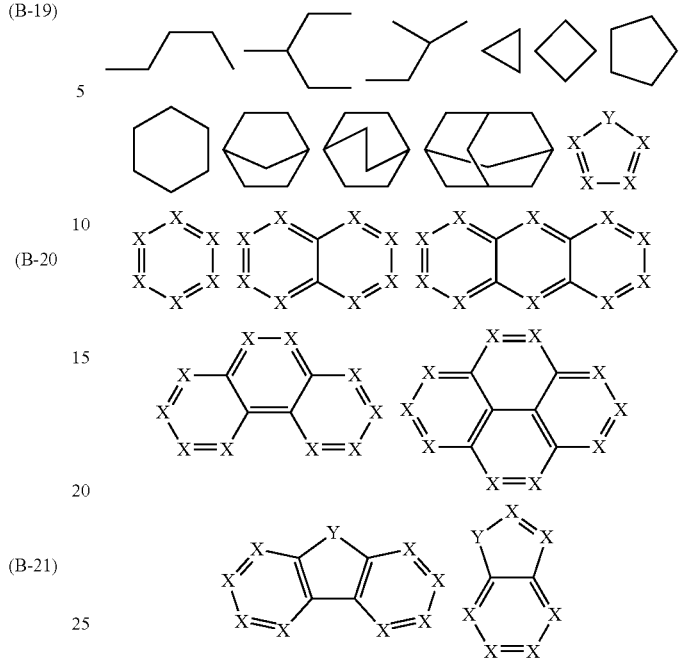

wherein X and Y are defined as above.

In an embodiment, in the groups from which G2 and G3 are selected, X is selected from $CR^3$.

In an embodiment, G2 and G3 are selected from the group consisting of

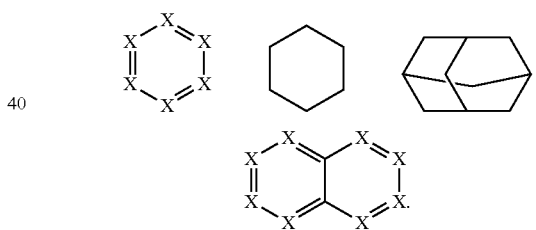

In an embodiment, at each occurrence, G2 and G3 are selected from same group. In another embodiment, at each occurrence, G2 and G3 are simultaneously selected from the group consisting of:

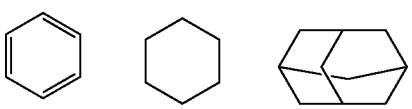

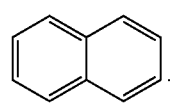

In an embodiment,
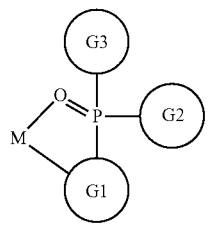
is any one selected from (C-1) to (C-24):
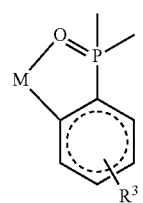
(C-1)
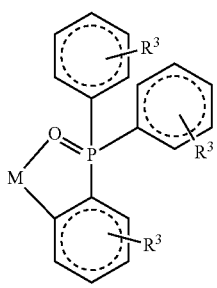
(C-2)
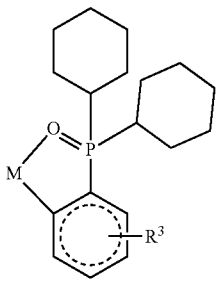
(C-3)
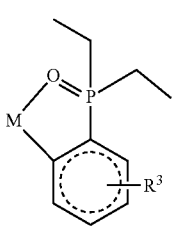
(C-4)
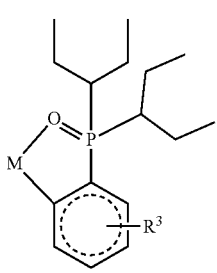
(C-5)
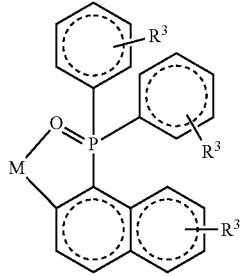
(C-6)
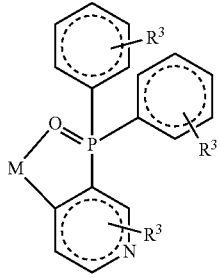
(C-7)
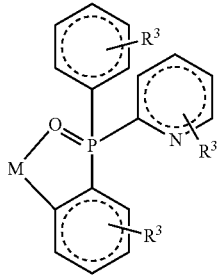
(C-8)
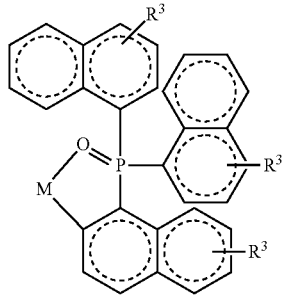
(C-9)
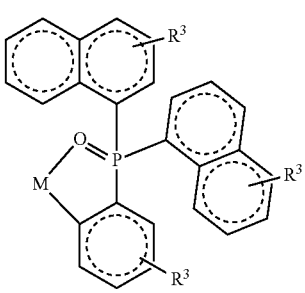
(C-10)

-continued
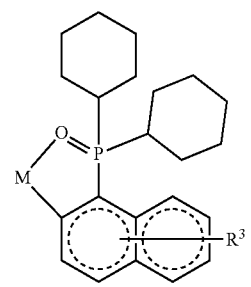
(C-11)
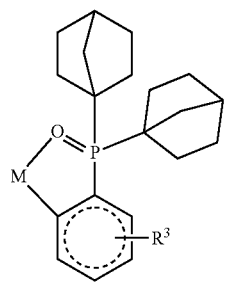
(C-12)
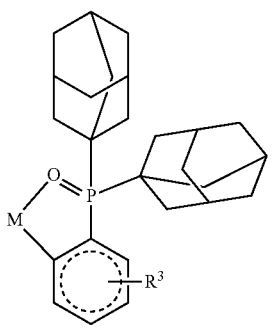
(C-13)
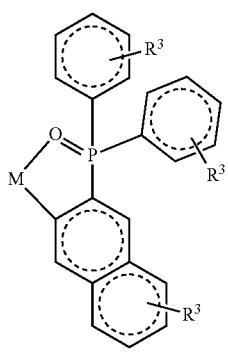
(C-14)
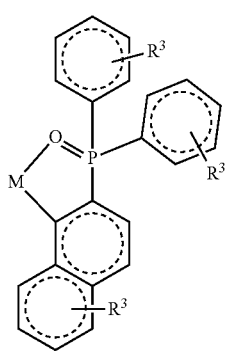
(C-15)
-continued
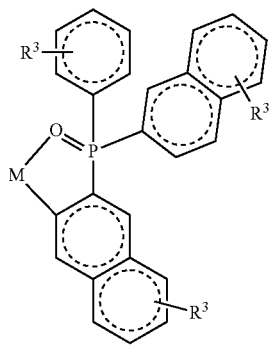
(C-16)
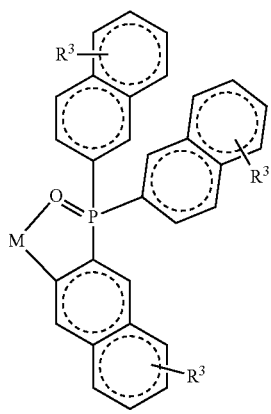
(C-17)
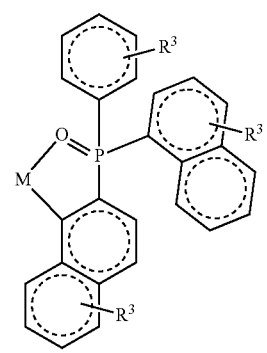
(C-18)
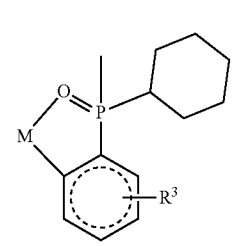
(C-19)
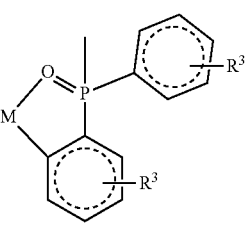
(C-20)

(C-21)
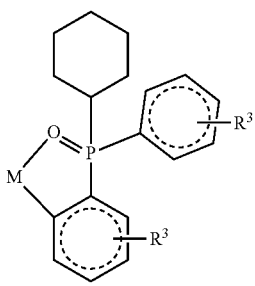
(C-22)
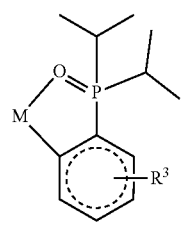
(C-23)
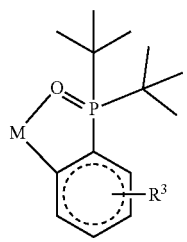
(C-24)
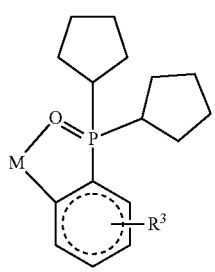
In an embodiment, the Chemical Formula (1) is any one selected from Chemical Formulas (2-1) to (2-5):
(2-1)
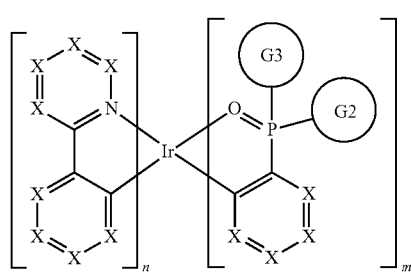
(2-2)
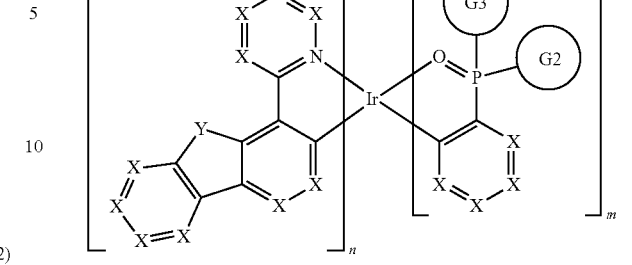
(2-3)
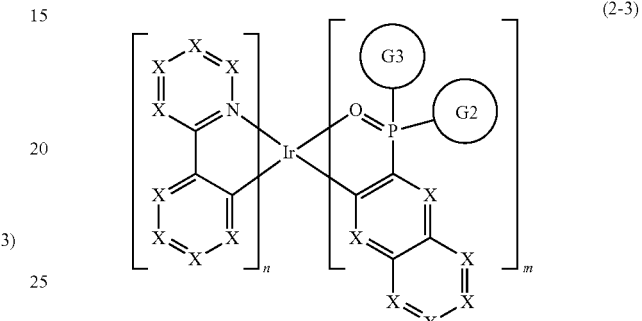
(2-4)
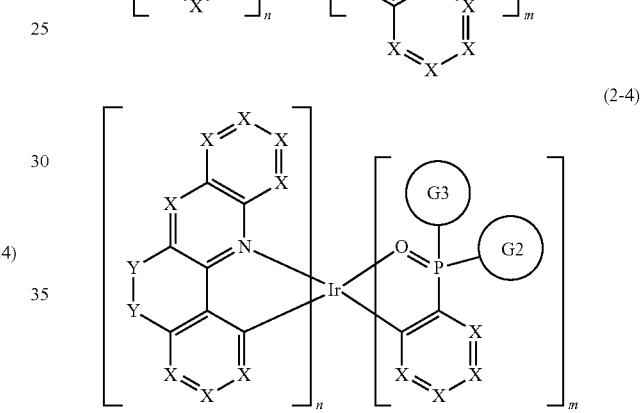
(2-5)
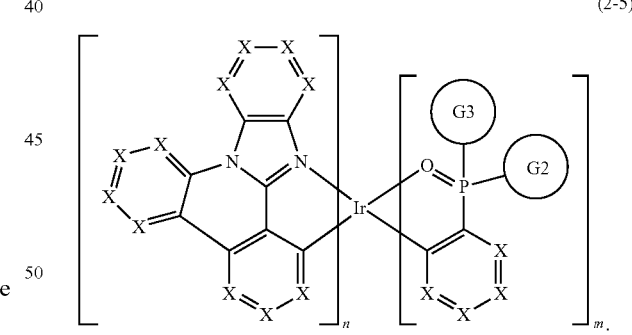
In another embodiment, in the Chemical Formulas (2-1) to (2-5), X is selected from $CR^3$. In a further embodiment, G2 and G3 are simultaneously selected from the group consisting of
In an embodiment, M is selected from the group consisting of iridium, gold, platinum, zinc or palladium; in an embodiment, M is iridium. In terms of heavy atomic effects, Ir is used as the central metal M of the above transition metal complex. This is because iridium is chemically stable and has significant heavy atom effects resulting in high luminescence efficiency.

Specific examples of suitable transition metal complexes in which M is iridium according to the present disclosure are given below, but are not limited thereto:

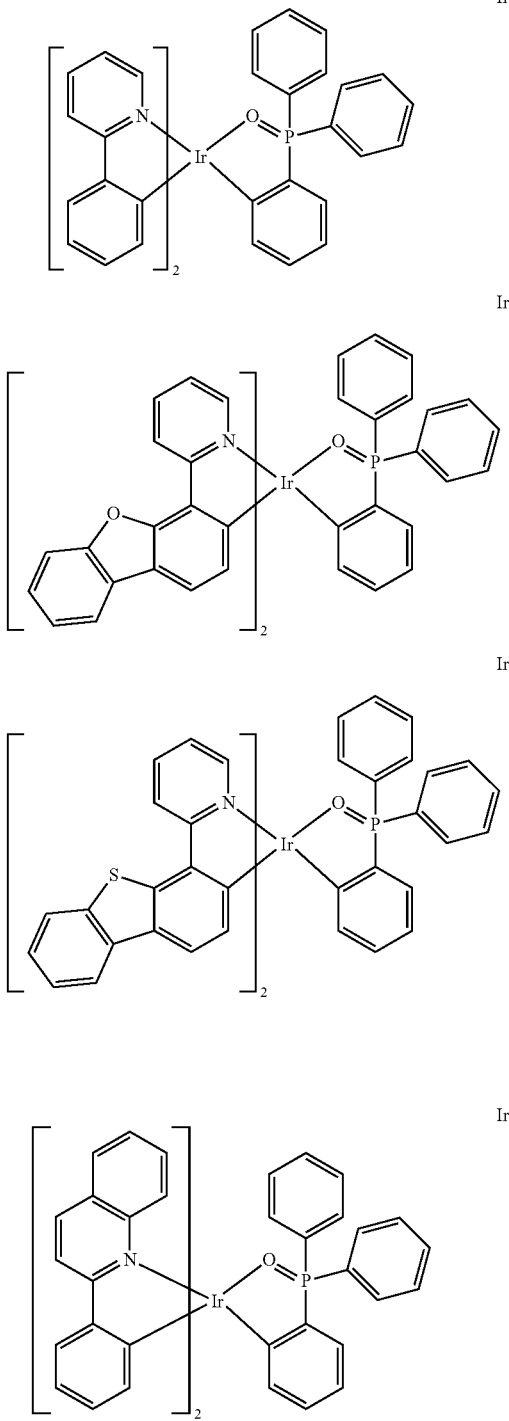

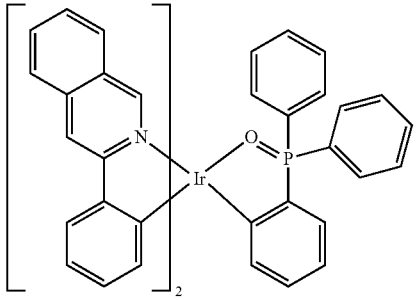

Ir-005

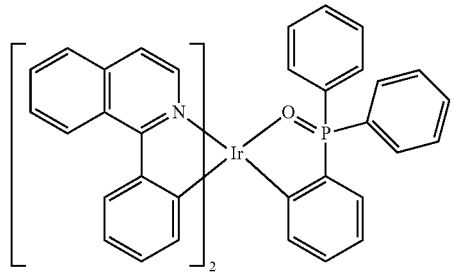

Ir-006

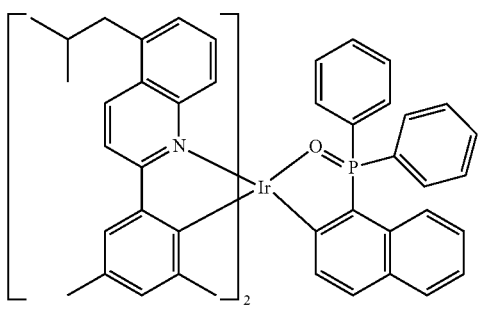

Ir-007

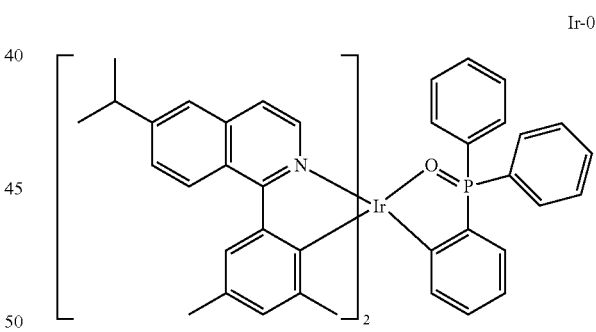

Ir-008

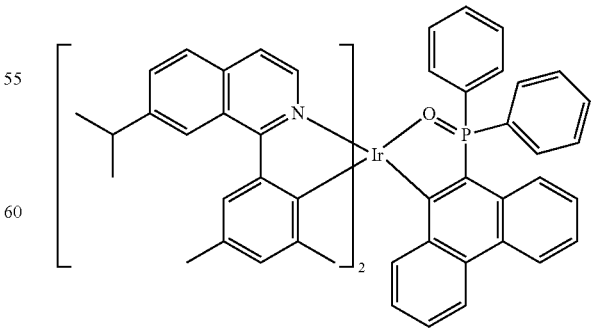

Ir-009

-continued
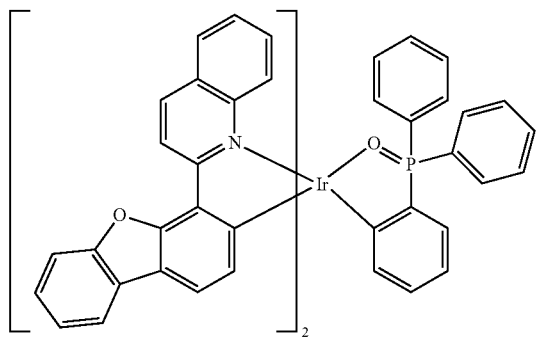
Ir-010
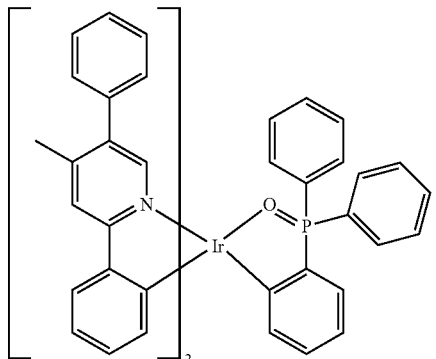
Ir-014
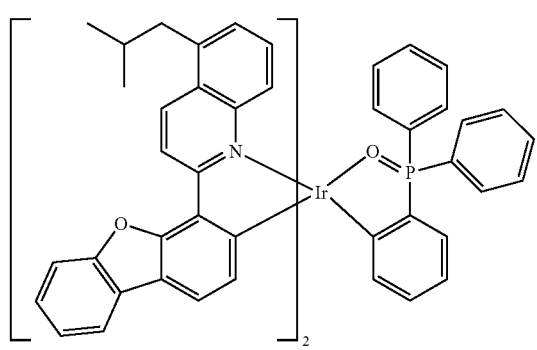
Ir-011
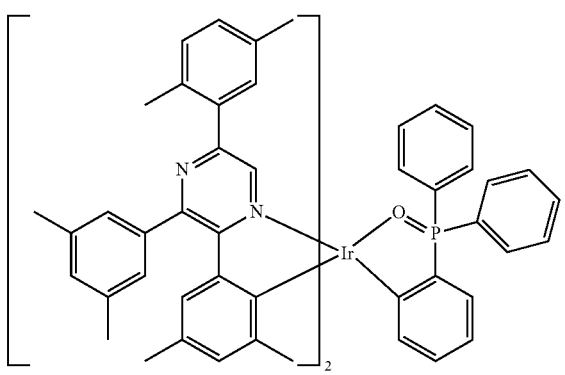
Ir-015
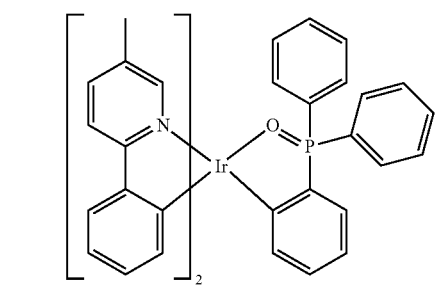
Ir-012
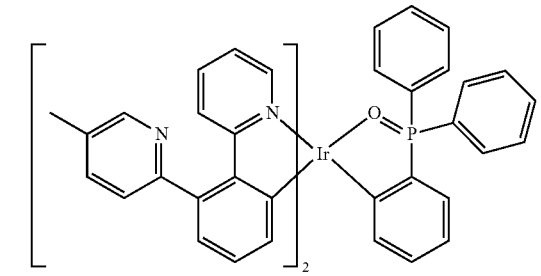
Ir-016
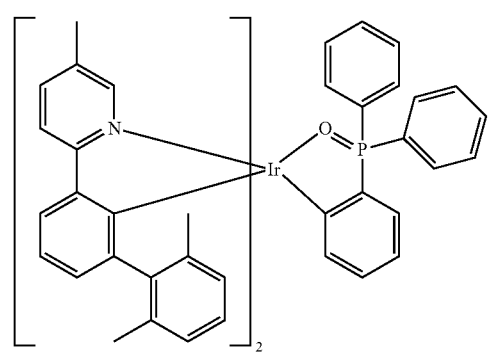
Ir-013
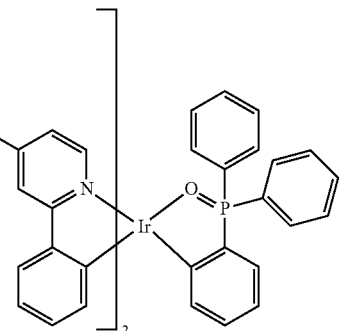
Ir-017

Ir-018
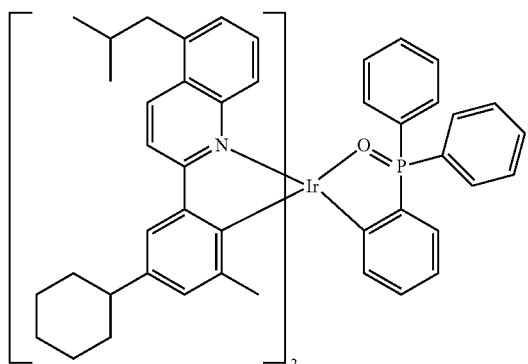
Ir-019
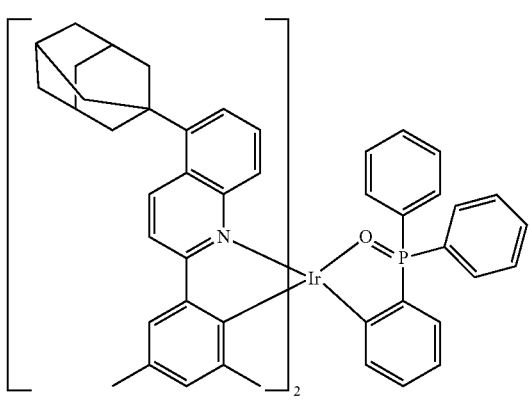
Ir-020
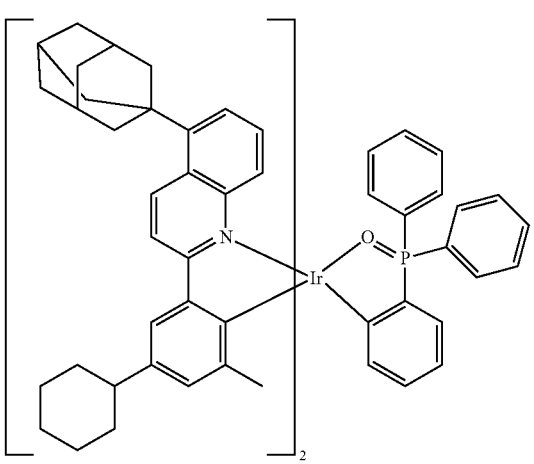
Ir-021
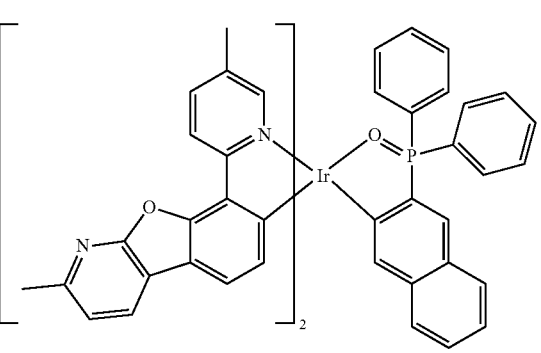
Ir-022
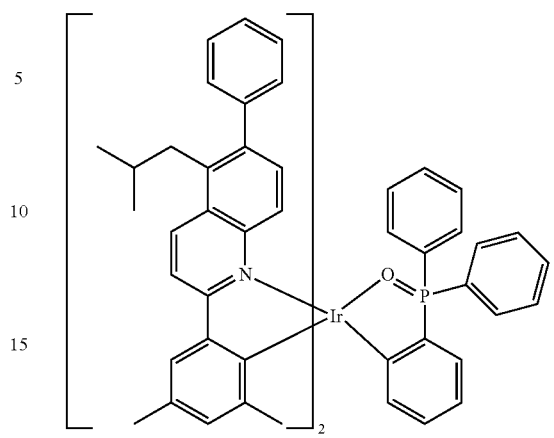
Ir-023
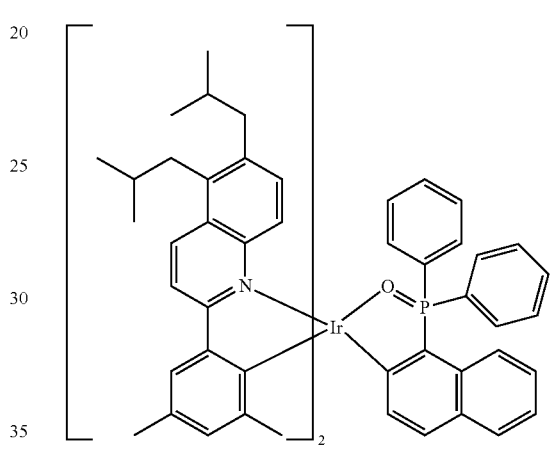
Ir-024
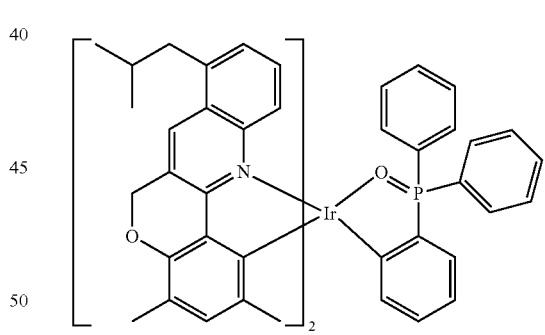
Ir-025
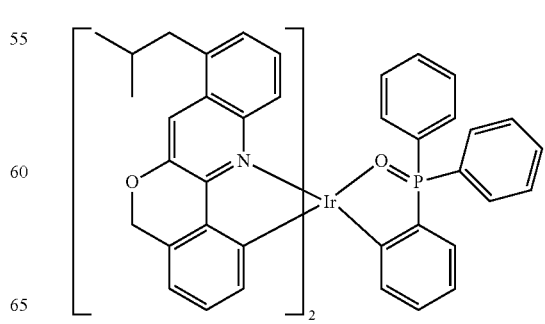

Ir-026
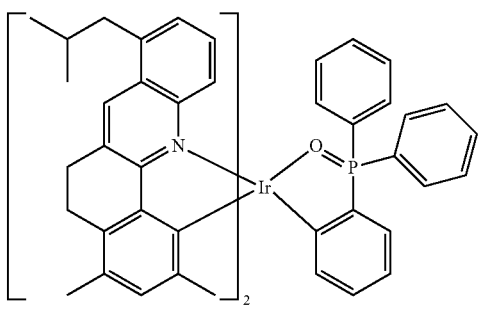
Ir-027
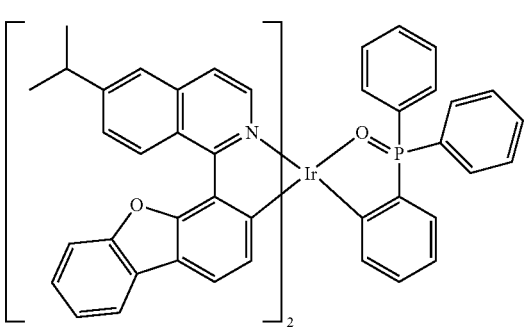
Ir-028
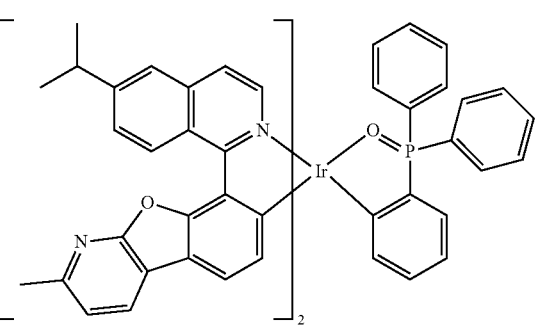
Ir-029
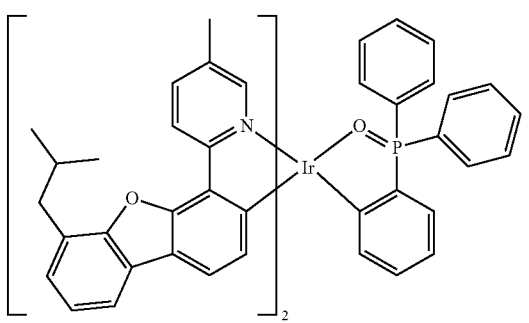
Ir-030
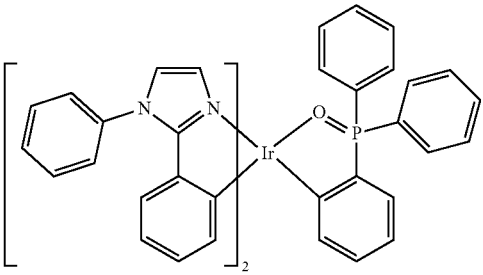
Ir-031
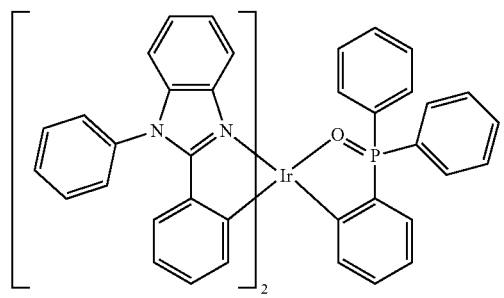
Ir-032
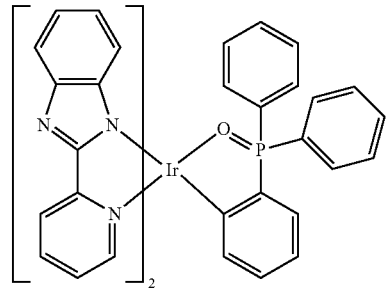
Ir-033
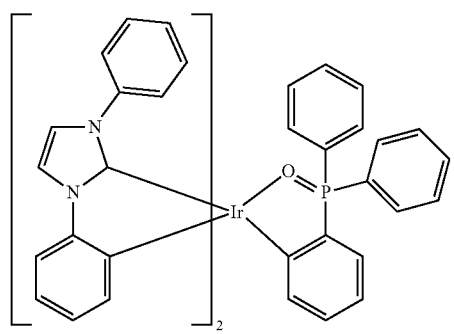
Ir-034
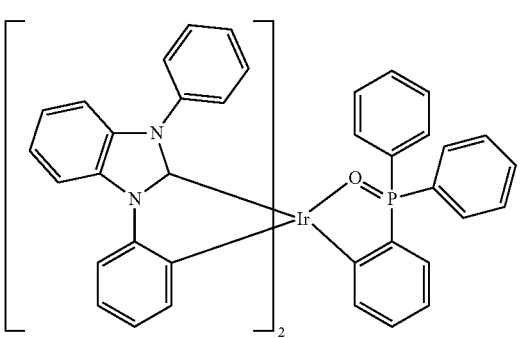
Ir-035
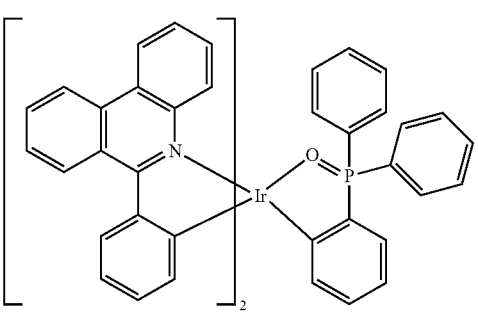

Ir-036
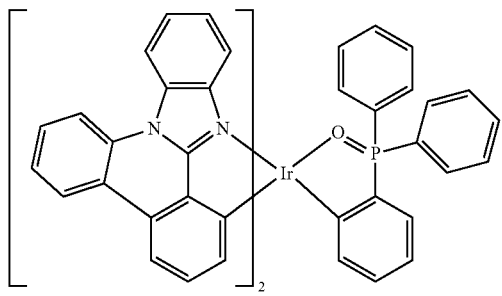
Ir-037
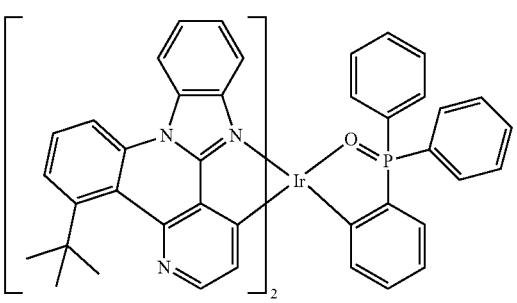
Ir-038
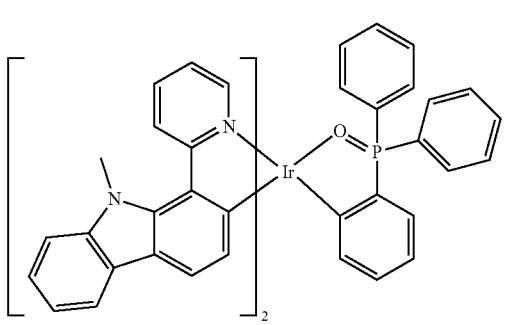
Ir-039
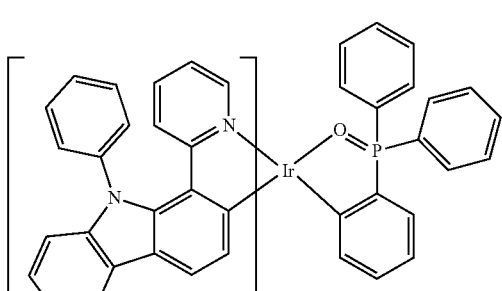
Ir-040
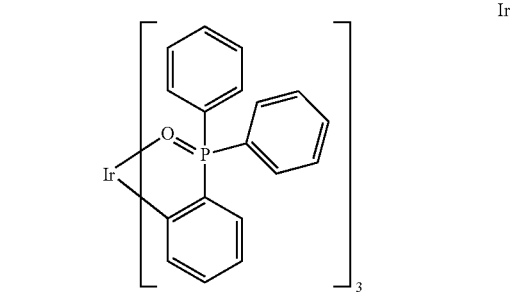
Ir-041
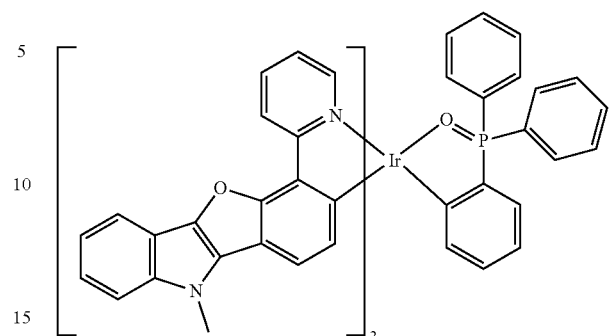
Ir-042
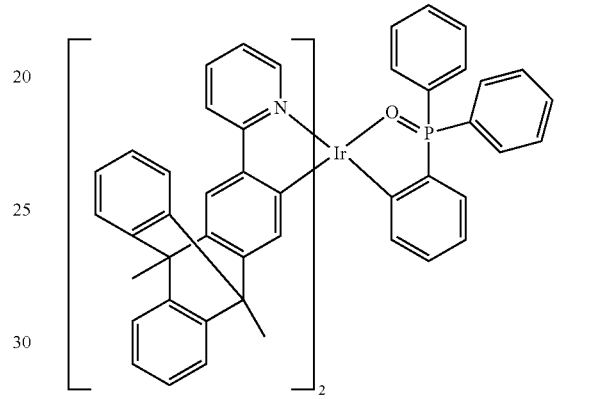
Ir-043
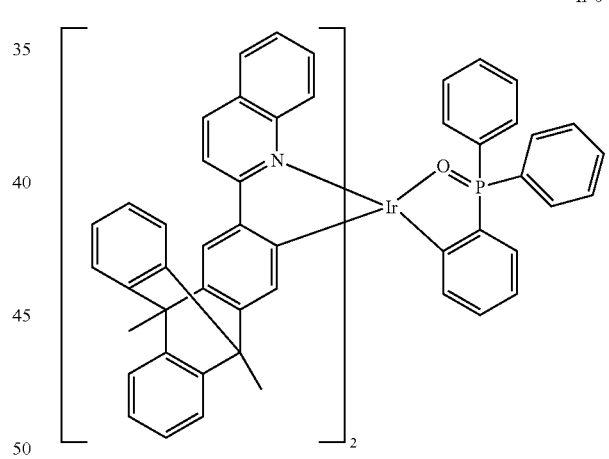
Ir-044
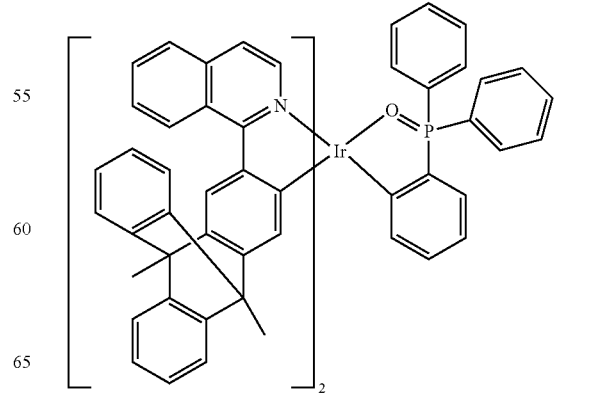

Ir-045
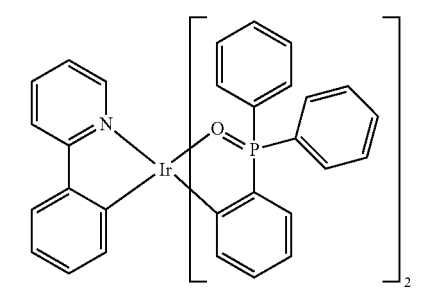
Ir-046
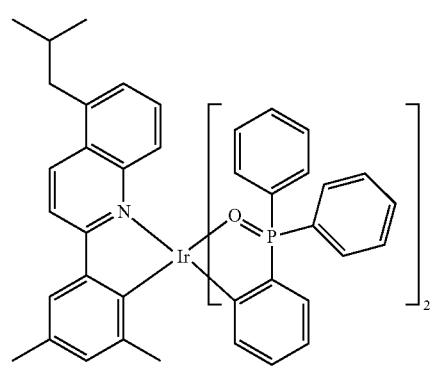
Ir-047
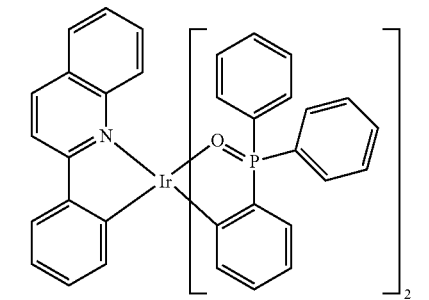
Ir-048
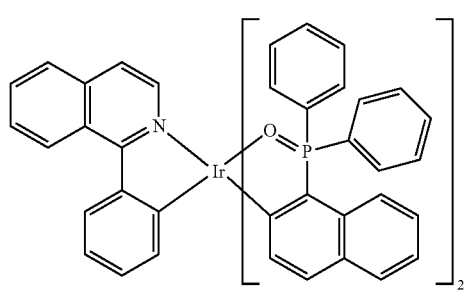
Ir-049
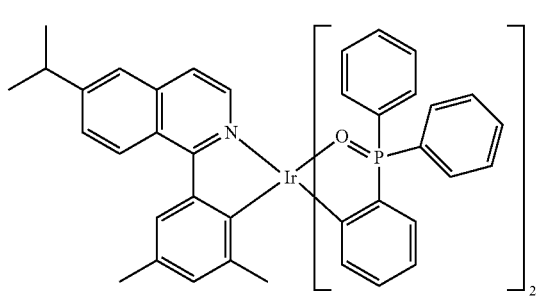
Ir-050
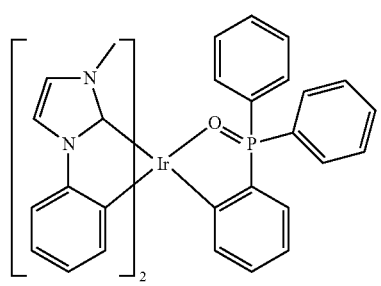
Ir-051
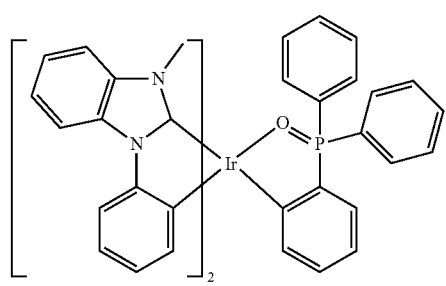
Ir-052
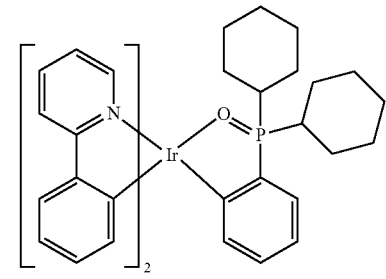
Ir-053
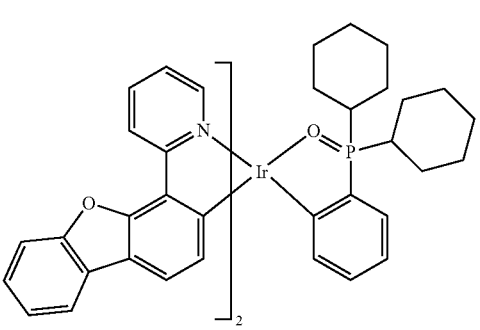
Ir-054
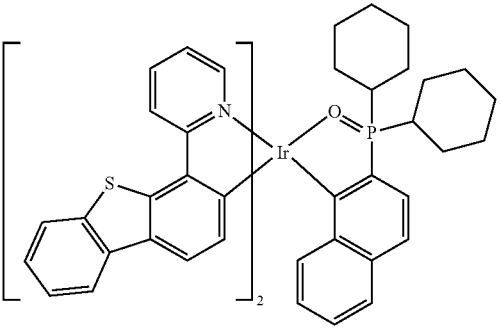

Ir-055
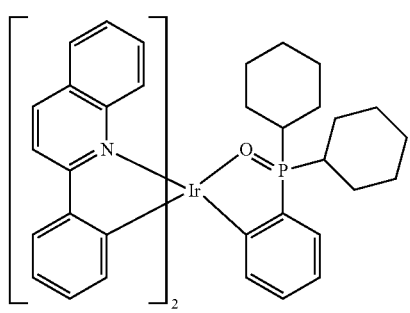
Ir-056
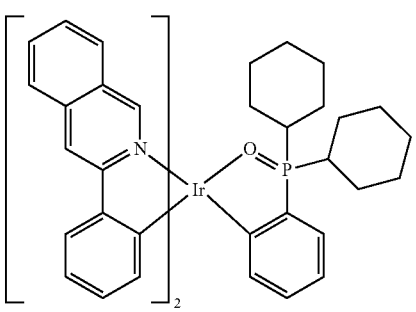
Ir-057
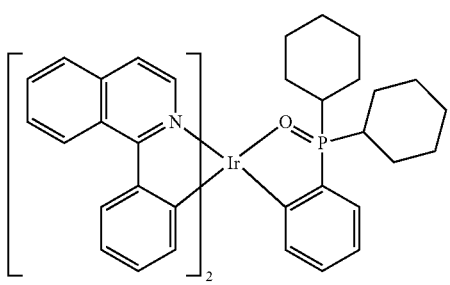
Ir-058
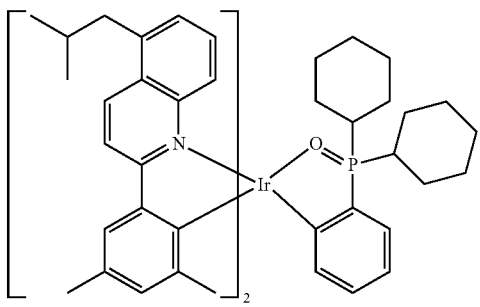
Ir-059
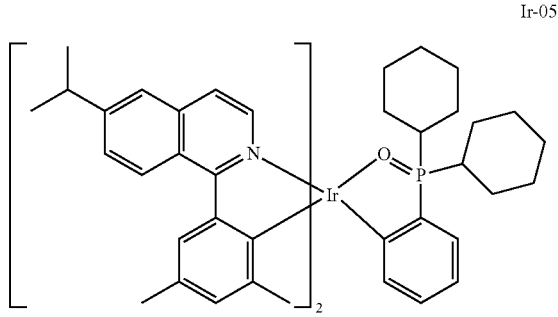
Ir-060
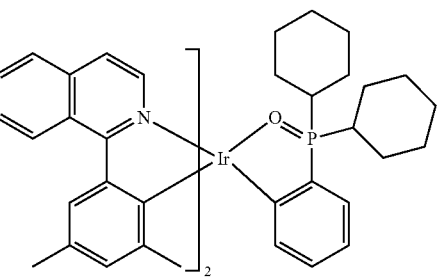
Ir-061
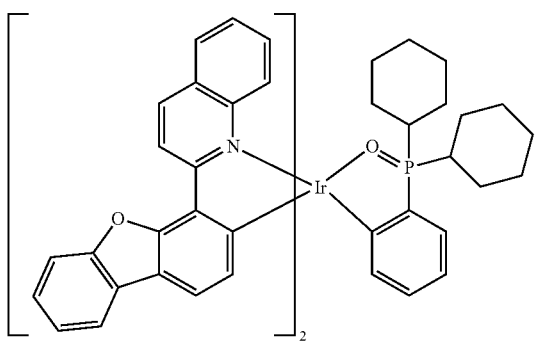
Ir-062
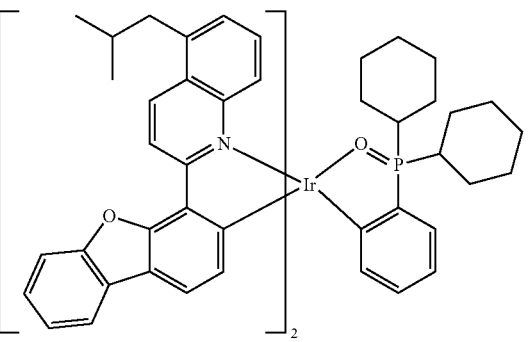
Ir-063
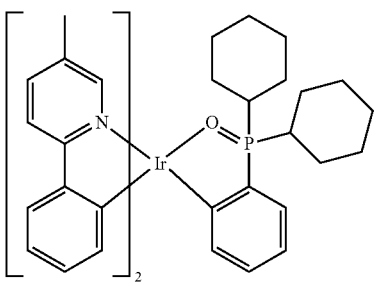

Ir-064
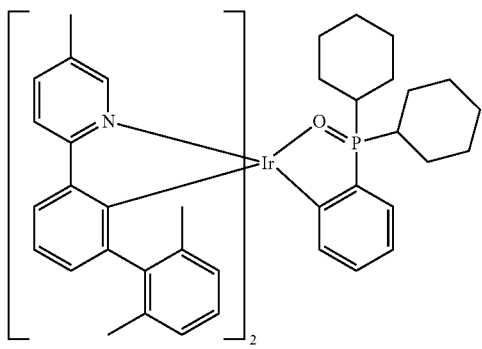
Ir-065
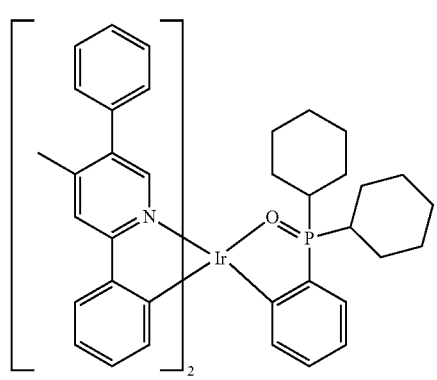
Ir-066
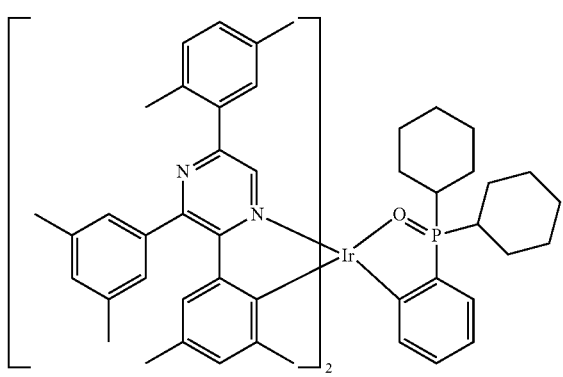
Ir-067
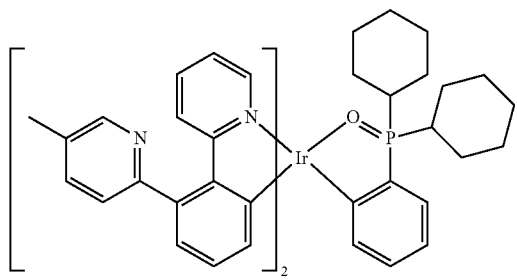
Ir-068
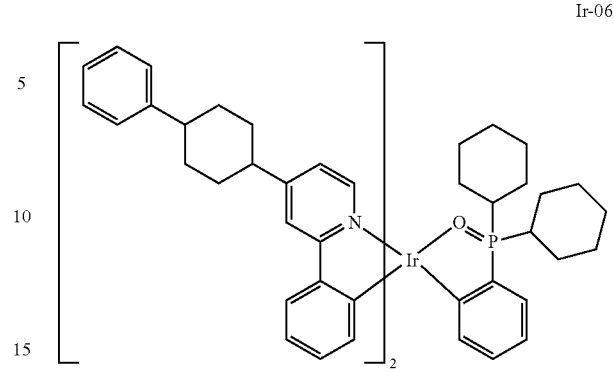
Ir-069
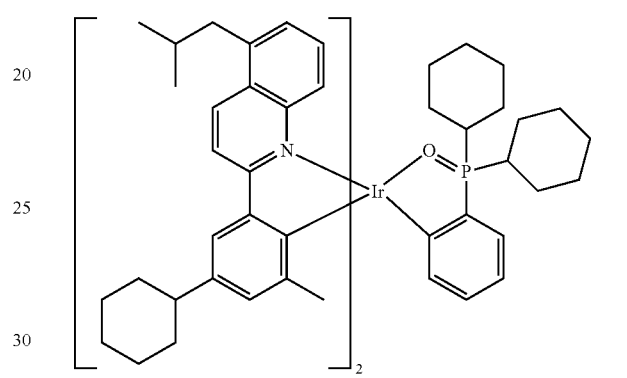
Ir-070
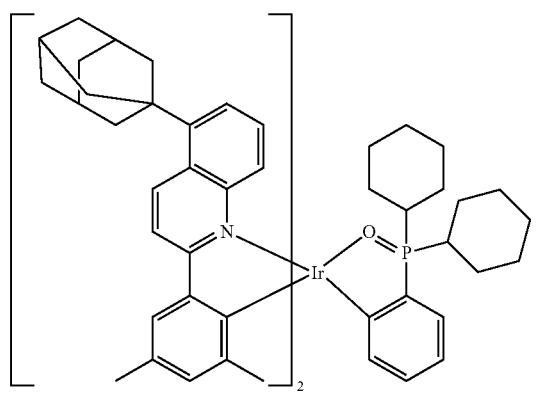
Ir-071
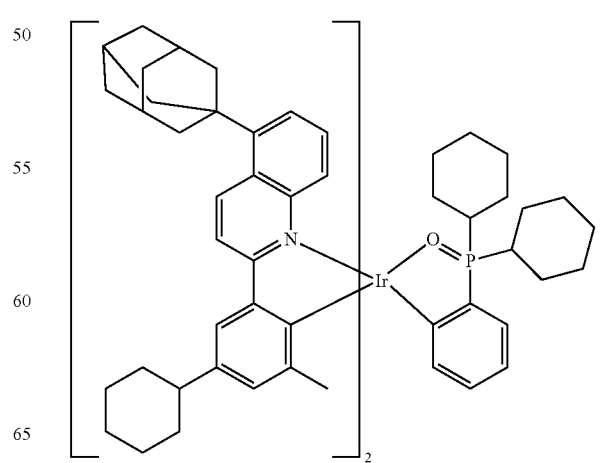

-continued
Ir-072
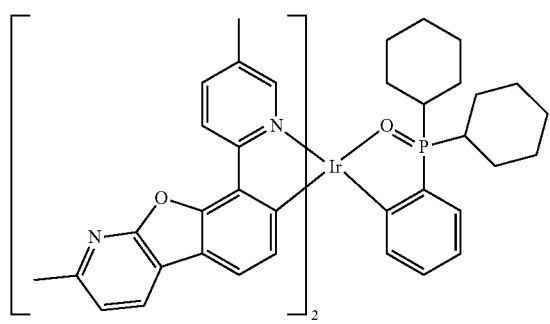
Ir-073
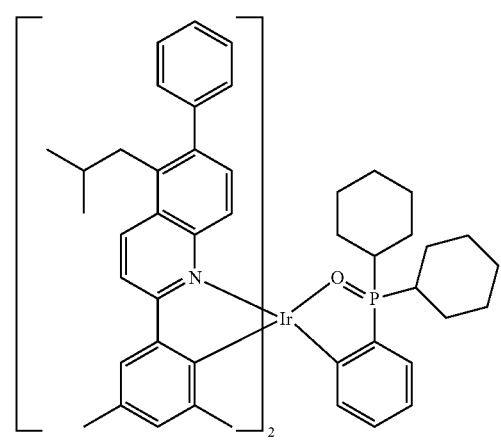
Ir-074
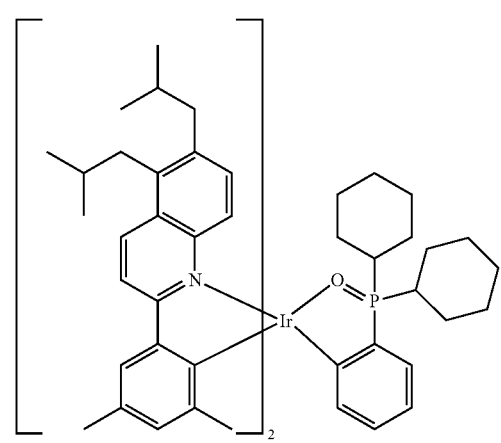
Ir-075
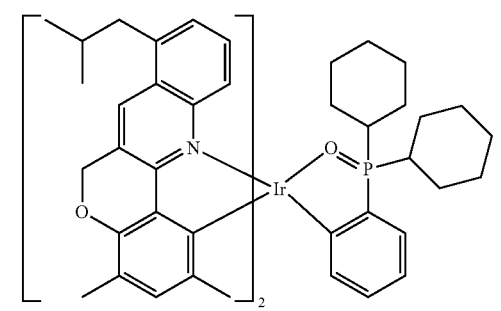
-continued
Ir-076
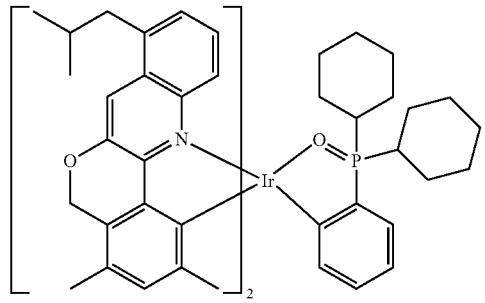
Ir-077
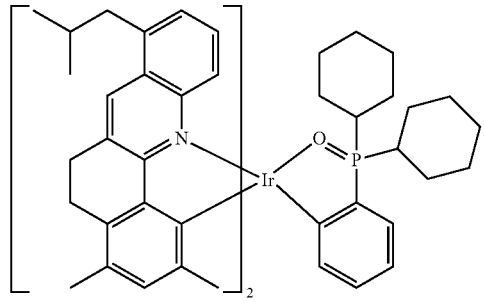
Ir-078
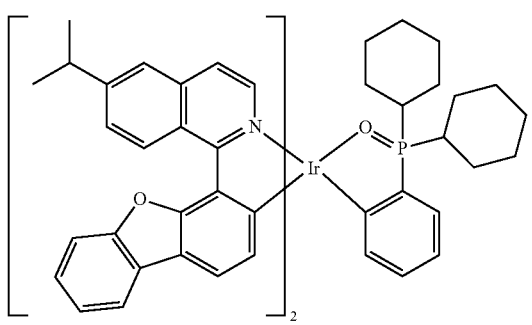
Ir-079
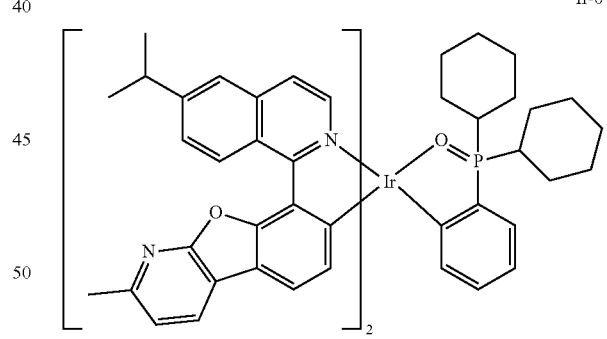
Ir-080
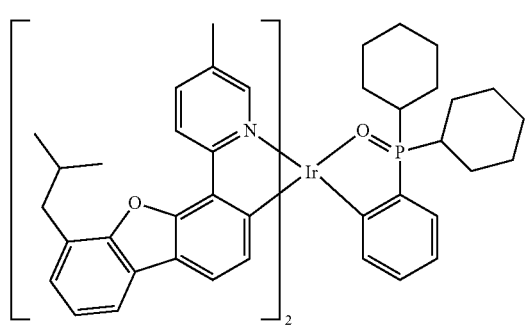

Ir-081
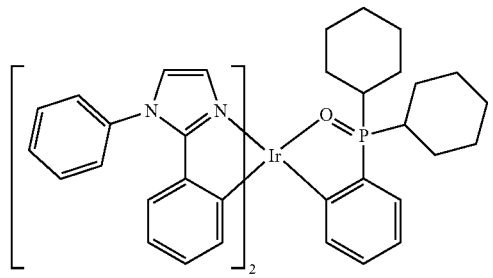
Ir-082
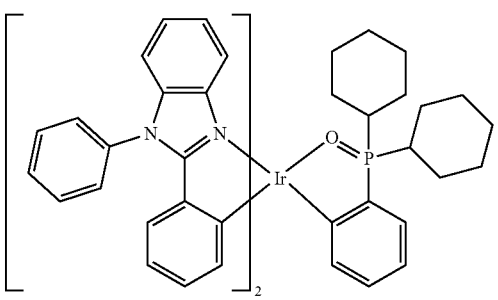
Ir-083
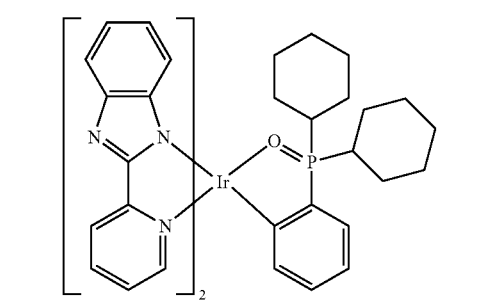
Ir-084
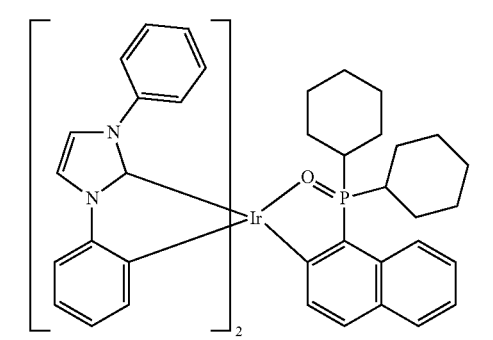
Ir-085
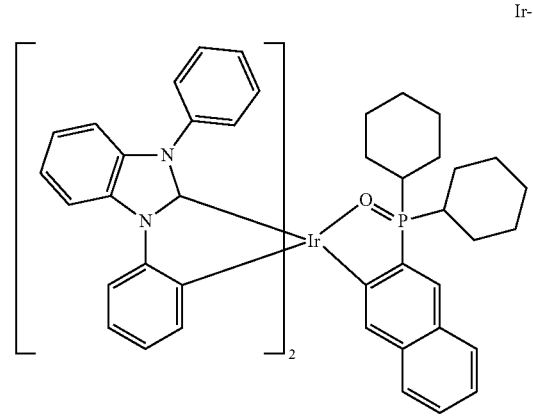
Ir-086
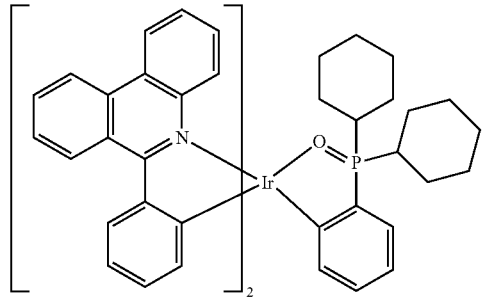
Ir-087
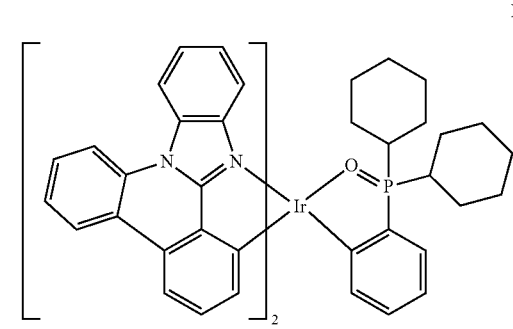
Ir-088
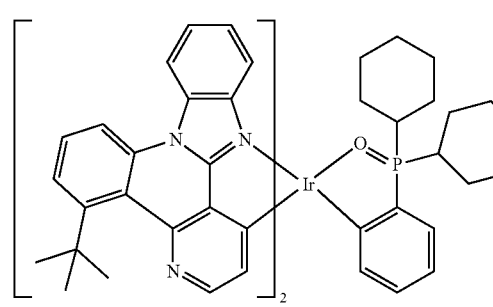
Ir-089
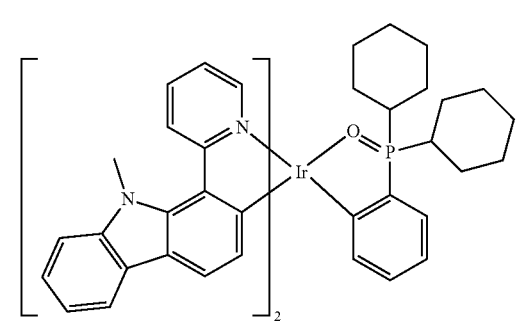
Ir-090
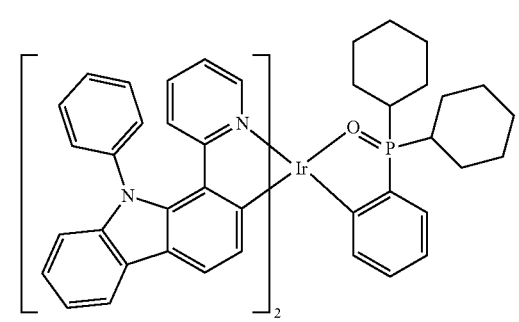

Ir-091
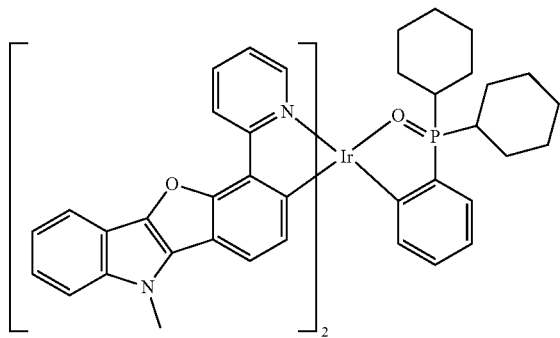
Ir-092
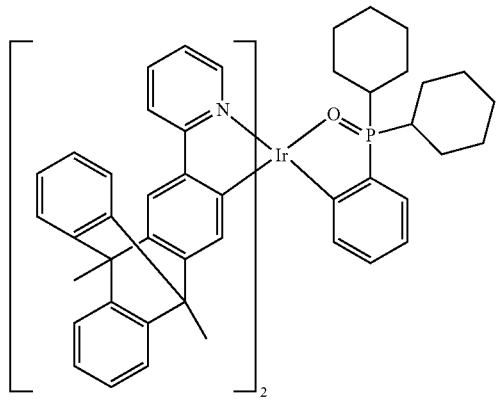
Ir-093
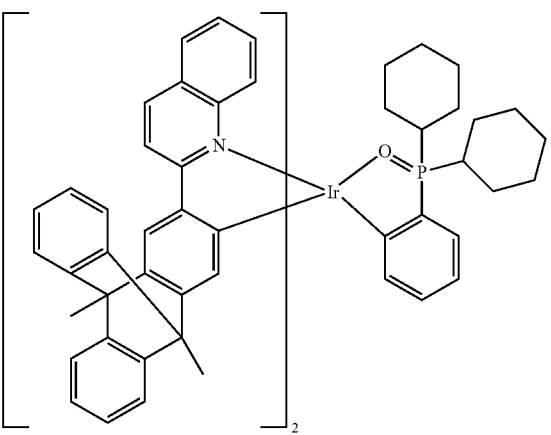
Ir-094
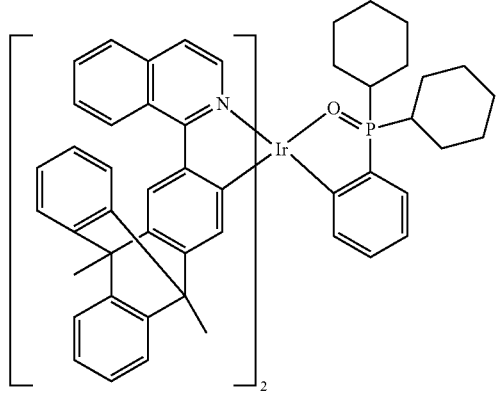
Ir-095
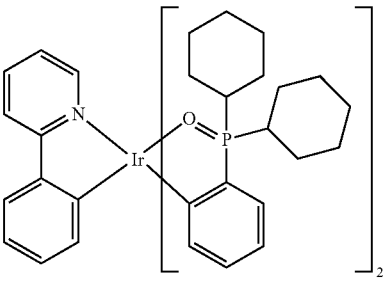
Ir-096
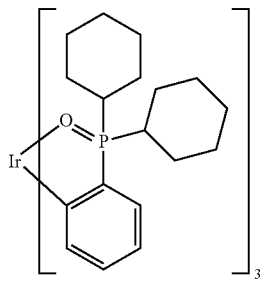
Ir-097
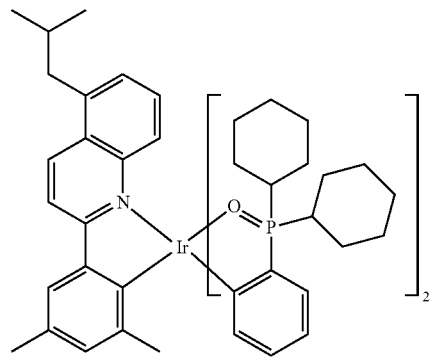
Ir-098
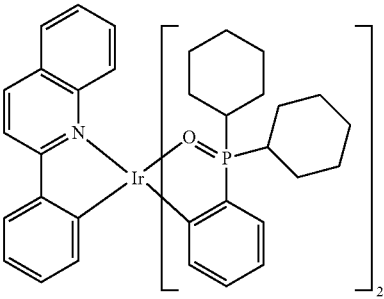
Ir-099
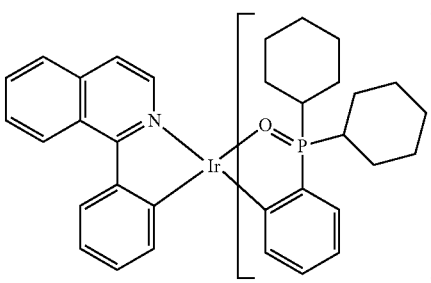

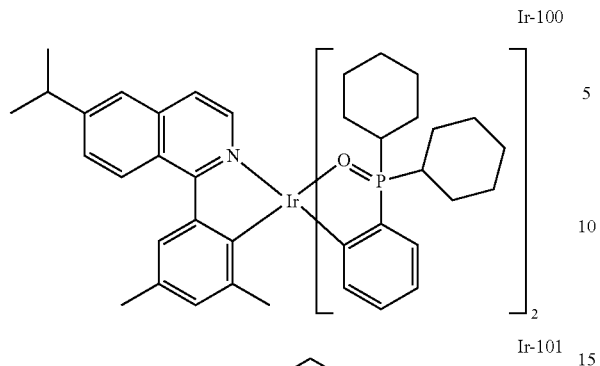
Ir-100
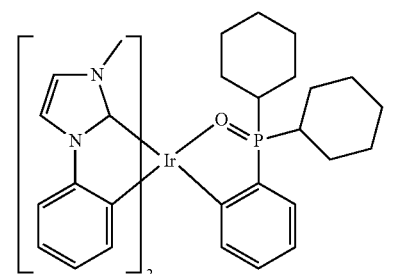
Ir-101
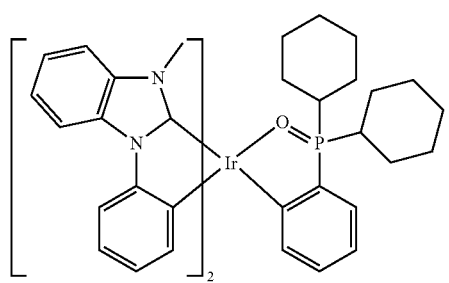
Ir-102
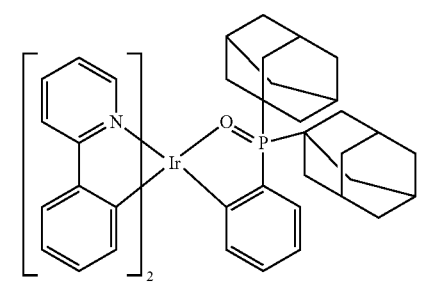
Ir-103
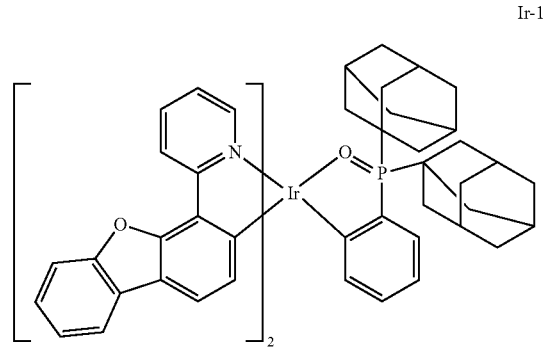
Ir-104
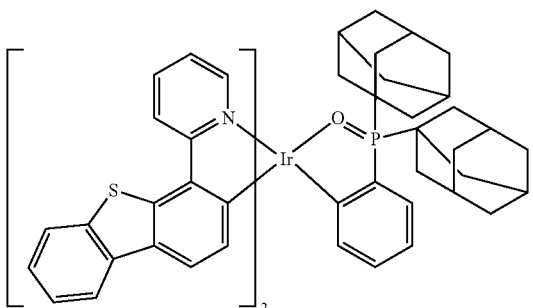
Ir-105
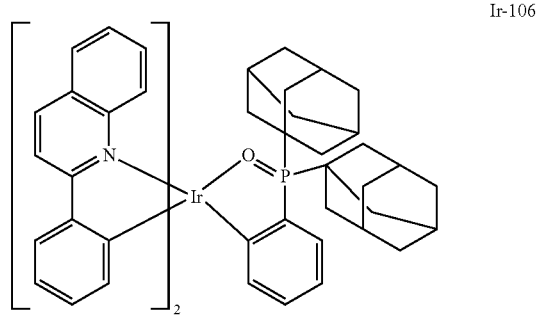
Ir-106
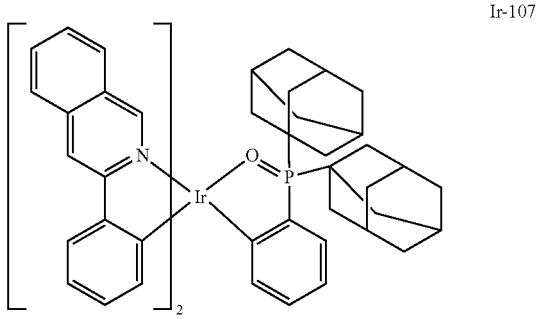
Ir-107
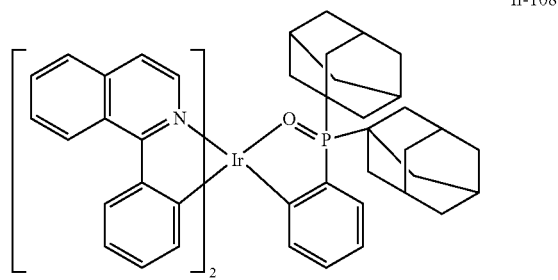
Ir-108
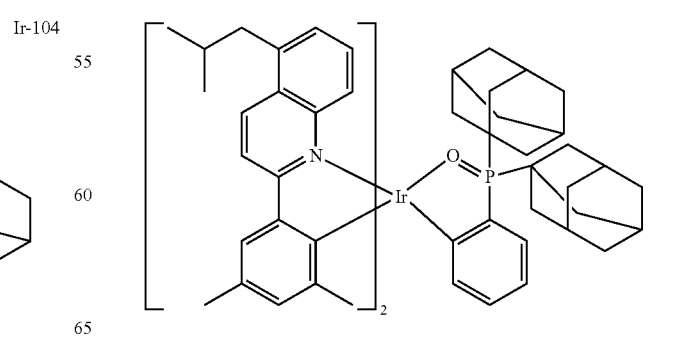
Ir-109

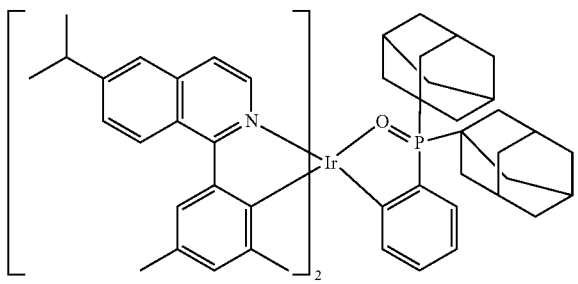
Ir-110
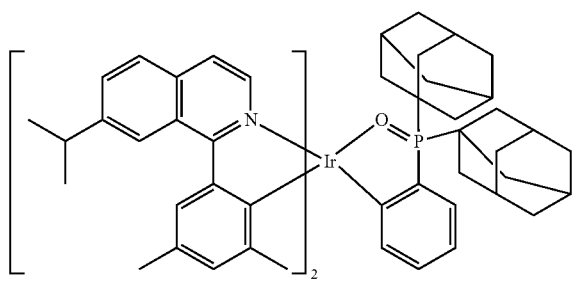
Ir-111
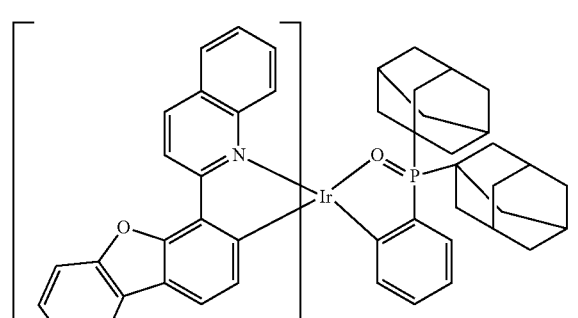
Ir-112
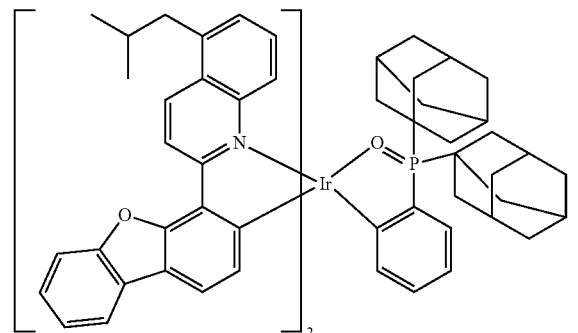
Ir-113
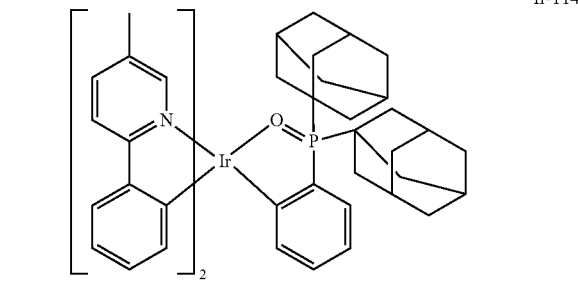
Ir-114
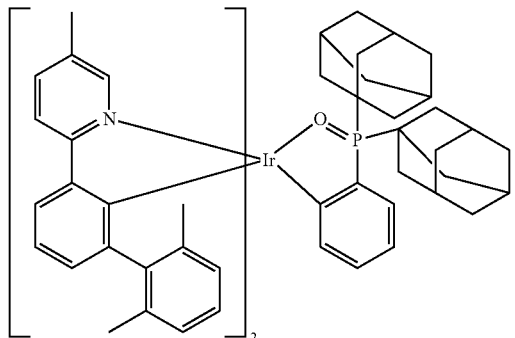
Ir-115
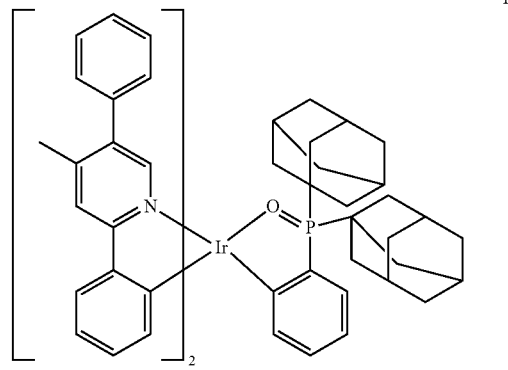
Ir-116
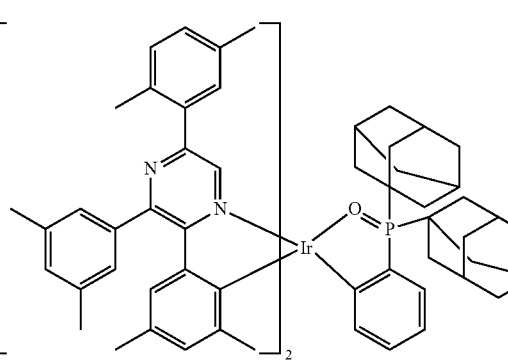
Ir-117
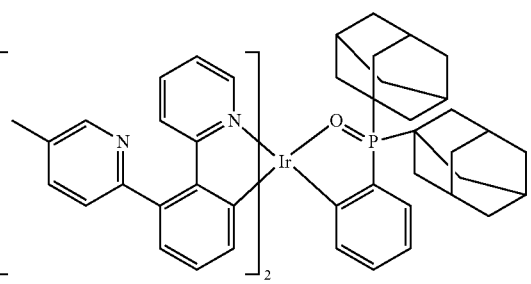
Ir-118

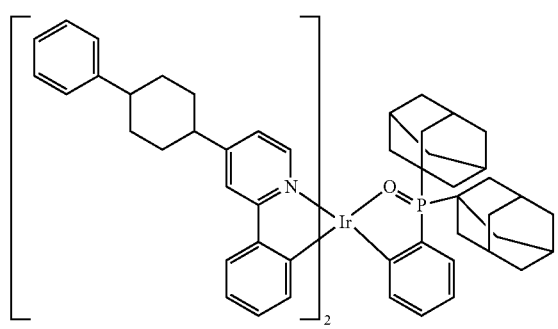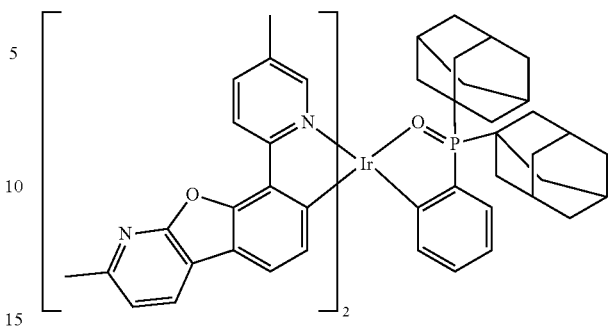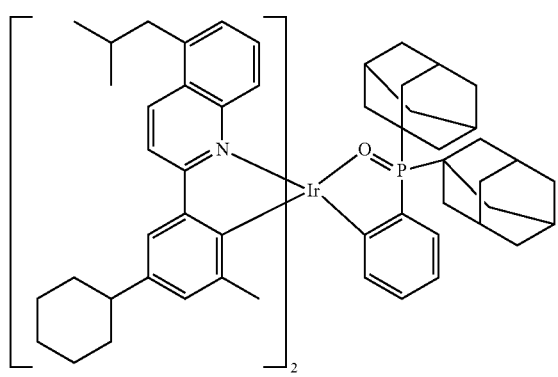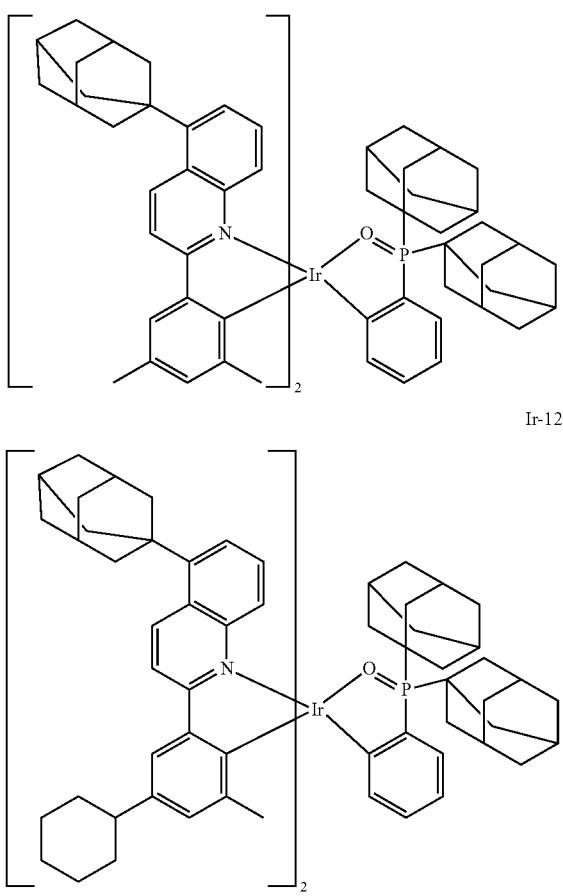

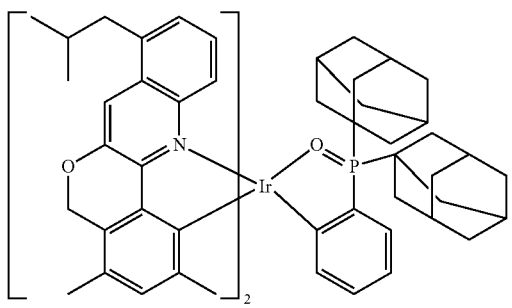
Ir-127
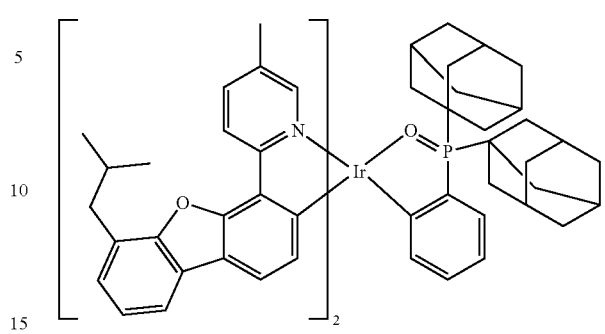
Ir-131
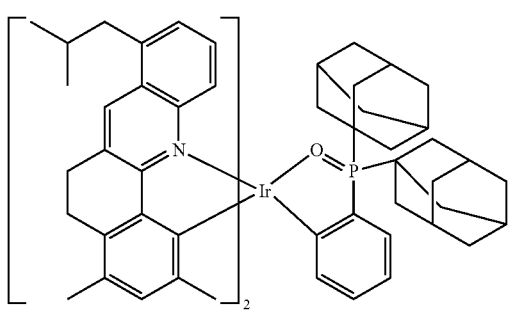
Ir-128
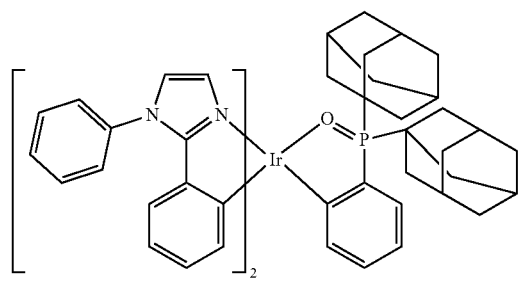
Ir-132
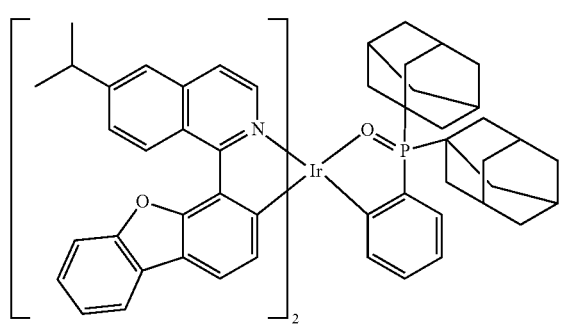
Ir-129
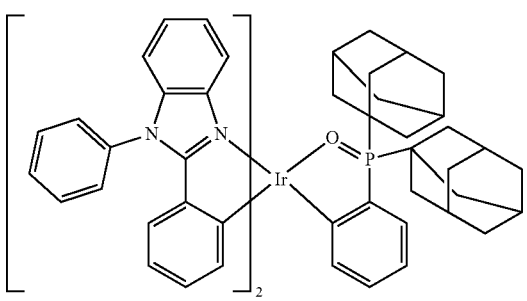
Ir-133
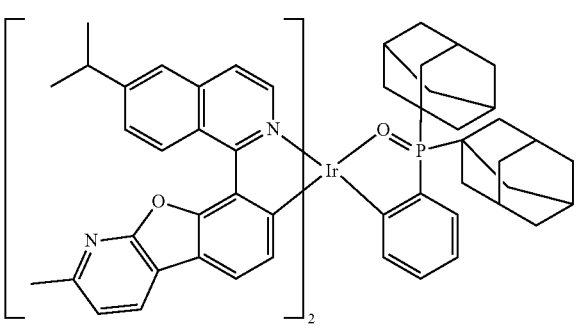
Ir-130
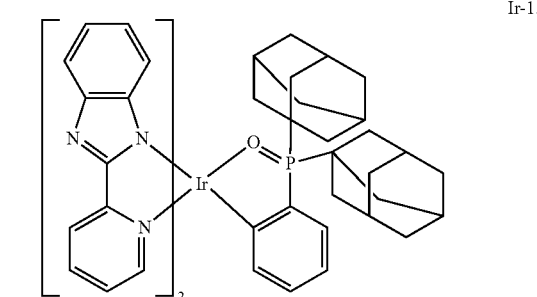
Ir-134
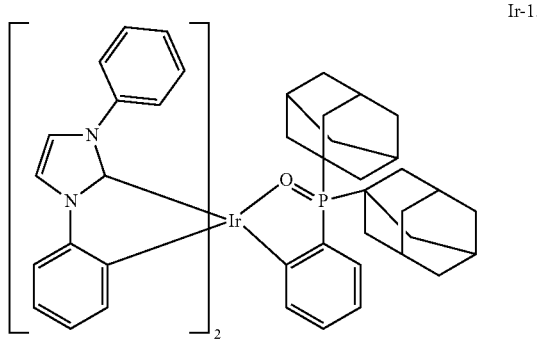
Ir-135

Ir-136
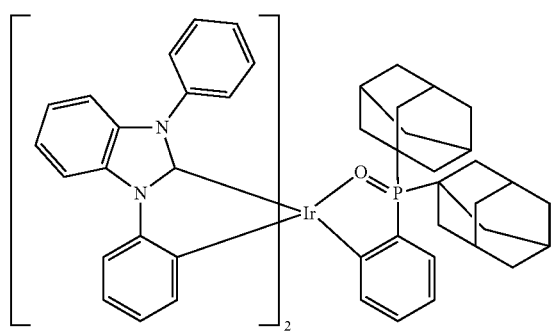
Ir-137
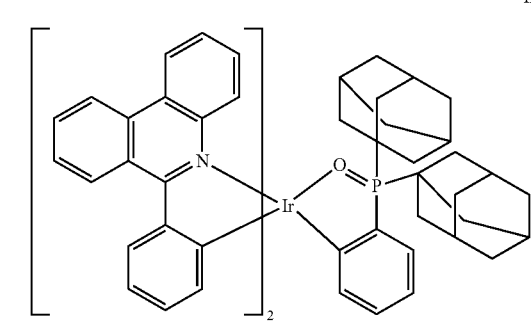
Ir-138
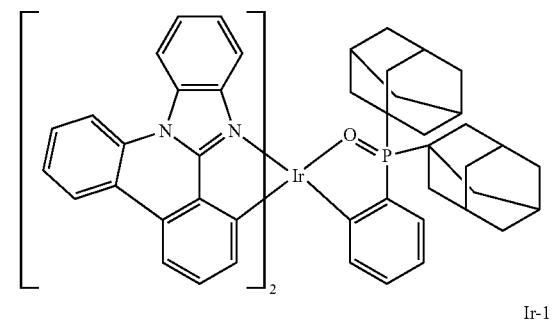
Ir-139
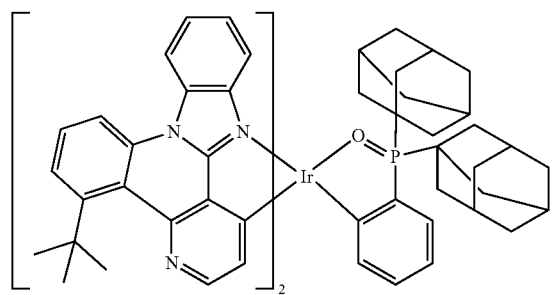
Ir-140
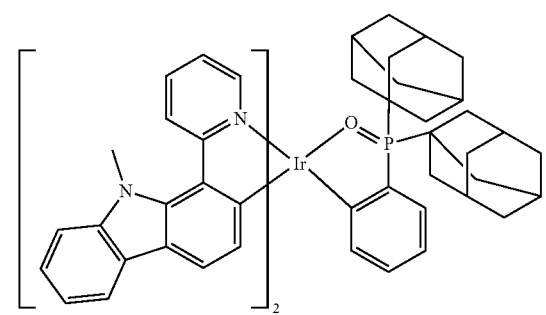
Ir-141
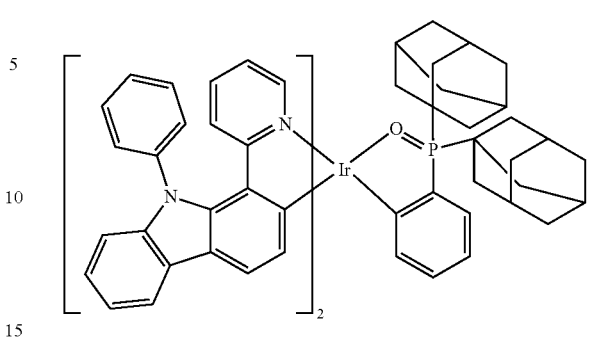
Ir-142
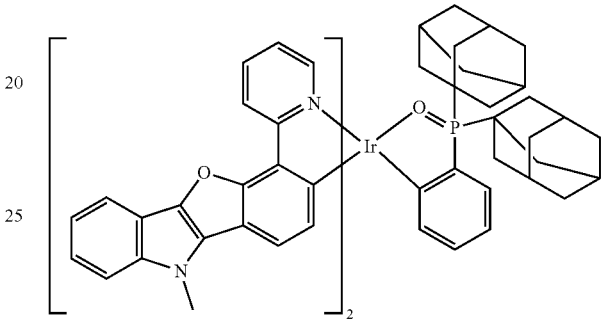
Ir-143
Ir-144

Ir-145
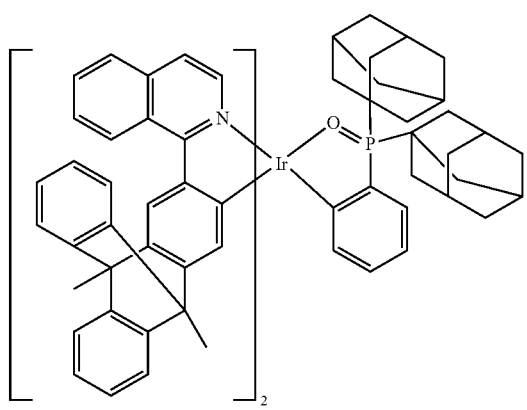
Ir-146
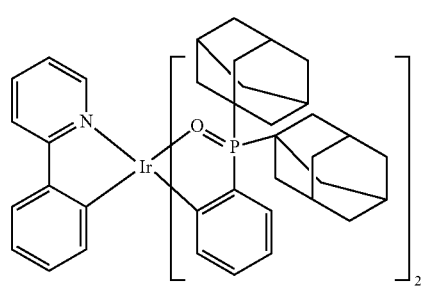
Ir-147
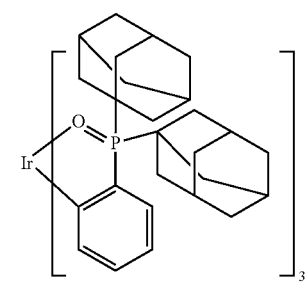
Ir-148
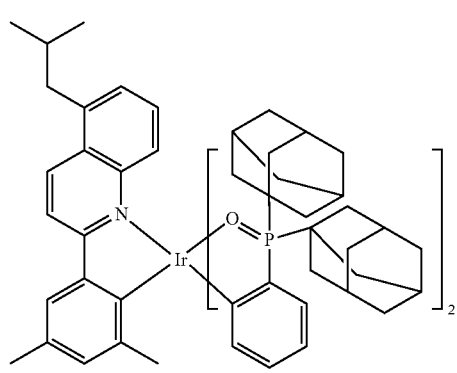
Ir-149
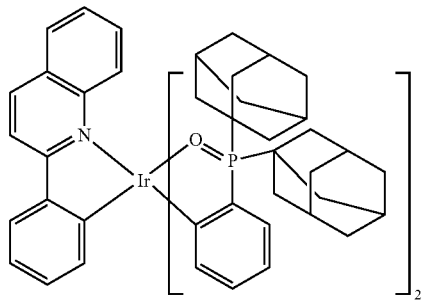
Ir-150
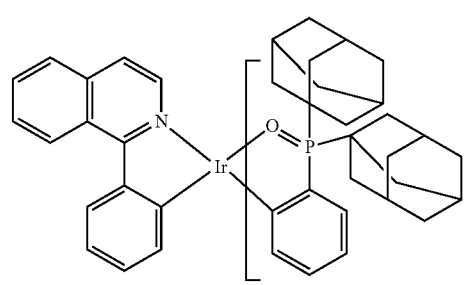
Ir-151
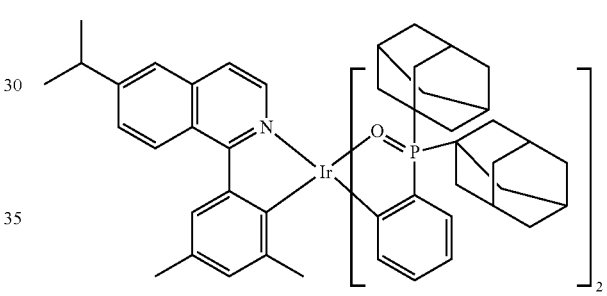
Ir-152
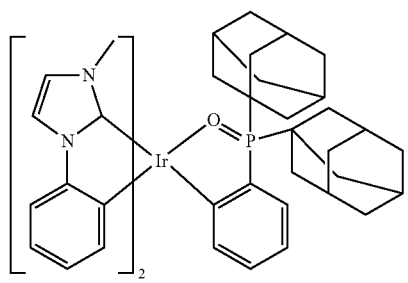
Ir-153
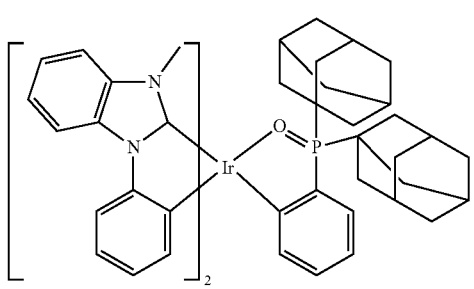

Ir-154
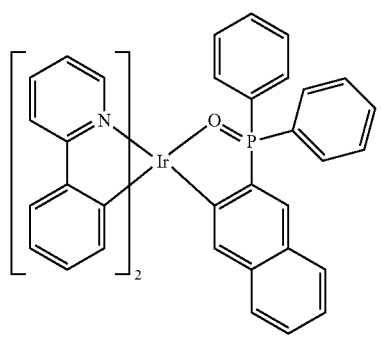
Ir-155
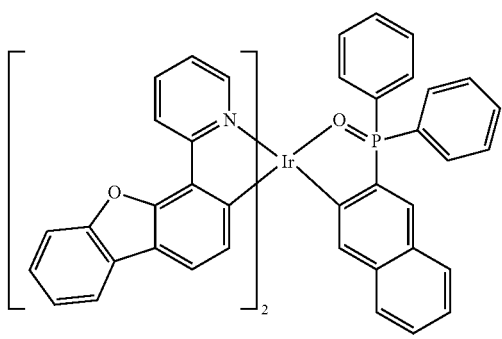
Ir-156
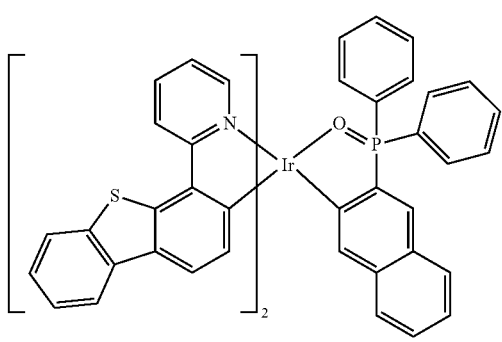
Ir-157
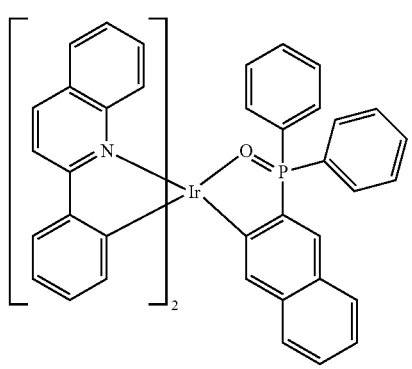
Ir-158
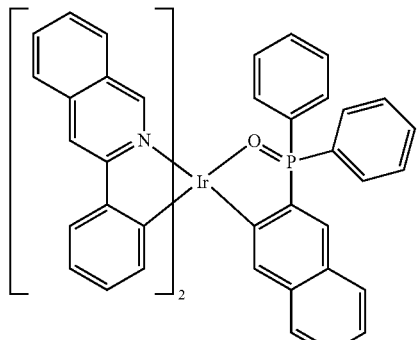
Ir-159
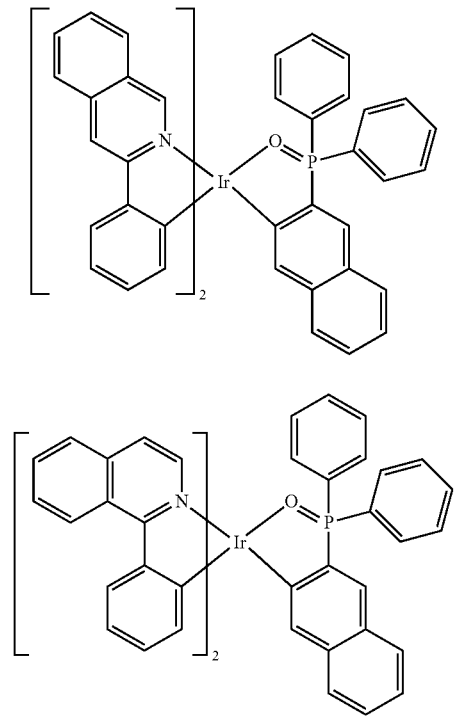
Ir-160
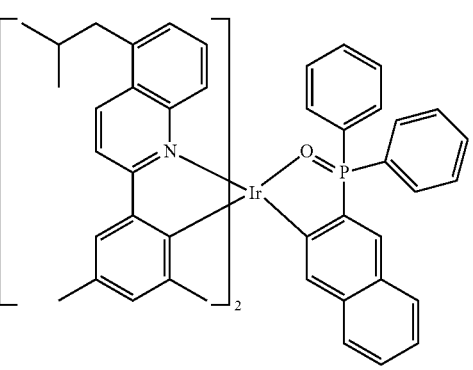
Ir-161
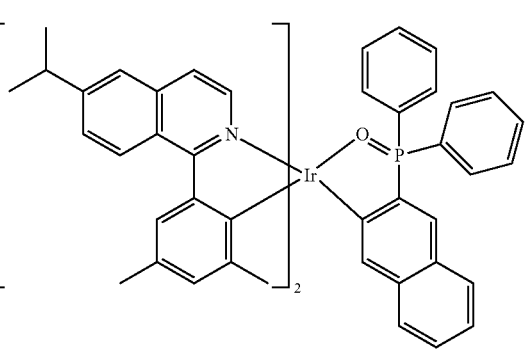

Ir-162
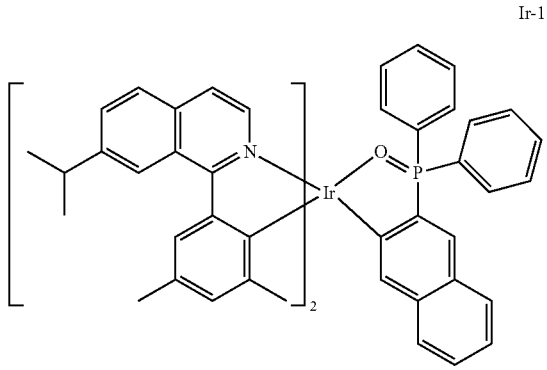
Ir-163
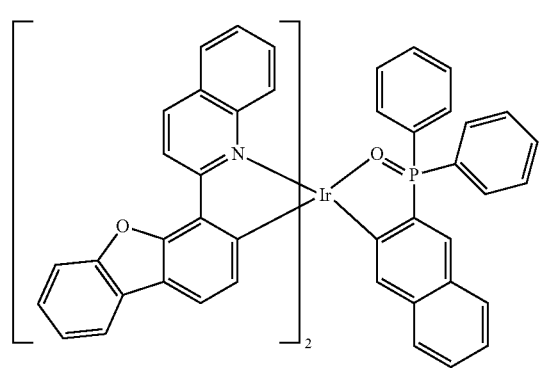
Ir-164
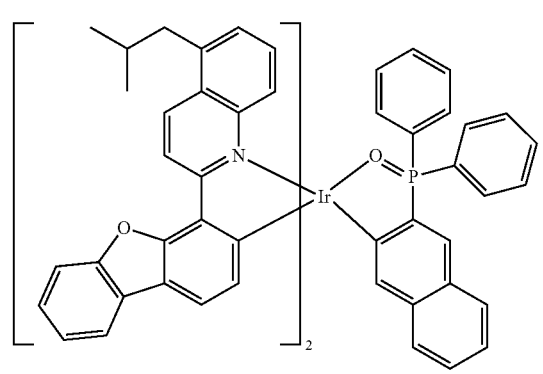
Ir-165
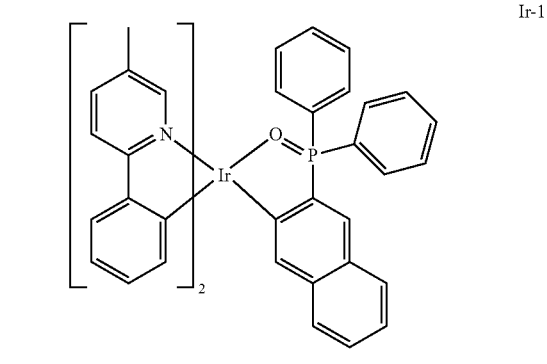
Ir-166
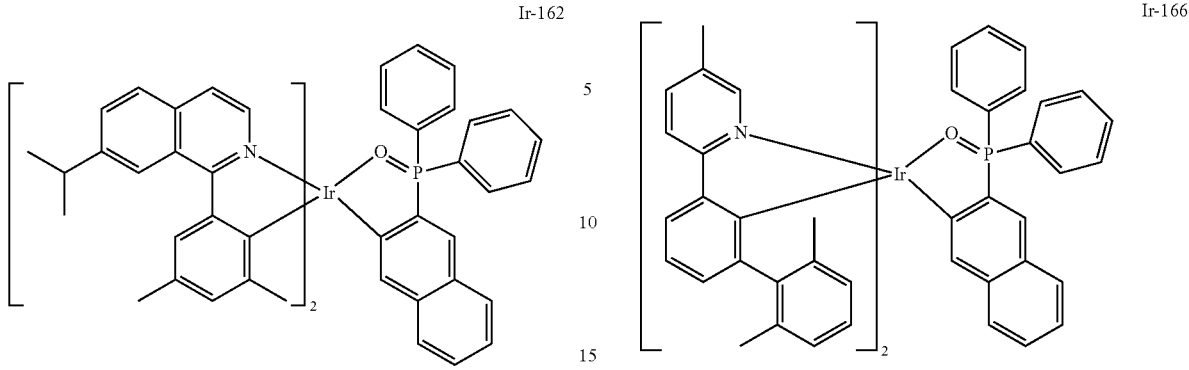
Ir-167
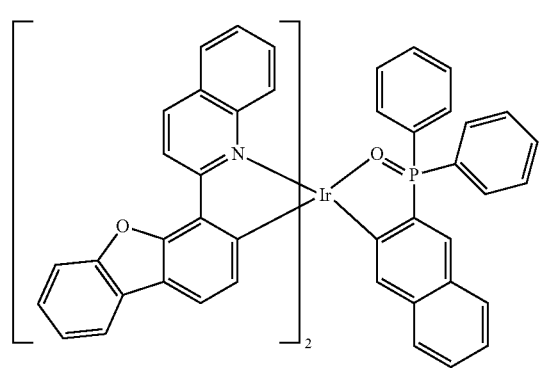
Ir-168
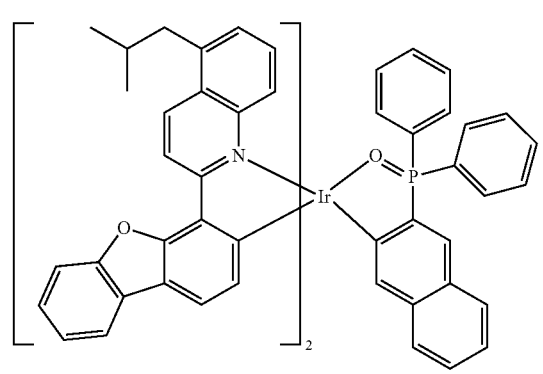
Ir-169
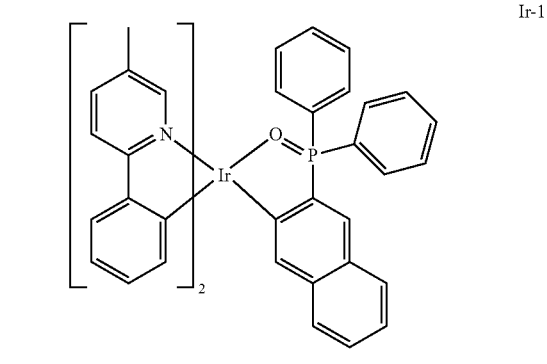

Ir-170
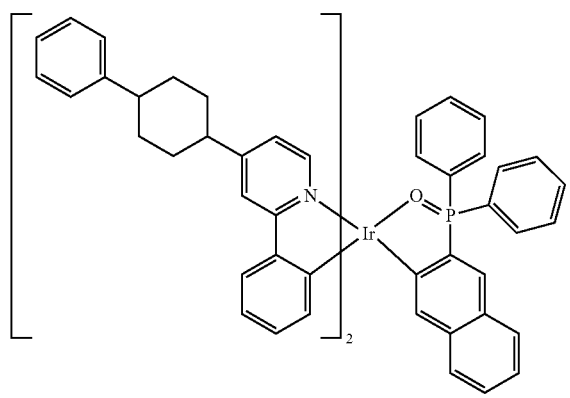
Ir-171
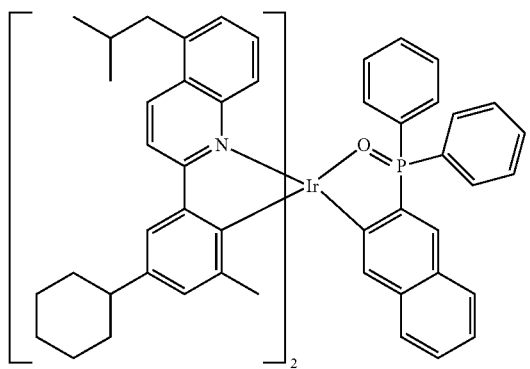
Ir-172
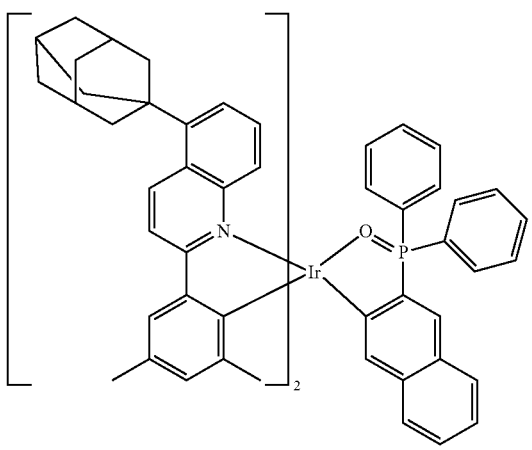
Ir-173
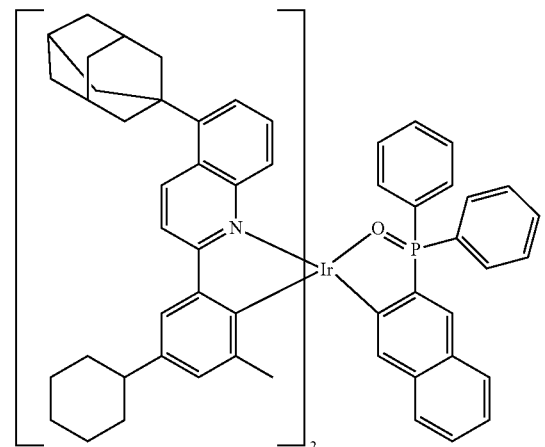
Ir-174
Ir-175

Ir-176
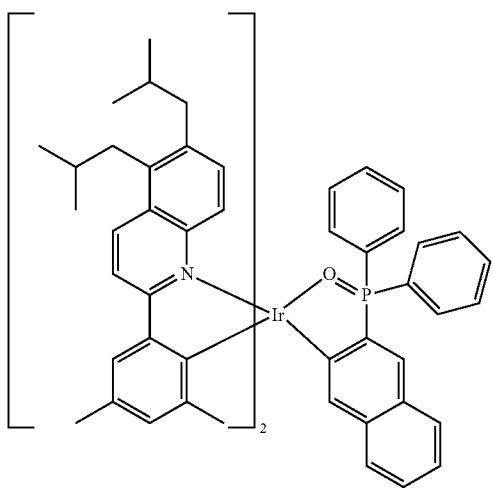
Ir-177
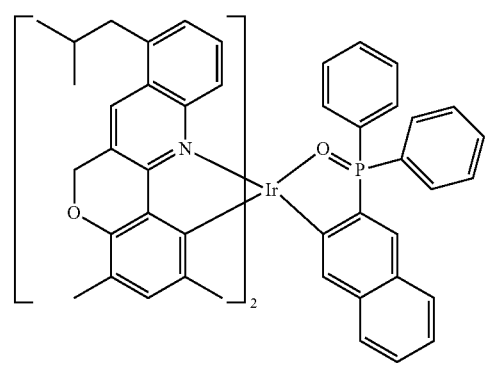
Ir-178
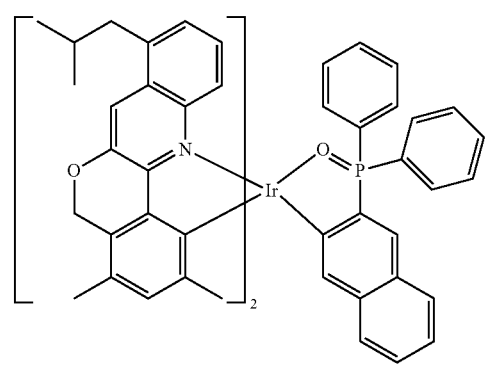
Ir-179
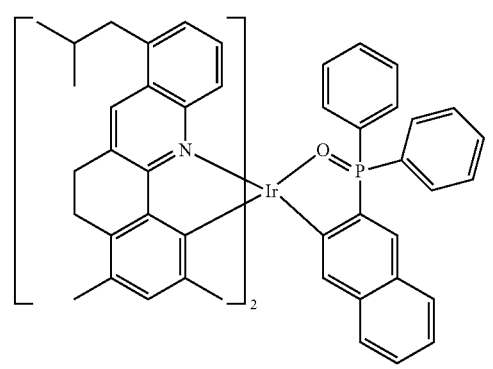
Ir-180
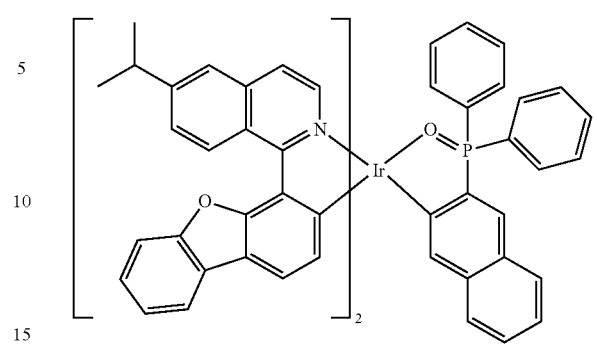
Ir-181
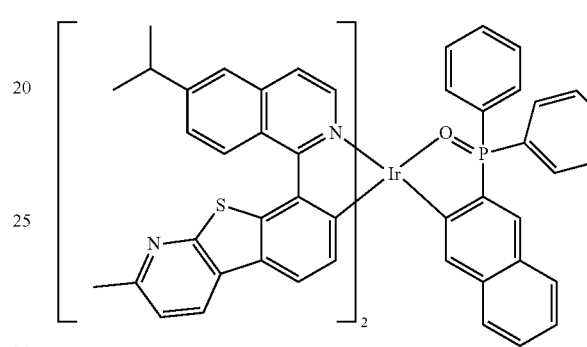
Ir-182
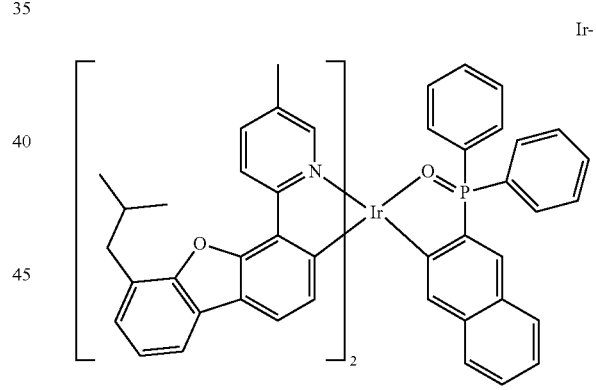
Ir-183
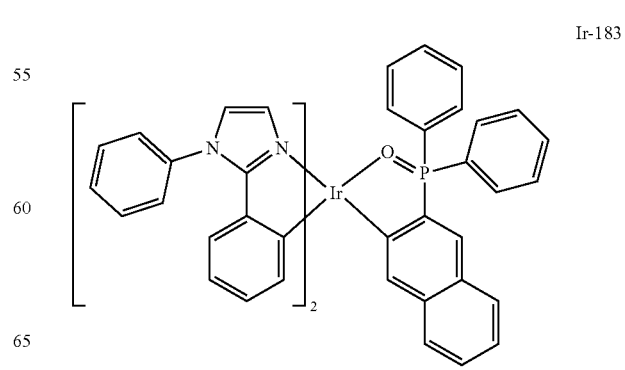

-continued
Ir-184
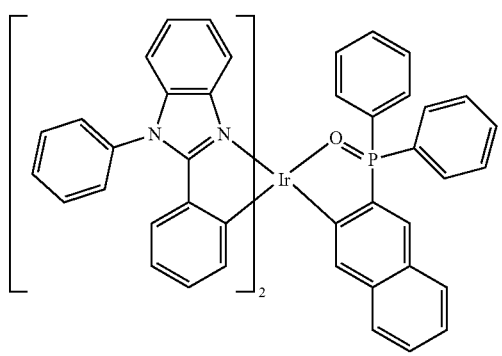
Ir-185
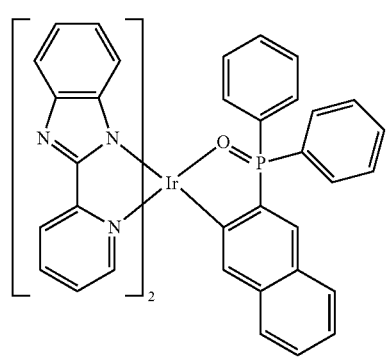
Ir-186
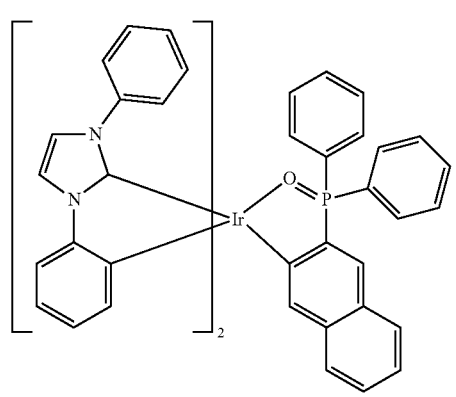
Ir-187
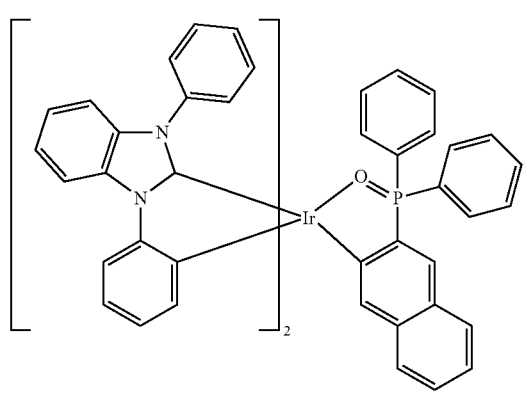
-continued
Ir-188
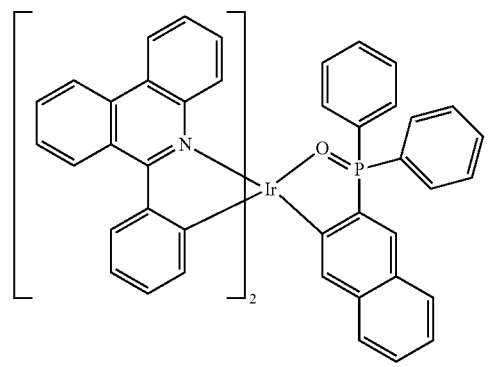
Ir-189
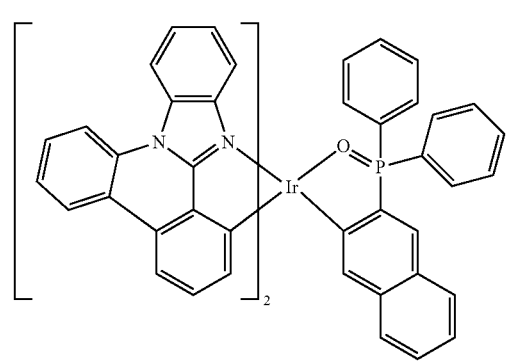
Ir-190
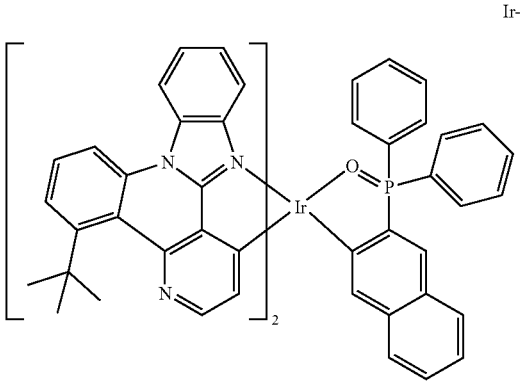
Ir-191
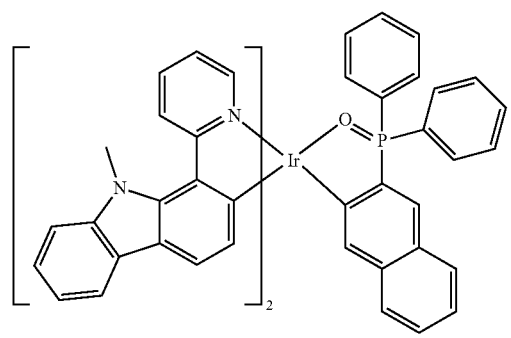

Ir-192
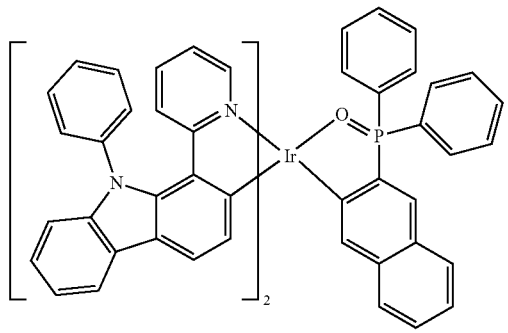
Ir-193
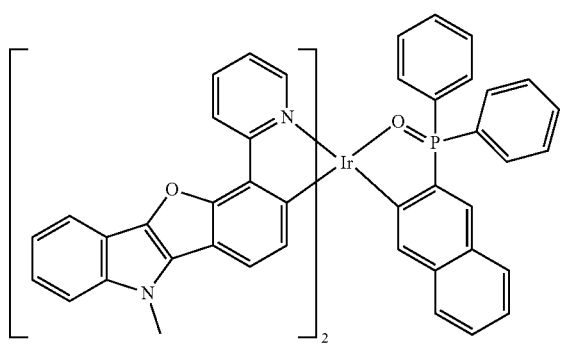
Ir-194
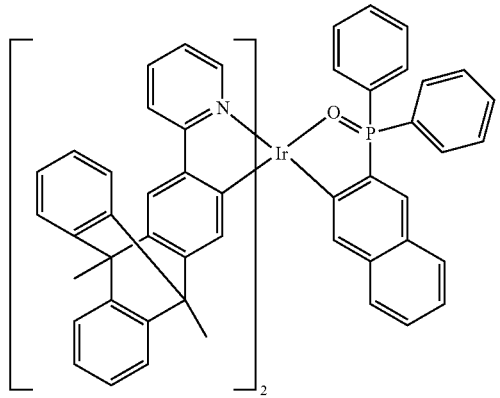
Ir-195
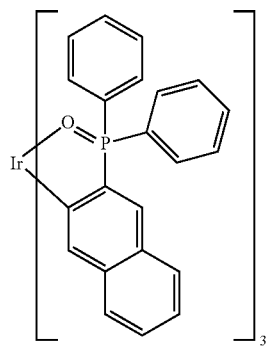
Ir-196
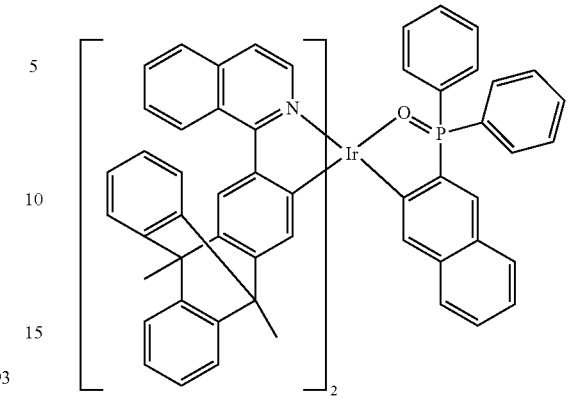
Ir-197
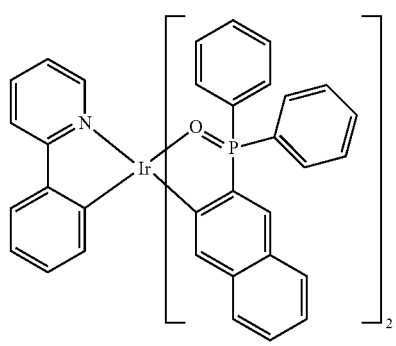
Ir-198
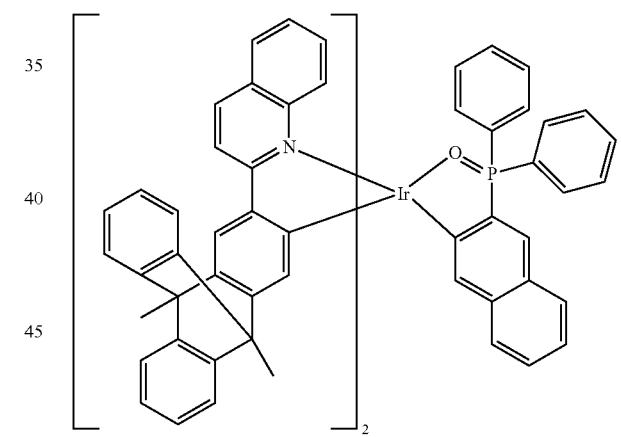
Ir-199
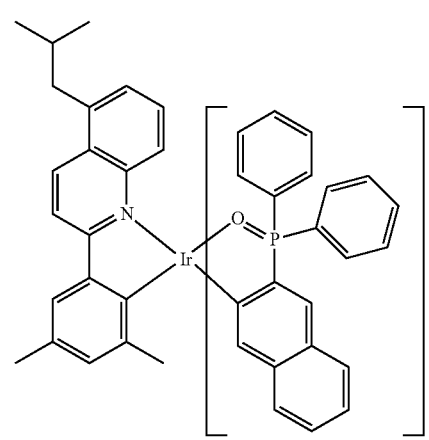

Ir-200
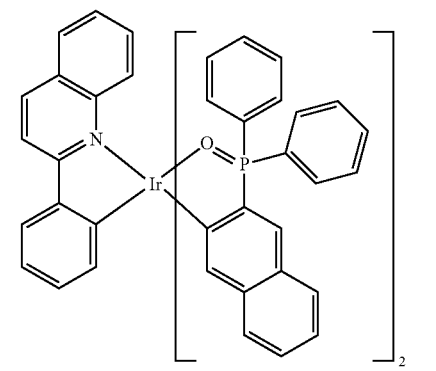
Ir-201
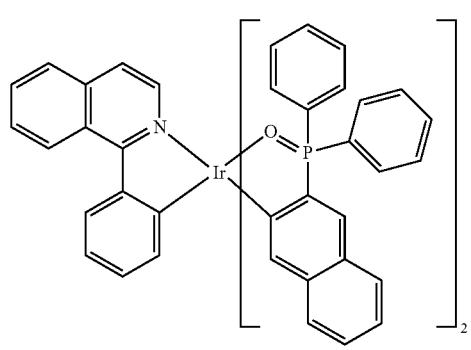
Ir-202
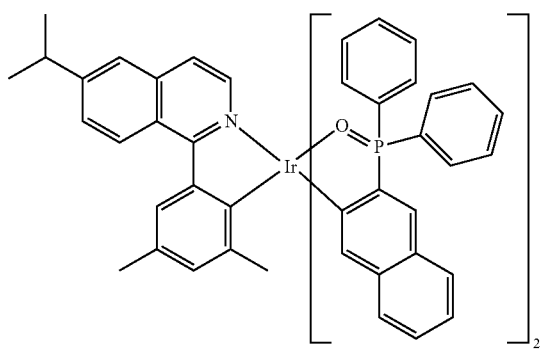
Ir-203
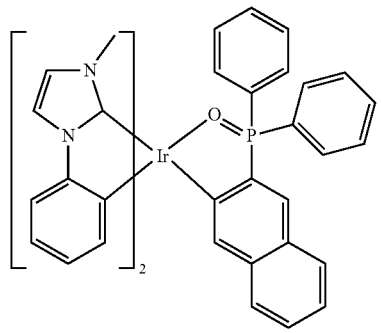
Ir-204
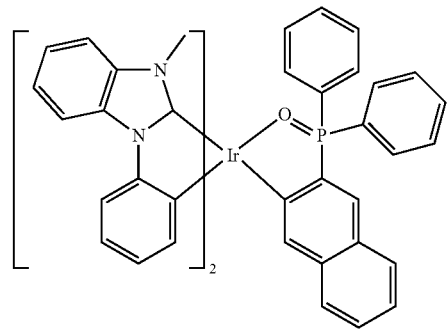
Ir-205
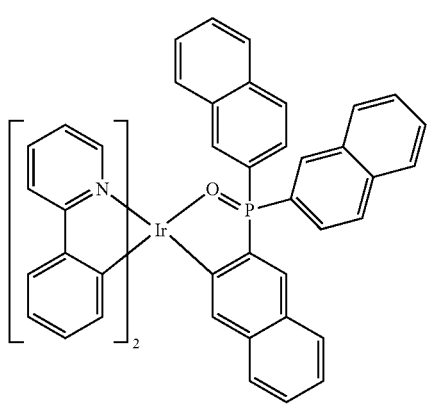
Ir-206
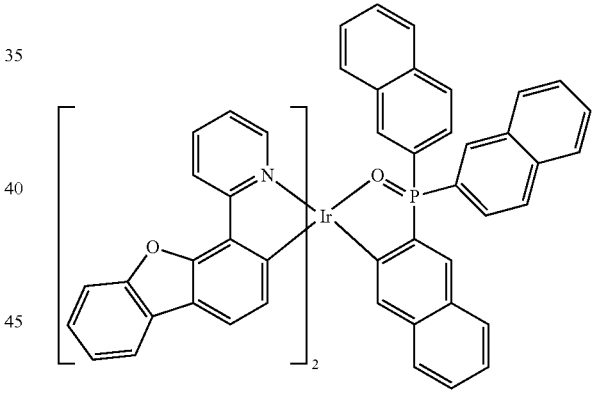
Ir-207
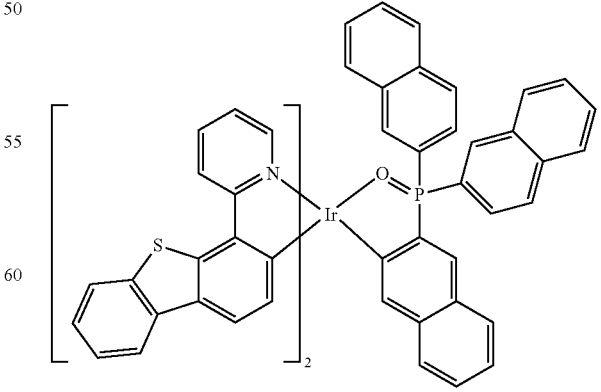

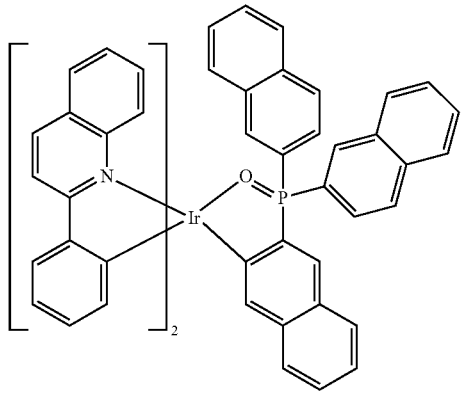
Ir-208
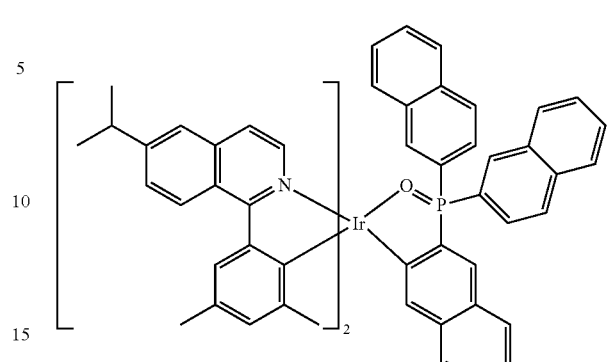
Ir-212
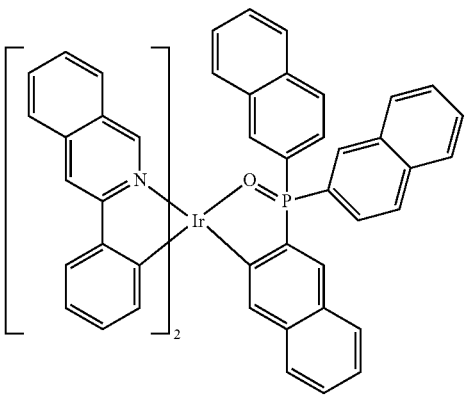
Ir-209
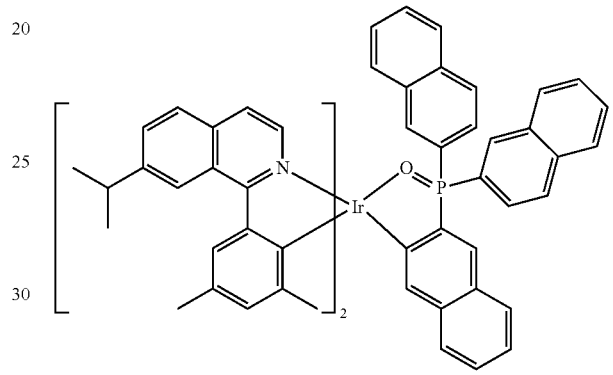
Ir-213
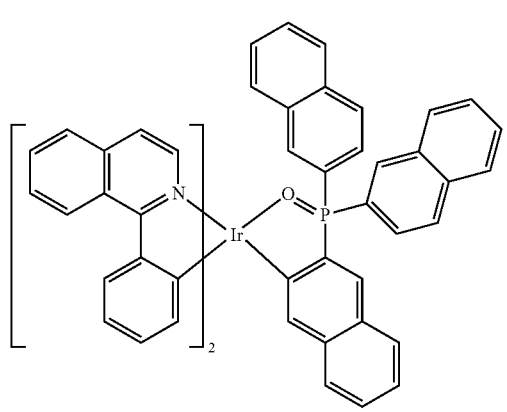
Ir-210
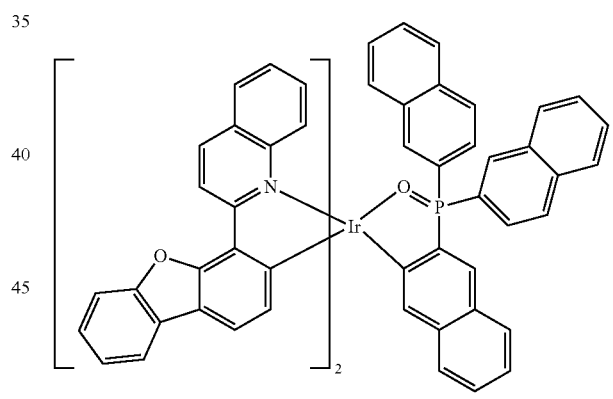
Ir-214
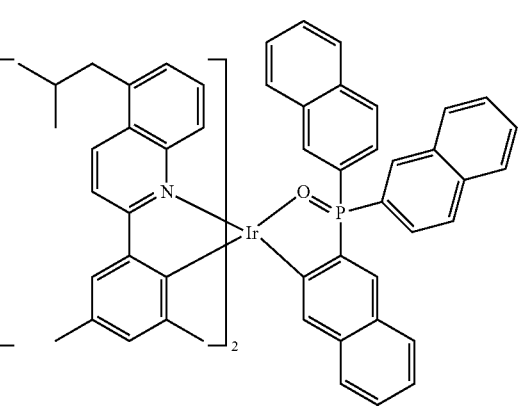
Ir-211
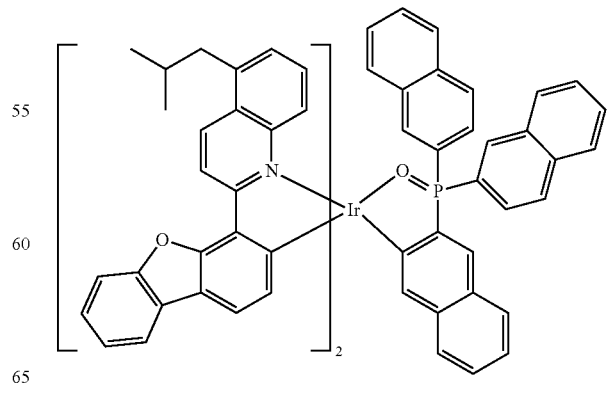
Ir-215

Ir-216
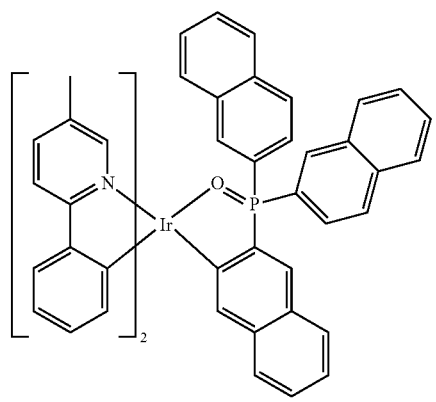
Ir-217
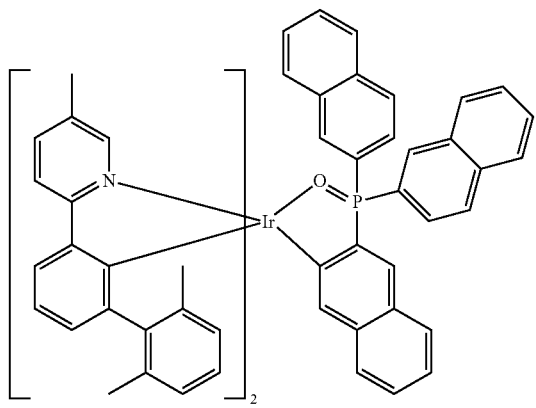
Ir-218
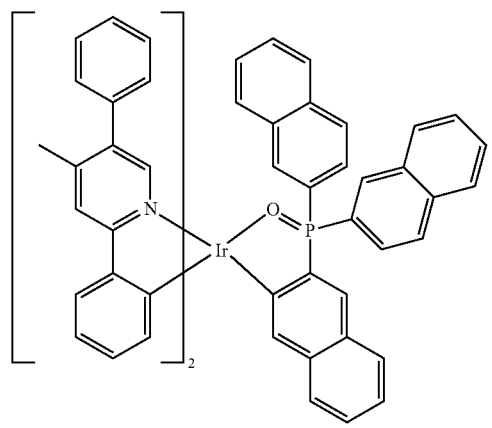
Ir-219
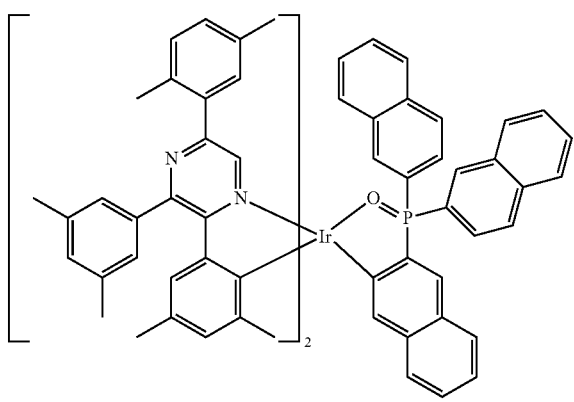
Ir-220
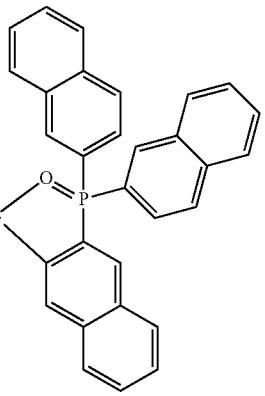
Ir-221
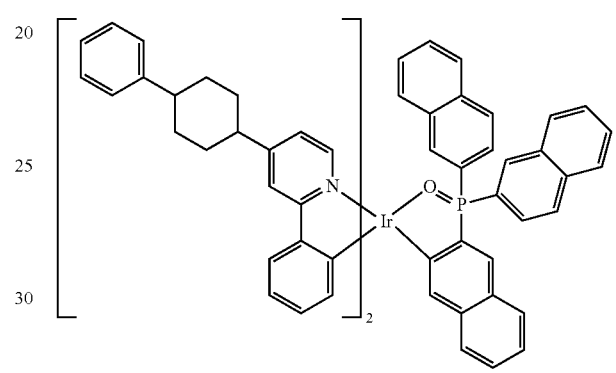
Ir-222
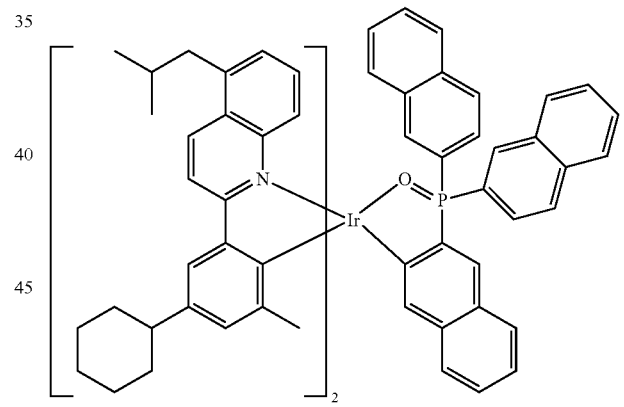
Ir-223
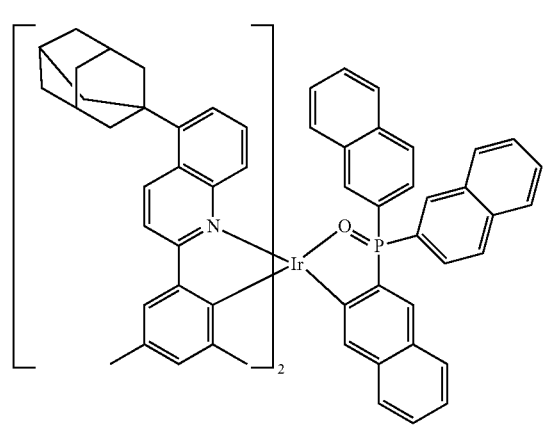

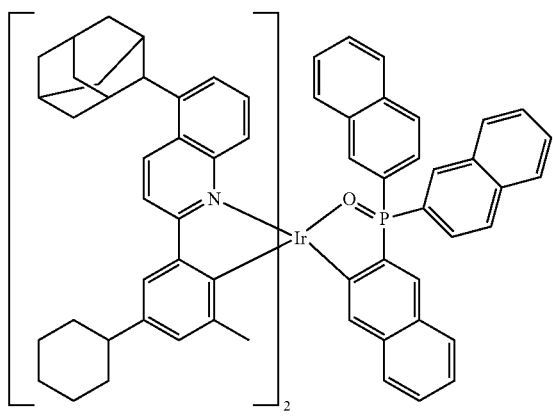
Ir-224
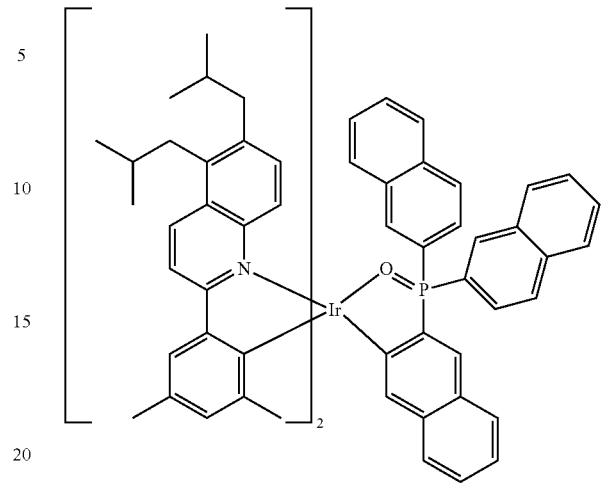
Ir-227
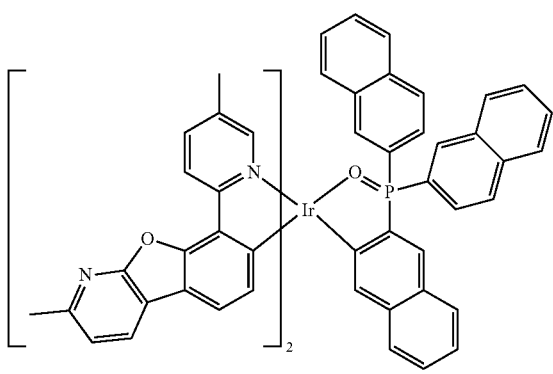
Ir-225
Ir-228
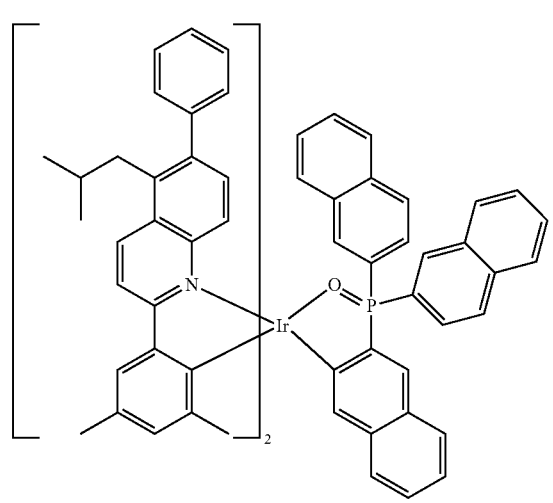
Ir-226
Ir-229

Ir-230
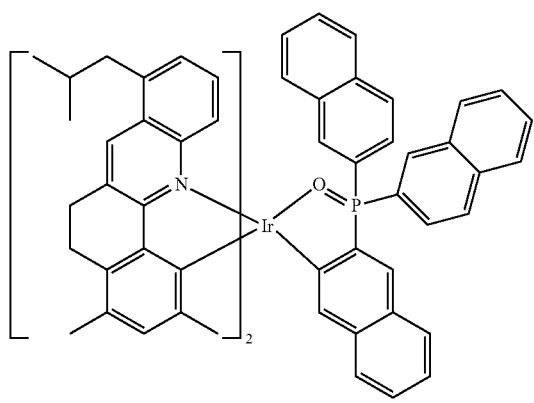
Ir-234
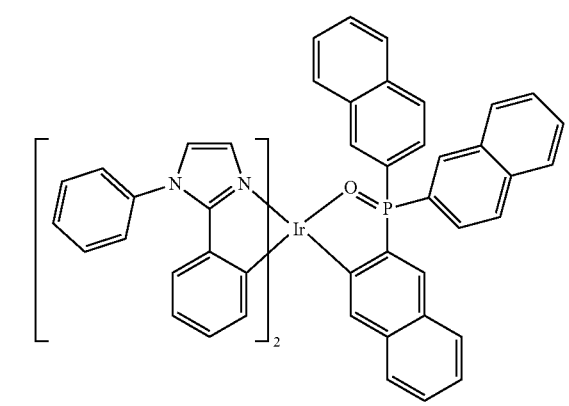
Ir-231
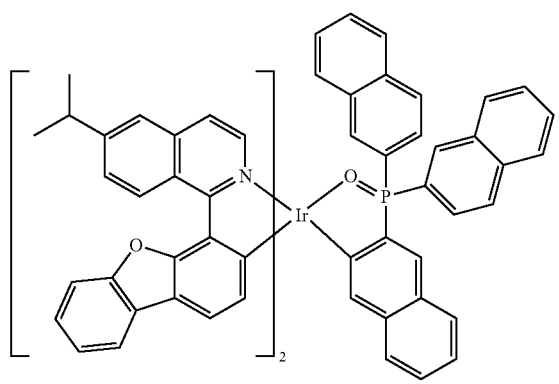
Ir-235
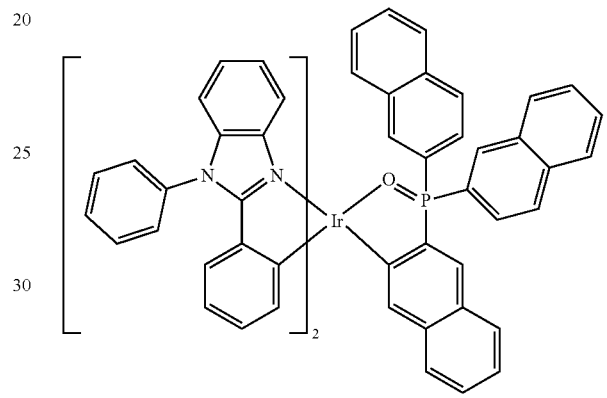
Ir-232
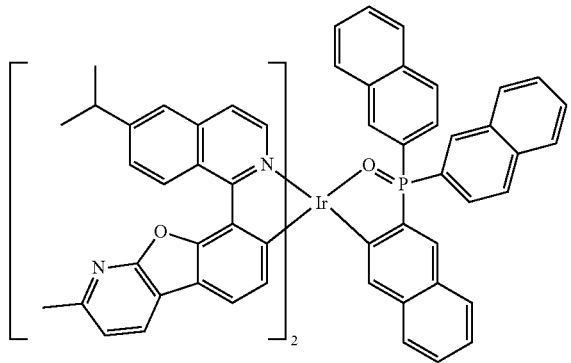
Ir-236
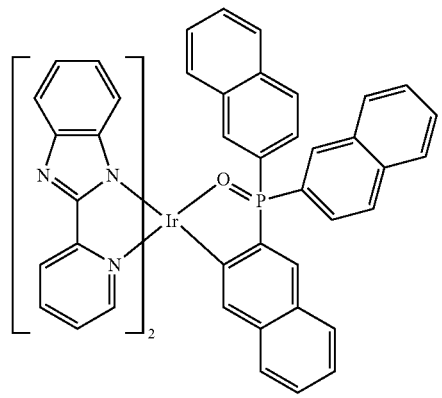
Ir-233
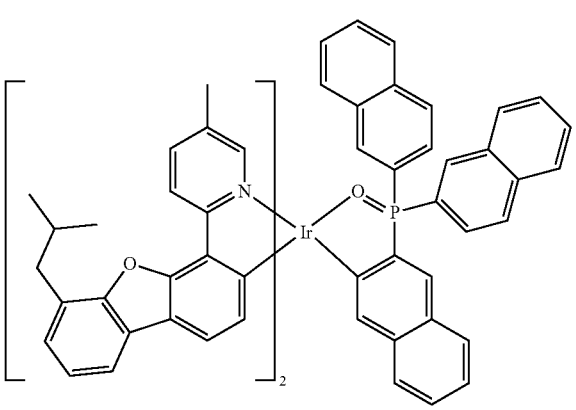
Ir-237
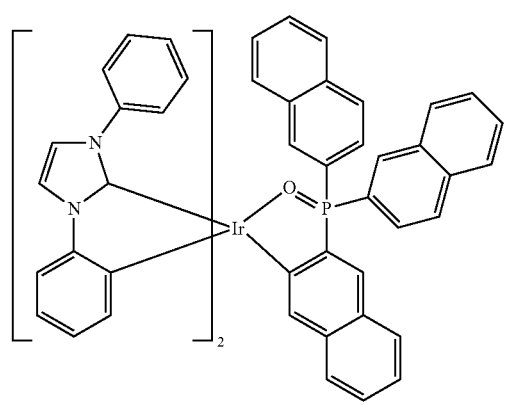

Ir-238
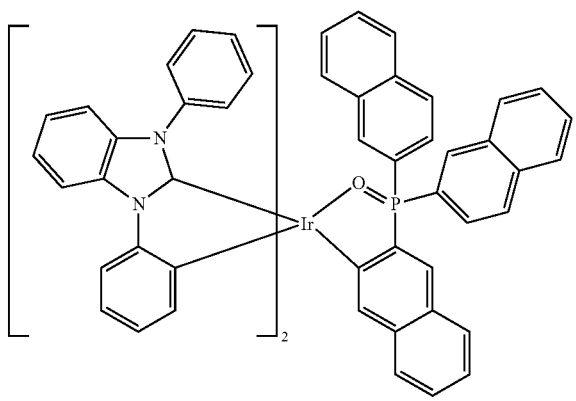
Ir-239
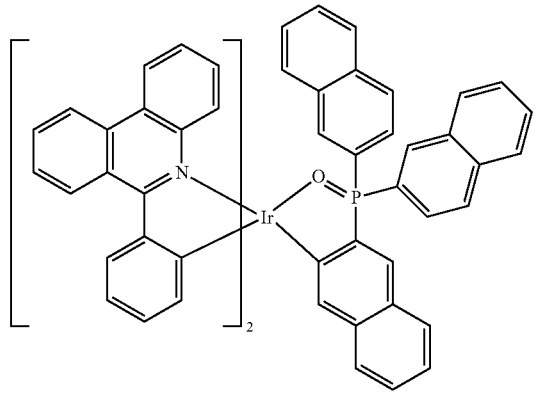
Ir-240
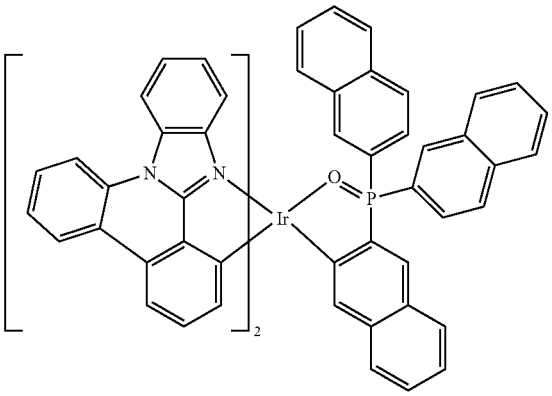
Ir-241
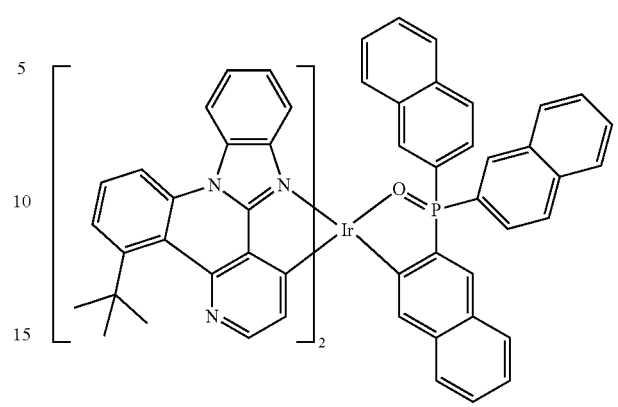
Ir-242
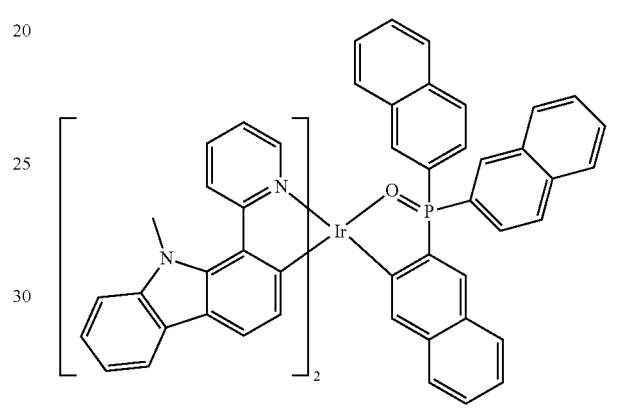
Ir-243
Ir-244
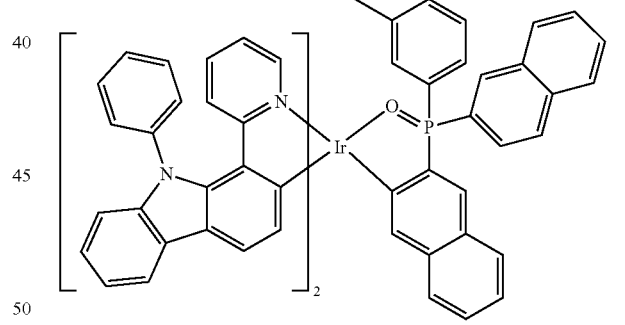

Ir-245
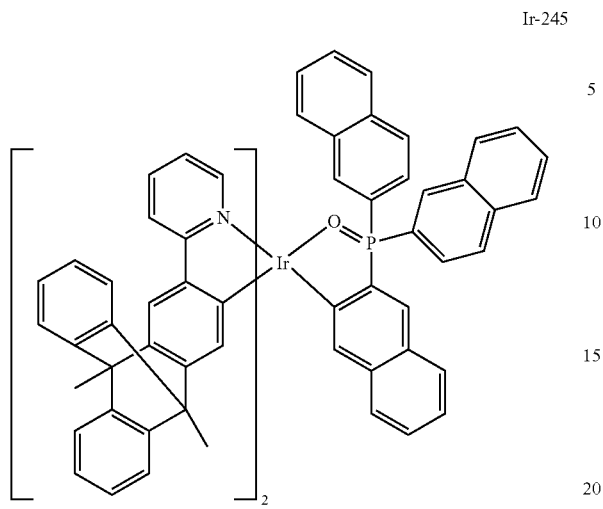
Ir-246
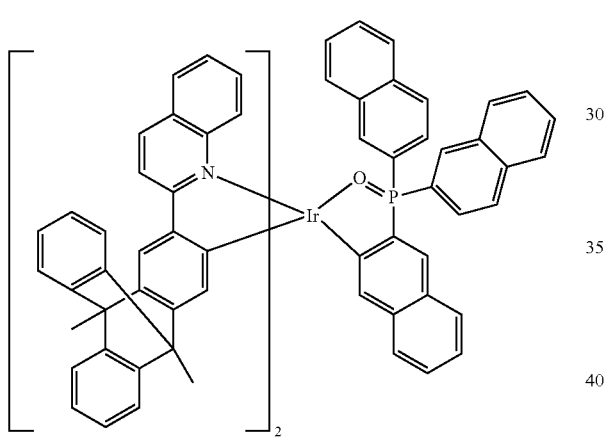
Ir-247
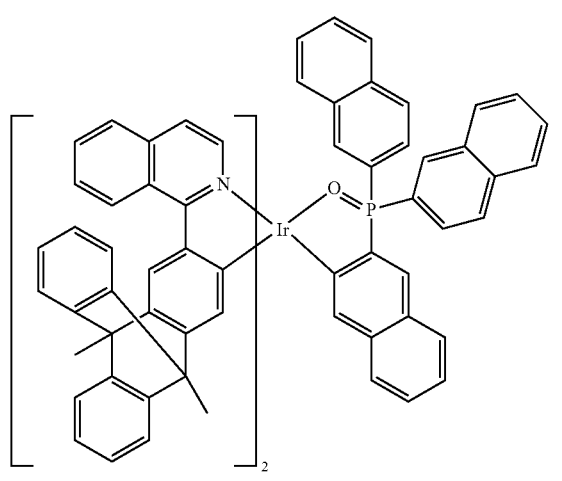
Ir-248
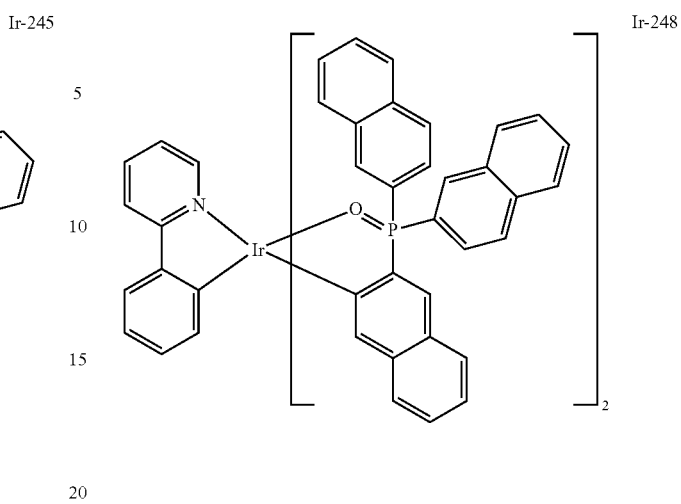
Ir-249
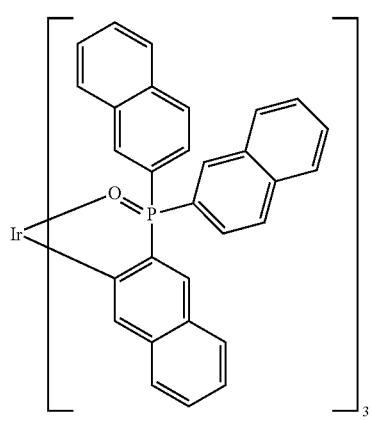
Ir-250
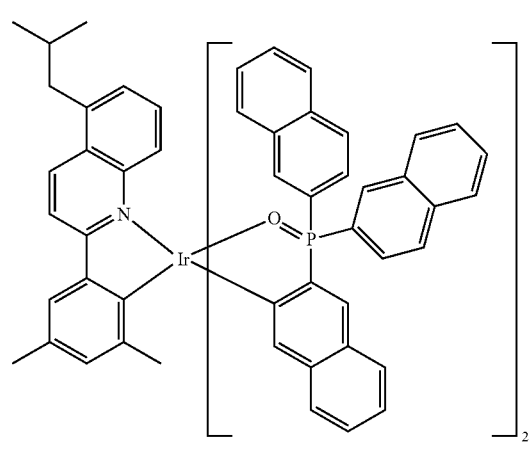

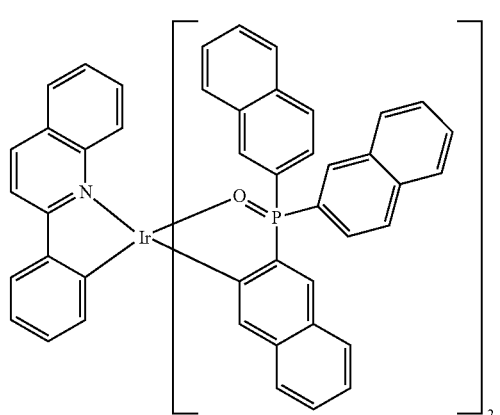

Ir-251

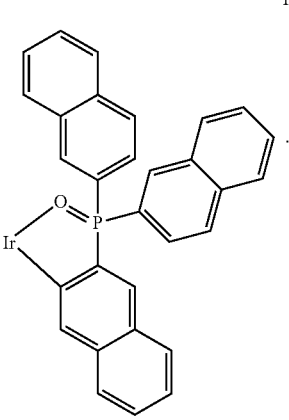

Ir-255

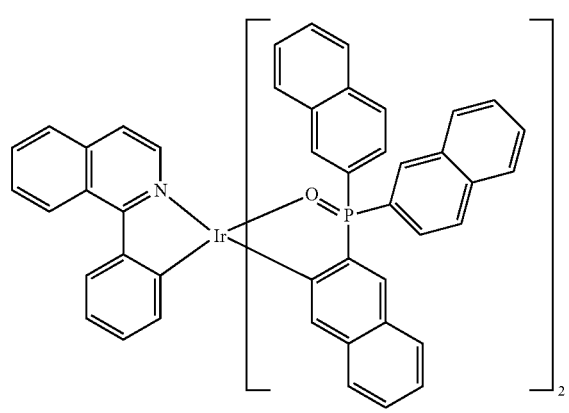

Ir-252

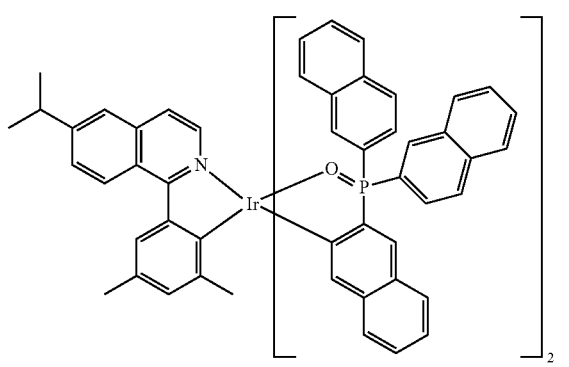

Ir-253

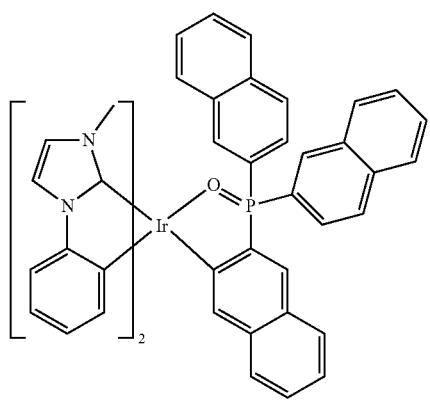

Ir-254

In an embodiment, when M is Au, the structural formulas (Au-001) to (Au-255) are the same as the structural formulas (Ir-001) to (Ir-255), except that "M is Ir" is modified as "M is Au".

In an embodiment, when M is Pt, the structural formulas (Pt-001) to (Pt-255) are the same as the structural formulas (Ir-001) to (Ir-255), except that "M is Ir" is modified as "M is Pt", and in the structural formulas (Ir-001) to (Ir-255), "m=2" is modified as "m=1" or "n=2" is modified as "n=1", or "n=3" is modified as "n=2".

In an embodiment, when M is Ru, the structural formulas (Ru-001) to (Ru-255) are the same as the structural formulas (Ir-001) to (Ir-255), except that "M is Ir" is modified as "M is Ru", and in the structural formulas (Ir-001) to (Ir-255), "m=2" is modified as "m=1" or "n=2" is modified as "n=1", or "n=3" is modified as "n=2".

In an embodiment, when M is Cu, the structural formulas (Cu-001) to (Cu-255) are the same as the structural formulas (Ir-001) to (Ir-265), except that "M is Ir" is modified as "M is Cu", and in the structural formulas (Ir-001) to (Ir-255), "m=2" is modified as "m=1" or "n=2" is modified as "n=1", or "n=3" is modified as "n=2".

In an embodiment, when M is Zn, the structural formulas (Zn-001) to (Zn-255) are the same as the structural formulas (Ir-001) to (Ir-255), except that "M is Ir" is modified as "M is Zn", and in the structural formulas (Ir-001) to (Ir-255), "m=2" is modified as "m=1" or "n=2" is modified as "n=1", or "n=3" is modified as "n=2".

In an embodiment, when M is Pd, the structural formulas (Pd-001) to (Pd-255) are the same as the structural formulas (Ir-001) to (Ir-255), except that "M is Ir" is modified as "M is Pd", and in the structural formulas (Ir-001) to (Ir-255), "m=2" is modified as "m=1" or "n=2" is modified as "n=1", or "n=3" is modified as "n=2".

The structural formulas in the case of other divalent metals are similar as above.

When M is selected from monovalent metals, the difference is that n=1, and m=0.

The transition metal complex according to the present disclosure may be used as functional material in electronic devices. Organic functional materials include, but are not limited to, a hole injection material (HIM), a hole transport material (HTM), an electron transport material (ETM), an electron injection material (EIM), an electron blocking material (EBM), a hole blocking material (HBM), an emitter, and a host material.

In some embodiments, the transition metal complex according to the present disclosure may be a functional material of a non-light-emitting material.

In an embodiment, the transition metal complex according to the present disclosure is a light-emitting material with a light-emitting wavelength between 300 nm and 1000 nm, between 350 nm and 900 nm in another embodiment, between 400 nm and 800 nm in a particular embodiment. The term luminescence/light-emitting herein refers to photoluminescence or electroluminescence.

In some embodiments, the transition metal complex according to the present disclosure has a photoluminescence or electroluminescence efficiency ≥30%. In another embodiment, the photoluminescence or electroluminescence efficiency is ≥40%. In a further embodiment, the photoluminescence or electroluminescence efficiency is ≥50%. In a particular embodiment, the photoluminescence or electroluminescence efficiency is ≥60%.

In an embodiment, the transition metal complex according to the present disclosure is a phosphorescent guest material.

As a phosphorescent guest material, it must have a proper triplet energy level, i.e., $T_1$. In certain embodiments, the transition metal complex according to the present disclosure has a $T_1 \geq 2.0$ eV. In another embodiment, $T_1 \geq 2.2$ eV. In a further embodiment, $T_1 \geq 2.4$ eV. In a particular embodiment, $T_1 \geq 2.6$ eV.

As a functional material, good thermal stability is desired. Generally, the transition metal complex according to the present disclosure has a glass transition temperature $T_g \geq 100°$ C. In an embodiment, $T_g \geq 120°$ C. In another embodiment, $T_g \geq 160°$ C. In an embodiment, $T_g \geq 180°$ C.

In certain embodiments, the transition metal complex according to the present disclosure has ((HOMO-(HOMO-1))≥0.2 eV. In another embodiment, the ((HOMO-(HOMO-1))≥0.25 eV. In another embodiment, the ((HOMO-(HOMO-1))≥0.3 eV. In a further embodiment, the ((HOMO-(HOMO-1))≥0.4 eV. In a particular embodiment, the ((HOMO-(HOMO-1))?0.45 eV.

In other embodiments, the transition metal complex according to the present disclosure has (((LUMO+1)-LUMO)≥0.15 eV. In another embodiment, the (((LUMO+1)-LUMO)≥0.20 eV. In a further embodiment, the R(LUMO+1)-LUMO)≥0.25 eV. In a further embodiment, the (((LUMO+1)-LUMO)≥0.30 eV. In a particular embodiment, the (((LUMO+1)-LUMO)≥0.35 eV.

The present disclosure further relates to a polymer comprising at least one structural unit of the transition metal complex as a repeating unit.

In an embodiment, the synthesis method of the polymer is selected from the group consisting of SUZUKI-, YAMAMOTO-, STILLE-, NIGESHI-, KUMADA-, HECK-, SONOGASHIRA-, HIYAMA-, FUKUYAMA-, HARTWIG-BUCHWALD- and ULLMAN.

In an embodiment, the polymer according to the present disclosure has a glass transition temperature $(T_g) \geq 100°$ C. In another embodiment, Tg≥120° C. In a further embodiment, Tg≥140° C. In a further embodiment, Tg≥160° C. In a particular embodiment, Tg≥180° C.

In an embodiment, the polymer according to the present disclosure has a molecular weight distribution (PDI) in the range of 1 to 5. In another embodiment, the PDI is in the range of 1 to 4. In a further embodiment, the PDI is in the range of 1 to 3. In a further embodiment, the PDI is in the range of 1 to 2. In a particular embodiment, the PDI is in the range of 1 to 1.5.

In an embodiment, the polymer according to the present disclosure has a weight average molecular weight (Mw) in the range of 10,000 to 1,000,000. In another embodiment, Mw is in the range of 50,000 to 500,000. In a further embodiment, Mw is in the range of 100,000 to 400,000. In a further embodiment, Mw is in the range of 150,000 to 300,000. In a particular embodiment, Mw is in the range of 200,000 to 250,000.

In certain embodiments, the polymer according to the present disclosure is a non-conjugated polymer. Further, it is a non-conjugated polymer in which a structural unit of the transition metal complex is included as a repeating unit in the side chain.

The present disclosure also provides a mixture characterized by comprising at least one transition metal complexes or polymers as described above and at least another organic functional material, wherein the at least another organic functional material may be selected from the group consisting of a hole injection material (HIM), a hole transport material (HTM), an electron transport material (ETM), an electron injection material (EIM), an electron blocking material (EBM), a hole blocking material (HBM), an emitter, a host material, and an organic dye. Various organic functional materials are described in detail, for example, in WO2010135519A1, US20090134784A1, and WO2011110277A1, and the entire contents of these three patent documents are hereby incorporated herein by reference.

In some embodiments, the content of the transition metal complex in the mixture according to the present disclosure is 0.01 wt % to 30 wt %. In another embodiment, the content of the transition metal complex is 0.5 wt % to 20 wt %. In a further embodiment, the content of the transition metal complex is 2 wt % to 15 wt %. In a particular embodiment, the content of the transition metal complex is 5 wt % to 15 wt %.

In an embodiment, the mixture according to the present disclosure comprises the transition metal complex or the polymer according to the present disclosure and a triplet host material.

In another embodiment, the mixture according to the present disclosure comprises the transition metal complex or the polymer according to the present disclosure, a triplet matrix material and another triplet emitter.

In another embodiment, the mixture according to the present disclosure comprises the transition metal complex or the polymer according to the present disclosure and a thermally activated delayed fluorescence (TADF) light-emitting material.

In another embodiment, the mixture according to the present disclosure comprises the transition metal complex or the polymer according to the present disclosure, a triplet matrix material and a thermally activated delayed fluorescence (TADF) light-emitting material.

The triplet matrix materials, triplet emitters and TADF materials are described in more detail in WO2018113782A1.

One object of the present disclosure is to provide a material solution for evaporated-type OLEDs.

In certain embodiments, the transition metal complex according to the present disclosure has a molecular weight ≤1200 g/mol. In another embodiment, the molecular weight is ≤1100 g/mol. In a further embodiment, the molecular weight is ≤1000 g/mol. In a further embodiment, the molecular weight is ≤950 g/mol. In a particular embodiment, the molecular weight is ≤900 g/mol.

Another object of the present disclosure is to provide a material solution for printing OLEDs.

In certain embodiments, the transition metal complex according to the present disclosure has a molecular weight ≥800 g/mol. In another embodiment, the molecular weight is ≥900 g/mol. In a further embodiment, the molecular weight is ≥1000 g/mol. In a further embodiment, the molecular weight is ≥1100 g/mol. In a particular embodiment, the molecular weight is ≥1200 g/mol.

In other embodiments, a solubility of the transition metal complex according to the present disclosure in toluene at 25° C. is ≥2 mg/ml. In another embodiment, the solubility in toluene at 25° C. is ≥3 mg/ml. In a further embodiment, the solubility in toluene at 25° C. is ≥4 mg/ml. In a particular embodiment, the solubility in toluene at 25° C. is ≥5 mg/ml.

The present disclosure also relates to a formulation comprising at least one transition metal complex or polymer or mixture as described above, and at least one organic solvent. The at least one organic solvent is selected from the group consisting of aromatic, heteroaromatic, esters, aromatic ketones, aromatic ethers, aliphatic ketones, aliphatic ethers, alicyclic, olefin compounds, boric acid esters, phosphate compounds, or a mixture of two or more solvents.

In an embodiment, the formulation according to the present disclosure is characterized that the at least one organic solvent is selected from aromatic or heteroaromatic based solvents.

Examples of the aromatic or heteroaromatic based solvents suitable for the present disclosure include, but are not limited to: p-diisopropylbenzene, pentyl benzene, tetrahydronaphthalene, cyclohexylbenzene, chloronaphthalene, 1,4-dimethylnaphthalene 3-isopropylbiphenyl, p-methylisopropylbenzene, dipentylbenzene, tripentylbenzene, pentyltoluene, o-diethylbenzene, m-diethylbenzene, p-diethylbenzene, 1,2,3,4-tetramethylbenzene, 1,2,3,5-tetramethylbenzene, 1,2,4,5-tetramethylbenzene, butylbenzene, dodecylbenzene, dihexylbenzene, dibutylbenzene, p-diisopropylbenzene, cyclohexylbenzene, benzylbutylbenzene, dimethylnaphthalene, 3-isopropylbiphenyl, p-methylisopropylbenzene, 1-methylnaphthalene, 1,2,4-trichlorobenzene, 4,4-difluorodiphenylmethane, 1,2-dimethoxy-4-(1-propenyl)benzene, diphenylmethane, 2-phenylpyridine, 3-phenylpyridine, N-methyldiphenylamine, 4-isopropylbiphenyl, α, α-dichlorodiphenylmethane, 4-(3-phenylpropyl)pyridine, benzyl benzoate, 1,1-bis(3,4-dimethylphenyl)ethane, 2-isopropylnaphthalene, quinoline, isoquinoline, methyl 2-furancarboxylate, ethyl 2-furancarboxylate and the like.

Examples of the aromatic ketone based solvents suitable for the present disclosure include, but are not limited to: 1-tetralone, 2-tetralone, 2-(phenylepoxy)tetralone, 6-(methyloxy)tetralone, acetophenone, propiophenone, benzophenone, and derivatives thereof, such as 4-methylacetophenone, 3-methylacetophenone, 2-methylacetophenone, 4-methylpropiophenone, 3-methylpropiophenone, 2-methylpropiophenone, and the like.

Examples of the aromatic ether based solvents suitable for the present disclosure include, but are not limited to: 3-phenoxytoluene, butoxybenzene, p-anisaldehyde dimethyl acetal, tetrahydro-2-phenoxy-2H-pyran, 1,2-dimethoxy-4-(1-propenyl)benzene, 1,4-benzodioxane, 1,3-dipropylbenzene, 2,5-dimethoxytoluene, 4-ethylphenetole, 1,3-dipropoxybenzene, 1,2,4-trimethoxybenzene, 4-(1-propenyl)-1,2-dimethoxybenzene, 1,3-dimethoxybenzene, glycidyl phenyl ether, dibenzyl ether, 4-tert-butylanisole, trans-p-propenyl anisole, 1,2-dimethoxybenzene, 1-methoxynaphthalene, diphenyl ether, 2-phenoxymethyl ether, 2-phenoxytetrahydrofuran, and ethyl-2-naphthyl ether.

In some embodiments, according to the formulation of the present disclosure, the at least one organic solvent may be selected from the group consisting of aliphatic ketones, such as 2-nonanone, 3-nonanone, 5-nonanone, 2-decanone, 2,5-hexanedione, 2,6,8-trimethyl-4-nonanone, fenchone, phorone, isophorone, 6-undecanone, and the like; and aliphatic ethers, such as amyl ether, hexyl ether, dioctyl ether, ethylene glycol dibutyl ether, diethylene glycol diethyl ether, diethylene glycol butyl methyl ether, diethylene glycol dibutyl ether, triethylene glycol dimethyl ether, triethylene glycol ethyl methyl ether, triethylene glycol butyl methyl ether, tripropylene glycol dimethyl ether, tetraethylene glycol dimethyl ether, and the like.

In other embodiments, according to the formulation of the present disclosure, the at least one organic solvent may be selected from the ester based solvents: alkyl caprylate, alkyl sebacate, alkyl stearate, alkyl benzoate, alkyl phenylacetate, alkyl cinnamate, alkyl oxalate, alkyl maleate, alkyl lactone, alkyl oleate, and the like. In other embodiments, the at least one organic solvent may be selected from the group consisting of octyl octanoate, diethyl sebacate, diallyl phthalate, and isononyl isononanoate.

The solvent may be used alone or used as a mixture of two or more organic solvents.

In some embodiments, a formulation according to the present disclosure comprises at least one transition metal complex, polymer or mixture as described above and at least one organic solvent, and may further comprise another organic solvent. Examples of the another organic solvent include, but are not limited to, methanol, ethanol, 2-methoxyethanol, dichloromethane, trichloromethane, chlorobenzene, o-dichlorobenzene, tetrahydrofuran, anisole, morpholine, toluene, o-xylene, m-xylene, p-xylene, 1,4-dioxane, acetone, methyl ethyl ketone, 1,2-dichloroethane, 3-phenoxy toluene, 1,1,1-trichloroethane, 1,1,2,2-tetrachloroethane, ethyl acetate, butyl acetate, dimethylformamide, dimethylacetamide, dimethyl sulfoxide, tetrahydronaphthalene, decalin, indene, and/or mixtures thereof.

In some embodiments, the solvents particularly suitable for the present disclosure are solvents with Hansen solubility parameters in the following range:

$\delta_d$ (dispersion force) is in the range of 17.0~23.2 MPa$^{1/2}$, especially in the range of 18.5~21.0 MPa$^{1/2}$;

$\delta_p$ (polarity force) is in the range of 0.2~12.5 MPa$^{1/2}$, especially in the range of 2.0~6.0

$\delta_h$ (hydrogen bonding force) is in the range of 0.9~14.2 MPa$^{1/2}$, especially in the range of 2.0~6.0 MPa$^{1/2}$.

According to the formulation of the present disclosure, the boiling point parameter must be taken into account when selecting the organic solvent. In the present disclosure, the organic solvent has a boiling point ≥150° C. In another embodiment, the organic solvent has a boiling point ≥180° C. In a further embodiment, the organic solvent has a boiling point ≥200° C. In a further embodiment, the organic solvent has a boiling point ≥250° C. In a particular embodiment, the organic solvent has a boiling point ≥275° C. or ≥300° C. Boiling points in these ranges are beneficial for preventing the clogging of the nozzle of the inkjet printing head. The organic solvent can be evaporated from the solvent groups to form a film comprising the functional material.

In an embodiment, the formulation according to the disclosure is a solution.

In another embodiment, the formulation according to the disclosure is a suspension.

The formulation in an embodiment of the present disclosure may include 0.01 wt % to 10 wt % of the transition metal complex or the polymer or the mixture according to the present disclosure. In another embodiment, the formulation may include 0.1 wt % to 15 wt % of the transition metal complex or the polymer or the mixture according to the present disclosure. In a further embodiment, the formulation may include 0.2 wt % to 5 wt % of the transition metal complex or the polymer or the mixture according to the present disclosure. In a particular embodiment, the formulation may include 0.25 wt % to 3 wt % of the transition metal complex or the polymer or the mixture according to the present disclosure.

The present disclosure further relates to a use of the formulation as a coating or printing ink in the preparation of organic electronic devices, specially by the preparation method of printing or coating.

The appropriate printing technology or coating technology includes, but is not limited to, inkjet printing, nozzle printing, typography, screen printing, dip coating, spin coating, blade coating, roller printing, twist roller printing, lithography, flexography, rotary printing, spray coating, brush coating, transfer printing, or slot die coating, and the like. The first preference is gravure printing, nozzle printing and inkjet printing. The solution or the suspension may additionally comprise one or more components, such as a surface-active compound, a lubricant, a wetting agent, a dispersant, a hydrophobic agent, a binder, etc., for adjusting viscosity and film-forming property, and enhancing adhesion property, and the like.

The present disclosure further provides an application of the transition metal complex, the polymer, the mixture or the formulation as described above in organic electronic devices. The organic electronic devices may be selected from, but are not limited to, organic light-emitting diode (OLED), organic photovoltaic cell (OPV), organic light-emitting electrochemical cell (OLEEC), organic field effect transistor (OFET), organic light-emitting field effect transistor, organic laser, organic spintronic device, organic sensor, and organic plasmon emitting diode, and the like, specially OLED. In an embodiment of the present disclosure, the organometallic complex is further used in the light-emitting layer of the OLED device.

The present disclosure further relates to an organic electronic device comprising at least one functional layer, and the functional layer comprising at least the transition complex, the polymer or the mixture as described above or being prepared from the above-mentioned formulation. The organic electronic devices may be selected from, but are not limited to, organic light-emitting diode (OLED), organic photovoltaic cell (OPV), organic light-emitting electrochemical cell (OLEEC), organic field effect transistor (OFET), organic light-emitting field effect transistor, organic laser, organic spintronic device, organic sensor, and organic plasmon emitting diode, and the like, specially organic electroluminescent device, such as OLED, OLEEC and organic light-emitting field effect transistor.

In some embodiments, the functional layer of the electroluminescent device is a light-emitting layer.

In the above light-emitting device, particularly in the OLED, a substrate, an anode, at least one light-emitting layer and a cathode are included.

The substrate may be opaque or transparent. A transparent substrate may be used to fabricate a transparent light-emitting device. See, for example, Bulovic et al. Nature 1996, 380, p 29 and Gu et al. Appl. Phys. Lett. 1996, 68, p 2606. The substrate may be rigid or elastic. The substrate can be plastic, metal, semiconductor wafer or glass. Particularly, the substrate has a smooth surface. The substrate without any surface defects is a particular desirable choice. In an embodiment, the substrate is flexible and may be selected from polymer film or plastic, and has a glass transition temperature Tg of greater than 150° C. In another embodiment, Tg is greater than 200° C. In a further embodiment, Tg is greater than 250° C. In a particular embodiment, Tg is greater than 300° C. Suitable examples of the flexible substrate include polyethylene terephthalate (PET) and polyethylene 2,6-naphthalate (PEN).

The anode may include a conductive metal, a metallic oxide, or a conductive polymer. The anode can inject holes easily into the hole injection layer (HIL), or the hole transport layer (HTL), or the light-emitting layer. In an embodiment, the absolute value of the difference between the work function of the anode and the HOMO energy level or the valence band energy level of the emitter in the light-emitting layer or of the p-type semiconductor material as the HIL or HTL or the electron blocking layer (EBL) is less than 0.5 eV. In another embodiment, the absolute value is less than 0.3 eV. In a particular embodiment, the absolute value is less than 0.2 eV. Examples of the anode material include, but are not limited to, Al, Cu, Au, Ag, Mg, Fe, Co, Ni, Mn, Pd, Pt, ITO, aluminum-doped zinc oxide (AZO), and the like. Other suitable anode materials are known and may be easily selected by one of ordinary skilled in the art. The anode material may be deposited with any suitable technology, such as the suitable physical vapor deposition method which includes radio frequency magnetron sputtering, vacuum thermal evaporation, e-beam, and the like. In some embodiments, the anode is patterned and structured. Patterned ITO conductive substrates are commercially available and can be used to prepare the organic electronic device according to the present disclosure.

The cathode may include a conductive metal or metal oxide. The cathode can inject electrons easily into the EIL or ETL, or directly into the light-emitting layer. In an embodiment, the absolute value of the difference between the work function of the cathode and the LUMO energy level or the valence band energy level of the emitter in the light-emitting layer or of the n-type semiconductor material as the electron injection layer (EIL) or the electron transport layer (ETL) or the hole blocking layer (HBL) is less than 0.5 eV. In another embodiment, the absolute value is less than 0.3 eV. In a particular embodiment, the absolute value is less than 0.2 eV. In principle, all materials that can be used as the cathode of the OLED may be used as the cathode materials of the devices of the present disclosure. Examples of the cathode material include, but are not limited to, Al, Au, Ag, Ca, Ba, Mg, LiF/Al, MgAg alloy, $BaF_2$/Al, Cu, Fe, Co, Ni, Mn, Pd, Pt, ITO, and the like. The cathode material may be deposited with any suitable technology, such as the suitable physical vapor deposition method which includes radio frequency magnetron sputtering, vacuum thermal evaporation, electron beam, and the like.

The OLED may also comprise other functional layers such as hole injection layer (HIL), hole transport layer (HTL), electron blocking layer (EBL), electron injection layer (EIL), electron transport layer (ETL), and hole blocking layer (HBL). Materials suitable for use in such functional layers have been described in detail above and in WO2010135519A1, US20090134784A1 and WO2011110277A1, the entire contents of which are hereby incorporated herein by reference.

The light-emitting device according to the present disclosure has a light-emitting wavelength between 300 nm and 1000 nm. In another embodiment, the light-emitting wavelength is between 350 nm and 900 nm. In a further embodiment, the light-emitting wavelength is between 400 nm and 800 nm.

The present disclosure also relates to the application of the electroluminescent device according to the present disclosure in various electronic equipments, which includes, but are not limited to, display equipment, lighting equipment, light source, sensor, and the like.

The present disclosure will be described below with reference to the embodiments, but the present disclosure is not limited to the following embodiments. It should be understood that the appended claims summarized the scope of the present disclosure. Those skilled in the art should realize that certain modifications to the embodiments of the present disclosure that are made under the guidance of the concept of the present disclosure will be covered by the spirit and scope of the claims of the present disclosure.

DETAILED EXAMPLES

1. Transition Metal Organic Complex and its Energy Structure (Ir-001)

(Ir-002)

(Ir-025)

(Ir-049)
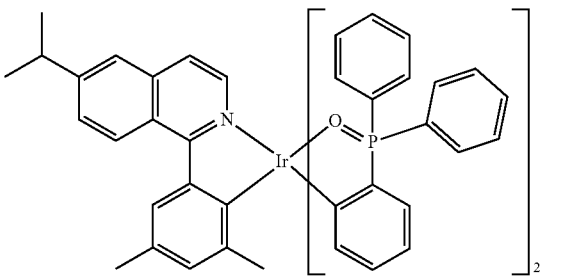

(Ir-052)
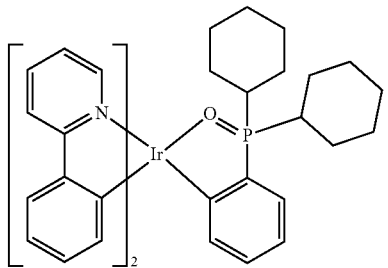

(Ir-103)
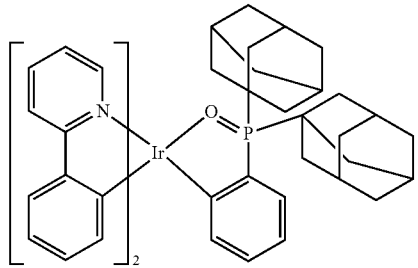

(Ir-138)
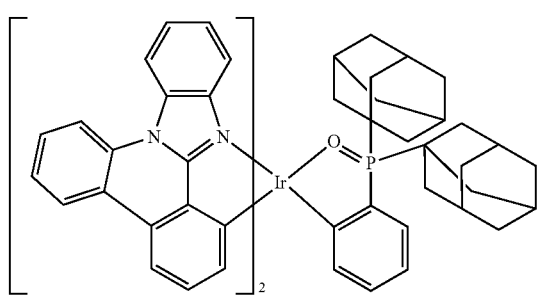

(Ir-154)
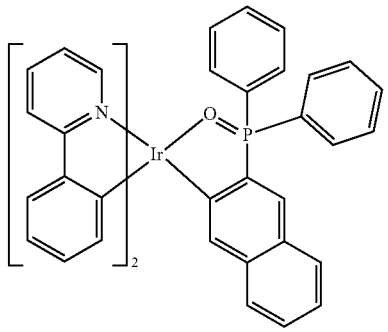

-continued (Ir-180)

(Ir-195)

(Ir-224)

Ir(ppy)₃

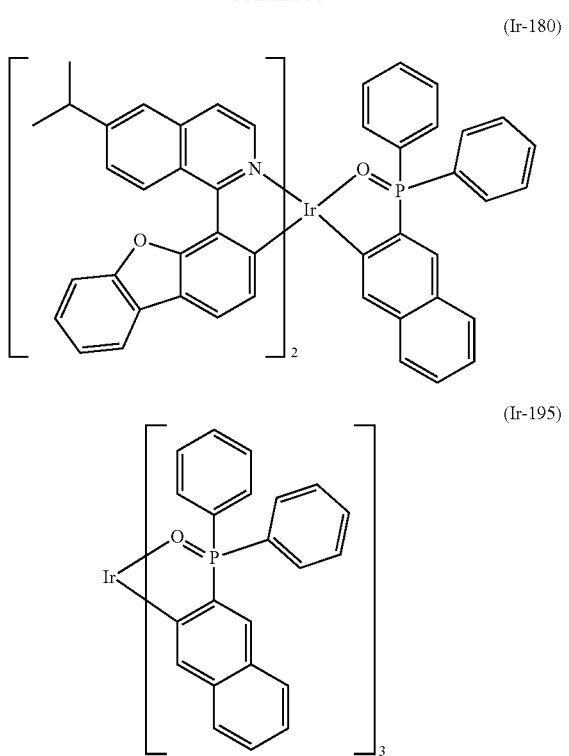

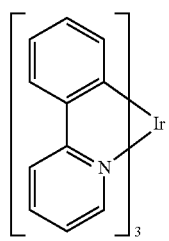

-continued

Ir(acac)(pq)₂

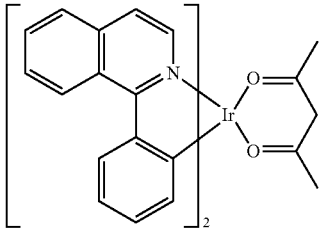

The energy levels of the metal organic complexes can be obtained by quantum calculations, for example, by using TD-DFT (Time Dependent-Density Functional Theory) through Gaussian03W (Gaussian Inc.), and the specific simulation methods can be found in WO2011141110. Firstly, the molecular geometry is optimized by semi-empirical method "Ground State/Hartree-Fock/Default Spin/LanL2 MB" (Charge 0/Spin Singlet), and then the energy structure of organic molecules is calculated by TD-DFT (Time Dependent-Density Functional Theory) method "TD-SCF/DFT/Default Spin/B3PW91/gen geom=connectivity pseudo=lan12" (Charge 0/Spin Singlet). The HOMO and LUMO energy levels are calculated according to the following calibration formulas, S1 and T1 are used directly.

$$HOMO(eV)=((HOMO(Gaussian)\times 27.212)-0.9899)/1.1206$$

$$LUMO(eV)=((LUMO(Gaussian)\times 27.212)-2.0041)/1.385$$

wherein, HOMO(G) and LUMO(G) in the unit of Hartree are the direct calculation results of Gaussian 03W. The results are shown in Table 1:

TABLE 1

| Materials | HOMO [eV] | LUMO [eV] | T1 [eV] | S1 [eV] | $\Delta E_{S-T}$ |
|---|---|---|---|---|---|
| (Ir-001) | −5.03 | −2.32 | 2.62 | 2.78 | 0.16 |
| (Ir-002) | −5.11 | −2.38 | 2.51 | 2.78 | 0.27 |
| (Ir-025) | −4.80 | −2.53 | 1.95 | 2.18 | 0.23 |
| (Ir-049) | −4.68 | −2.27 | 2.23 | 2.41 | 0.18 |
| (Ir-052) | −5.06 | −2.26 | 2.64 | 2.82 | 0.18 |
| (Ir-103) | −5.08 | −2.24 | 2.67 | 2.85 | 0.18 |
| (Ir-138) | −5.03 | −2.20 | 2.70 | 2.90 | 0.20 |
| (Ir-154) | −5.01 | −2.37 | 2.63 | 2.78 | 0.15 |
| (Ir-180) | −5.01 | −2.59 | 2.16 | 2.37 | 0.21 |
| (Ir-195) | −4.63 | −2.25 | 2.16 | 2.39 | 0.22 |
| (Ir-224) | −4.96 | −2.35 | 2.08 | 2.30 | 0.22 |
| Ir(ppy)₃ | −5.30 | −2.35 | 2.70 | 2.93 | 0.23 |
| Ir(acac)(pq)₂ | −5.08 | −2.66 | 2.15 | 2.36 | 0.21 |

2. Synthesis of the Transition Metal Organic Complexes

Synthesis Example 1: Synthesis of Complex (Ir-001)

Synthesis of Intermediate (Ir-001-a)

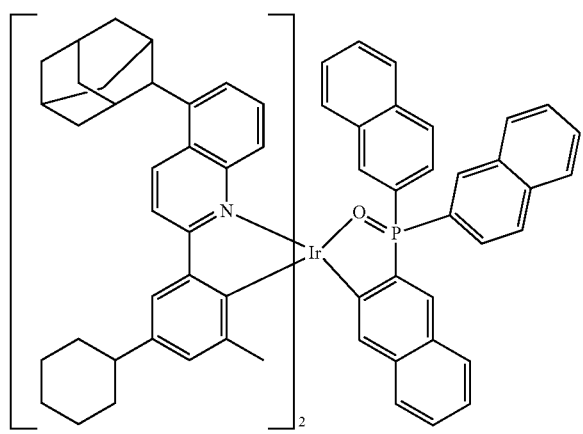

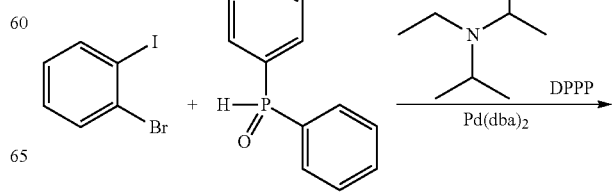

-continued

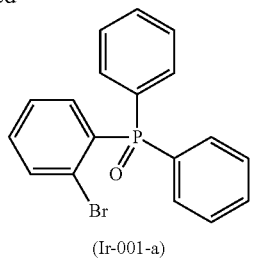

(Ir-001-a)

Diphenylphosphine oxide (68.6 g, 1 eq), bis(dibenzylideneacetone) palladium (Pd(dba)₂) (6.83 g, 0.035 eq), and 1,3-bis(diphenyphosphino)propane (DPPP) (4.90 g, 0.035 eq) were placed into a dry two-necked flask, the flask was vacuumed and filled with nitrogen for three cycles, and then the mixture was dissolved in 500 mL toluene. Then o-bromoiodobenzene (95.99 g, 1 eq) and N,N-diisopropylethylamine (65.78 g, 1.5 eq) were added by syringe injection until the reaction started. The mixture reacted under stirring at 120° C. for 96 hours, then cooled to room temperature. After the reaction was completed, the solvent was dried by rotary evaporation, and then the mixture was washed with dichloromethane and water. An organic layer was taken and dried with magnesium sulfate, and was dried by rotary evaporation, followed by the column chromatography to obtain a solid intermediate (Ir-001-a) with a yield of 79%.

Synthesis of Intermediate (Ir-001-b)

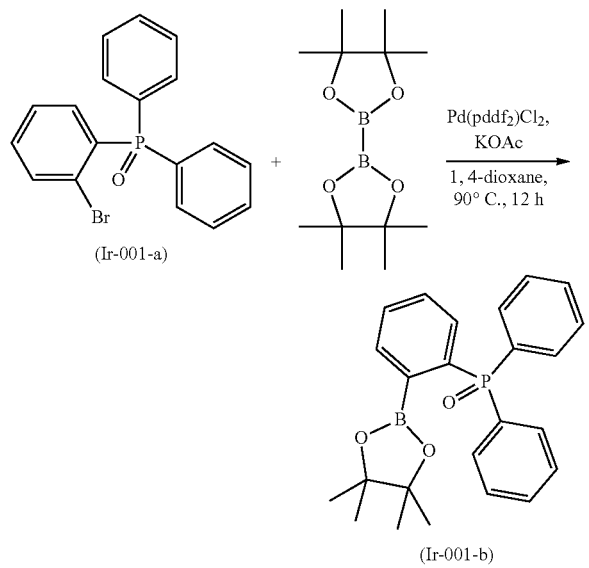

Bis(pinacolato)diborane (24.15 g, 1.5 eq), Intermediate (Ir-001-a) (22.65 g, 1 eq), Pd(dppf)₂Cl₂ (2.3 g, 0.05 eq), and potassium acetate (24 g, 4 eq) were placed into a dry two-neck flask, then 1000 mL of a mixed solution of dioxane and water in a ratio of 3:1 was added. The mixture reacted under stirring at 90° C. for 12 hours, then cooled to room temperature. After the reaction was completed, the solvent was dried by rotary evaporation, and then the mixture was washed with dichloromethane and water. An organic layer was taken and dried with magnesium sulfate, and was dried by rotary evaporation, followed by the column chromatography to obtain a solid intermediate (Ir-001-b) with a yield of 90%.

Synthesis of Intermediate (Ir-001-c)

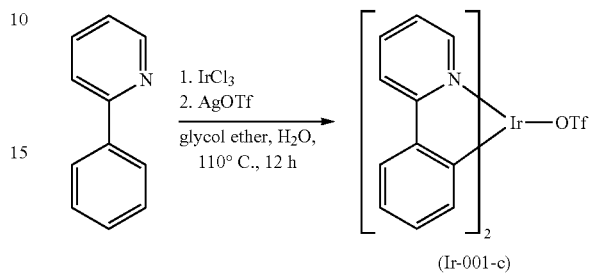

2-Phenylpyridine (8.1 g, 3 eq) was placed into a single-neck flask, iridium trichloride (5.2 g, 1 eq) was added, and a mixed solution of 300 mL ethylene glycol ethyl ether and 100 mL water was added. The mixture was heated to 110° C., and reacted for 12 hours, then cooled to room temperature, poured into sodium chloride aqueous solution, and a yellow substance was filtered. After dried, the solid was dissolved in a mixed solution of 300 mL dichloromethane and 100 mL methanol, and then silver trifluoromethanesulfonate (13.42 g, 3 eq) was added, and allowed to react for 12 hours, followed by the filtration and was dried to obtain a yellow solid intermediate (Ir-001-c) with a yield of 84%.

Synthesis of Complex (Ir-001)

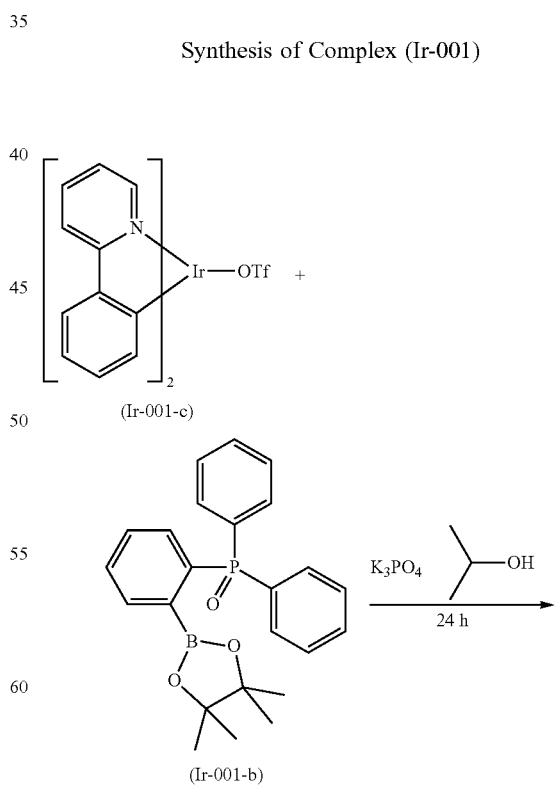

103

-continued

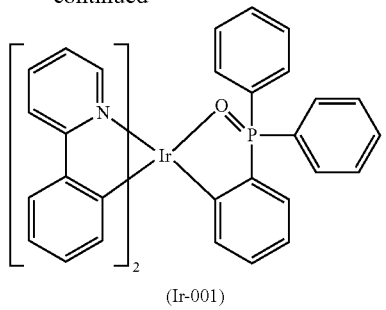

(Ir-001)

Intermediate (Ir-001-c) (0.5 g, 1 eq) and Intermediate (Ir-001-b) (1.47 g, 5 eq) were placed into a single-neck flask, and 20 mL of 2-isopropanol was added. After filling with nitrogen, tripotassium phosphate (0.82 g, 5 eq) was added. The reaction was carried out at room temperature for 24 hours. The reaction was filtered with celite, washed with methanol and was dried, and then purified with column chromatography, rotary evaporation to remove solvent and then was recrystallized to obtain a yellow solid complex (Ir-001) with a yield of 54%.

Synthesis Example 2: Synthesis of Complex (Ir-002)

Synthesis of Intermediate (Ir-002-a)

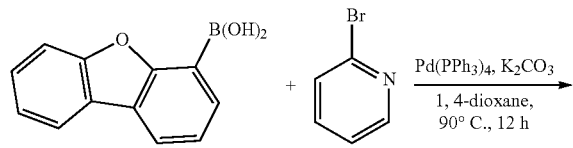

(Ir-002-a)

2-bromopyridine (5.19 g, 1.2 eq), 4-dibenzofuran boronic acid (5.73 g, 1 eq), Pd(PPh$_3$)$_4$ (1.56 g, 0.05 eq), and potassium carbonate (14.93 g, 4 eq) were placed into a dry two-neck flask, then 250 mL of a mixed solution of dioxane and water in a ratio of 3:1 was added. The mixture reacted under stirring at 90° C. for 12 hours, then cooled to room temperature. After the reaction was completed, the solvent was dried by rotary evaporation, and then the mixture was washed with dichloromethane and water. An organic layer was taken and dried with magnesium sulfate, and was dried by rotary evaporation, followed by the column chromatography to obtain a solid intermediate (Ir-002-a) with a yield of 86%.

104

Synthesis of Intermediate (Ir-002-b)

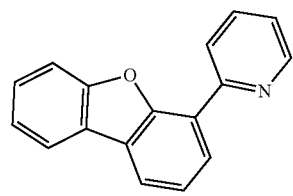

(Ir-002-a)

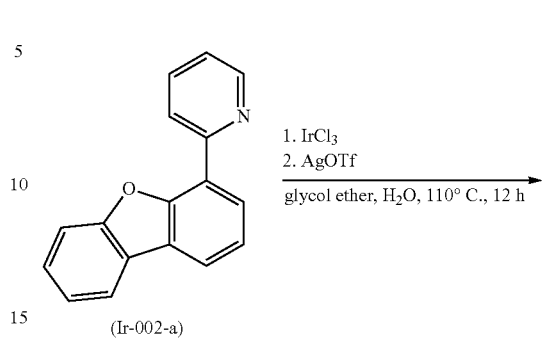

(Ir-002-b)

Intermediate (Ir-002-a) (12.82 g, 3 eq) was placed into a single-neck flask, iridium trichloride (5.2 g, 1 eq) was added, and a mixed solution of 300 mL ethylene glycol ethyl ether and 100 mL water was added. The mixture was heated to 110° C., and reacted for 12 hours, then cooled to room temperature, poured into saturated sodium chloride aqueous solution, and a yellow substance was filtered. After dried, the solid was dissolved in a mixed solution of 300 mL dichloromethane and 100 mL methanol, and then silver trifluoromethanesulfonate (13.42 g, 3 eq) was added, reacted for 12 hours, followed by filtration, and dried to obtain a yellow solid intermediate (Ir-002-b) with a yield of 77%.

Synthesis of Complex (Ir-002)

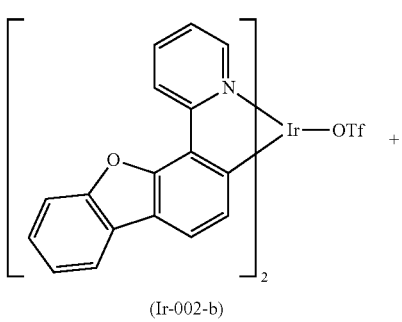

(Ir-002-b)

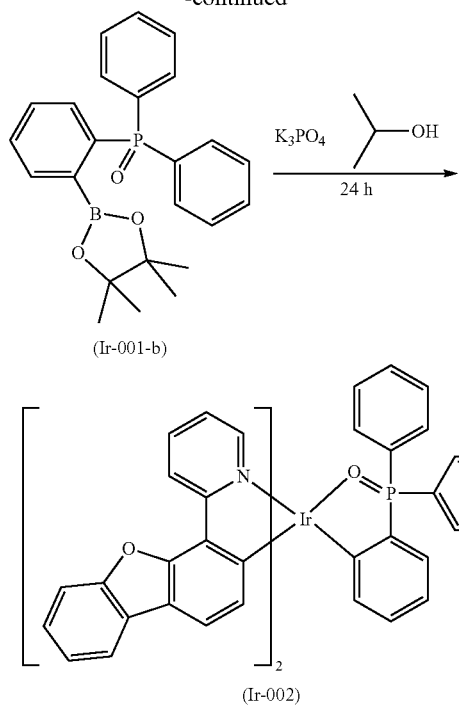

Intermediate (Ir-002-b) (0.5 g, 1 eq) and Intermediate (Ir-001-b) (1.22 g, 5 eq) were placed into a single-neck flask, and 20 mL of 2-isopropanol was added. After blowing nitrogen, potassium phosphate (0.64 g, 5 eq) was added. The reaction was carried out at room temperature for 24 hours. The reaction was filtered with celite, washed with methanol and was dried, and then purified with column chromatography, rotary evaporation to remove solvent and then was recrystallized to obtain a yellow solid complex (Ir-002) with a yield of 67%.

Synthesis Example 3: Synthesis of Complex (Ir-025)

Synthesis of Intermediate (Ir-025-a)

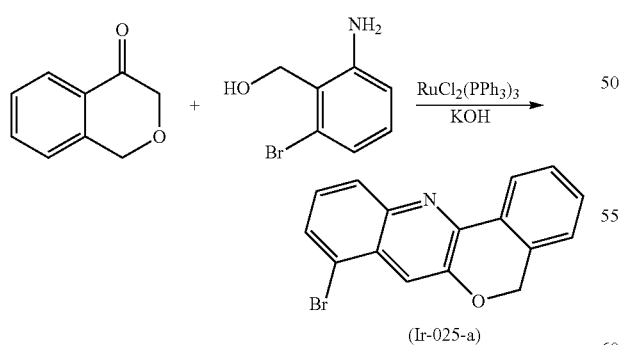

Isochroman-4-one (16.13 g, 1.1 eq), 2-bromo-6-aminobenzyl methoanol (20 g, 1 eq), RuCl$_2$(pph$_3$)$_3$ (0.95 g, 0.01 eq), potassium hydroxide (11.1 g, 2 eq) were placed into a dry 500 mL two-necked flask. The flask was vacuumed and filled with nitrogen for three cycles. Then 300 mL anhydrous toluene was added, and then the reaction was carried out at 120° C. for 24 hours with stirring. The solvent was then removed by rotary evaporation, then dichloromethane was added for extraction. The organic layer was collected and then purified with a column chromatography to obtain a white solid intermediate (Ir-025-a) with a yield of 88%.

Synthesis of Intermediate (Ir-025-b)

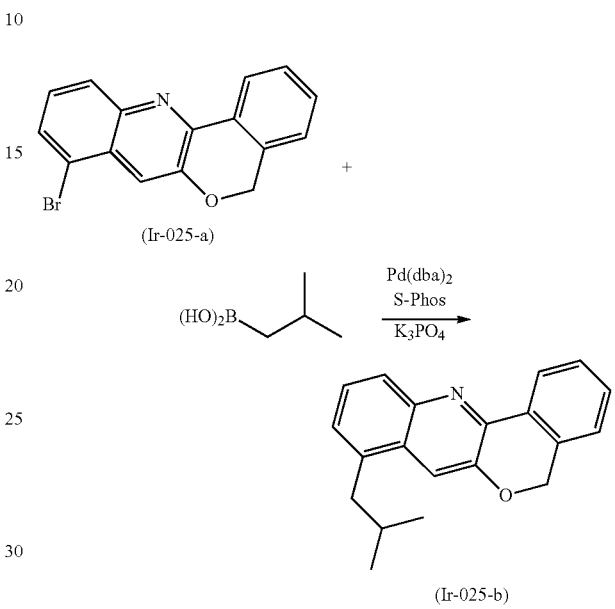

Intermediate (Ir-025-a) (15 g, 1 eq), isobutyl boric acid (7.35 g, 1.5 eq), bis(dibenzylideneacetone)palladium (Pd(dba)$_2$) (1.38 g, 0.05 eq), 2-dicyclohexylphosphino-2',6'-dimethoxybiphenyl (S-Phos) (1.18 g, 0.06 eq), and K$_3$PO$_4$ (40.80 g, 2 eq) were placed into a dry 500 mL two-necked flask. The flask was vacuumed and filled with nitrogen for three cycles. Then 250 mL anhydrous toluene was added, and then the reaction was carried out at 120° C. for 24 hours with stirring. After that, the reaction solvent was removed by rotary evaporation, dichloromethane was added for extraction. The organic layer was collected and then purified with column chromatography to obtain a white solid intermediate (Ir-025-b) with a yield of 54%.

Synthesis of Intermediate (Ir-025-c)

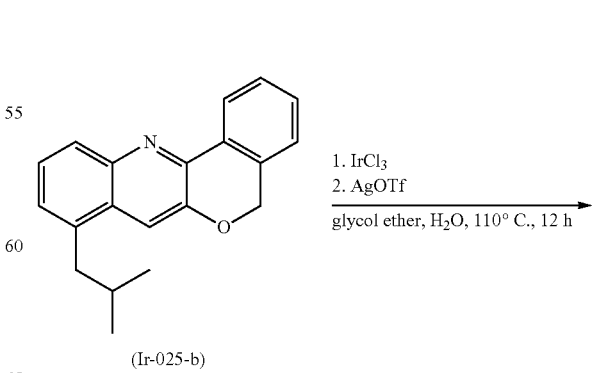

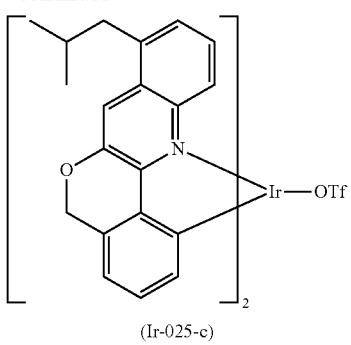

(Ir-025-c)

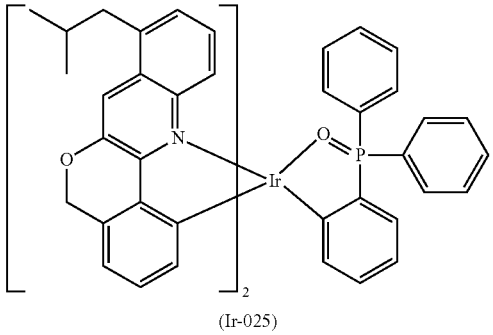

(Ir-025)

Intermediate (Ir-025-b) (15.12 g, 3 eq) was placed into a single-neck flask, iridium trichloride (5.2 g, 1 eq) was added, and a mixed solution of 300 mL ethylene glycol ethyl ether and 100 mL water was added. The mixture was heated to 110° C., and reacted for 12 hours, then cooled to room temperature, poured into saturated sodium chloride aqueous solution, and a yellow substance was filtered. After dried, the solid was dissolved in a mixed solution of 300 mL dichloromethane and 100 mL methanol, and then silver trifluoromethanesulfonate (13.42 g, 3 eq) was added, reacted for 12 hours, followed by filtration, and dried to obtain a yellow solid intermediate (Ir-025-c) with a yield of 70%.

Synthesis of Complex (Ir-025)

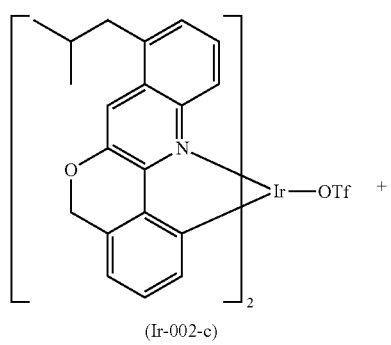

(Ir-002-c)

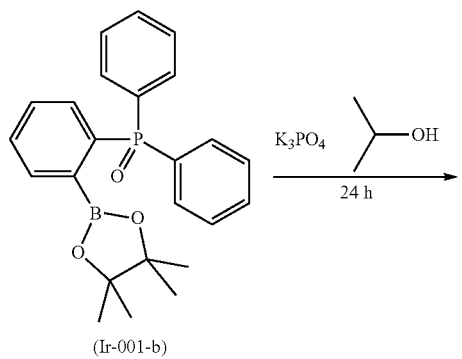

(Ir-001-b)

Intermediate (Ir-025-c) (0.5 g, 1 eq) and Intermediate (Ir-001-b) (1.1 g, 5 eq) were placed into a single-neck flask, and 20 mL of 2-isopropanol was added. After blowing nitrogen, tripotassium phosphate (0.58 g, 5 eq) was added. The reaction was carried out at room temperature for 24 hours. The reaction was filtered with celite, washed with methanol and was dried, and then purified with column chromatography, rotary evaporation to remove solvent and then was recrystallized to obtain a red solid complex (Ir-025) with a yield of 43%.

Synthesis Example 4: Synthesis of Complex (Ir-049)

Synthesis of Intermediate (Ir-049-a)

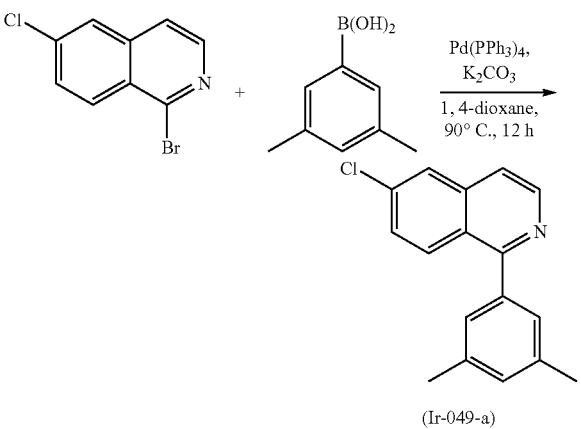

(Ir-049-a)

1-bromo-6-chloroisoquinoline (30 g, 1 eq), 3,5-dimethylphenylboronic acid (18.55 g, 1 eq), Pd(PPh$_3$)$_4$ (7.15 g, 0.05 eq), and potassium carbonate (68.39 g, 4 eq) were placed into a dry two-neck flask, then 500 mL of a mixed solution of dioxane and water in a ratio of 3:1 was added. The mixture reacted under stirring at 90° C. for 12 hours, then cooled to room temperature. After the reaction was completed, the solvent was dried by rotary evaporation, and then the mixture was washed with dichloromethane and water. An organic layer was taken and dried with magnesium sulfate, and was dried by rotary evaporation, followed by the column chromatography to obtain a solid intermediate (Ir-049-a) with a yield of 73%.

Synthesis of Intermediate (Ir-049-b)

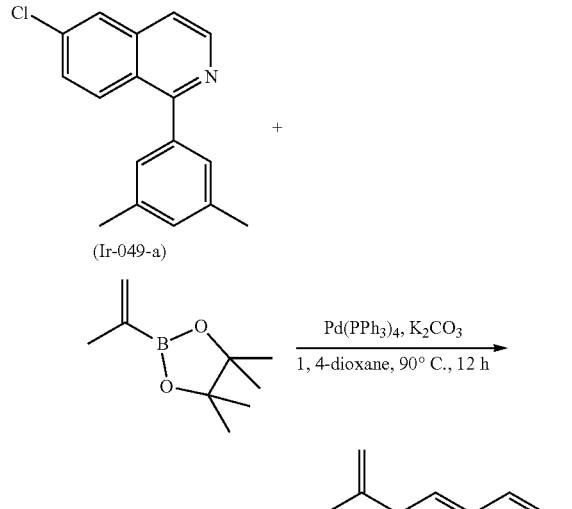

Intermediate (Ir-049-a) (15 g, 1 eq), isopropenylboronic acid pinacol ester (16.00 g, 1.7 eq), Pd(PPh$_3$)$_4$ (3.23 g, 0.05 eq), and potassium carbonate (30.97 g, 4 eq) were placed into a dry two-neck flask, then 500 mL of a mixed solution of dioxane and water in a ratio of 3:1 was added. The mixture reacted under stirring at 90° C. for 12 hours, then cooled to room temperature. After the reaction was completed, the solvent was dried by rotary evaporation, and then the mixture was washed with dichloromethane and water. An organic layer was taken and dried with magnesium sulfate, and was dried by rotary evaporation, followed by the column chromatography to obtain a solid intermediate (Ir-049-b) with a yield of 91%.

Synthesis of Intermediate (Ir-049-c)

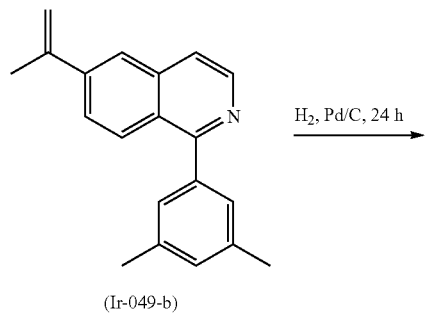

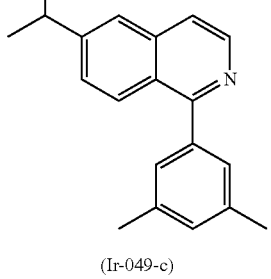

Intermediate (Ir-049-b) (15 g, 1 eq) and dry palladium-carbon (1 g) were placed into a dry two-necked flask, then 100 mL tetrahydrofuran was added, and hydrogen was continuously introduced into the reaction solution. The reaction was carried out for 24 hours under stirring at room temperature. After the reaction was completed, the reaction solvent was removed by rotary evaporation, followed by purification with a column chromatography to obtain a solid intermediate (Ir-049-c) with a yield of 98%.

Synthesis of Intermediate (Ir-049-d)

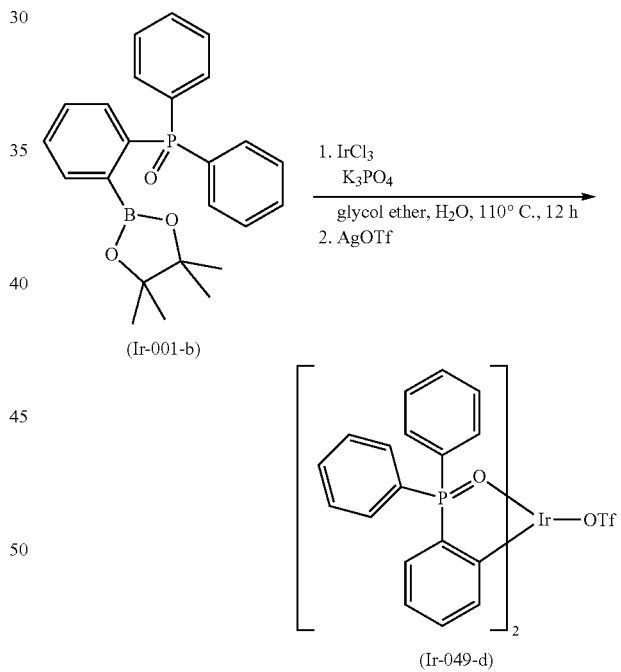

Intermediate (Ir-001-b) (21.12 g, 3 eq) and tripotassium phosphate (18.48 g, 5 eq) were placed into a single-neck flask, iridium trichloride (5.2 g, 1 eq) was added, and a mixed solution of 300 mL ethylene glycol ethyl ether and 100 mL water was added. The mixture was heated to 110° C., and reacted for 12 hours, then cooled to room temperature, poured into saturated sodium chloride aqueous solution, and a yellow substance was filtered. After dried, the solid was dissolved in a mixed solution of 300 mL dichloromethane and 100 mL methanol, and then silver trifluoromethane-sulfonate (13.42 g, 3 eq) was added, reacted for 12 hours, followed by filtration, and dried to obtain a yellow solid intermediate (Ir-049-d) with a yield of 28%.

Synthesis of Complex (Ir-049)

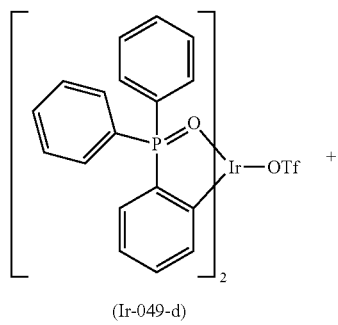

(Ir-049-d)

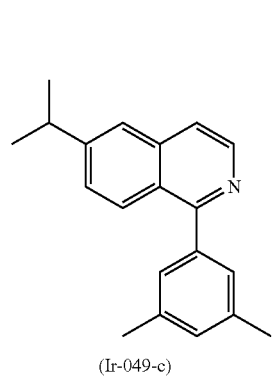

(Ir-049-c)

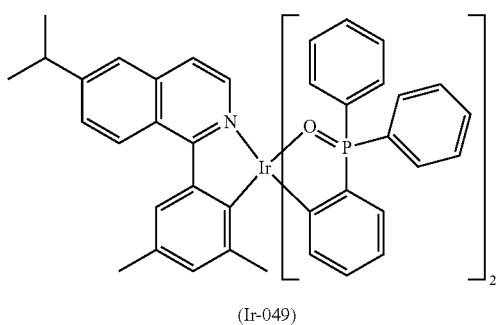

(Ir-049)

Intermediate (Ir-049-d) (0.5 g, 1 eq) and Intermediate (Ir-049-c) (0.23 g, 1.5 eq) were added into a single-neck flask, 50 mL of tetrahydrofuran was added. After blowing nitrogen, sodium carbonate (0.30 g, 5 eq) was added. The reaction was carried out at room temperature for 24 hours. After that the reaction was filtered with celite, and washed with methanol, dried, and then purified with column chromatography and recrystallized to obtain a red solid complex (Ir-049) with a yield of 62%.

Synthesis Example 5: Synthesis of Complex (Ir-052)

Synthesis of Intermediate (Ir-052-a)

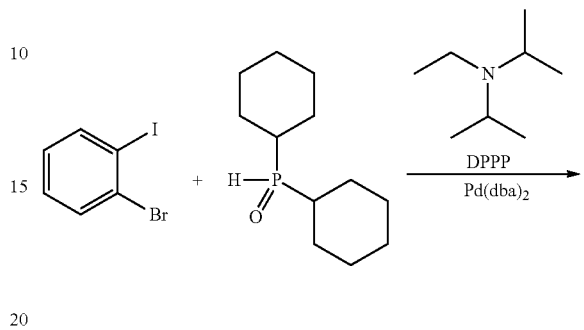

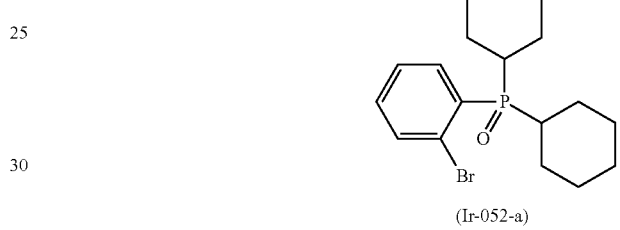

(Ir-052-a)

Dicyclohexyl phosphine oxide (72.71 g, 1 eq), bis(dibenzylideneacetone) palladium (Pd(dba)$_2$) (6.83 g, 0.035 eq), and 1,3-bis(diphenyphosphino)propane (DPPP) (4.90 g, 0.035 eq) were added into a dry two-necked flask, the flask was vacuumed and filled with nitrogen for three cycles, and then the mixture was dissolved in 500 mL toluene. Then o-bromoiodobenzene (95.99 g, 1 eq) and N,N-diisopropylethylamine (65.78 g, 1.5 eq) were added by syringe injection until the reaction started. The mixture reacted under stirring at 120° C. for 96 hours, then cooled to room temperature. After the reaction was completed, the solvent was dried by rotary evaporation, and then the mixture was washed with dichloromethane and water. An organic layer was taken and dried with magnesium sulfate, and was dried by rotary evaporation, followed by the column chromatography to obtain a solid intermediate (Ir-052-a) with a yield of 59%.

Synthesis of Intermediate (Ir-052-b)

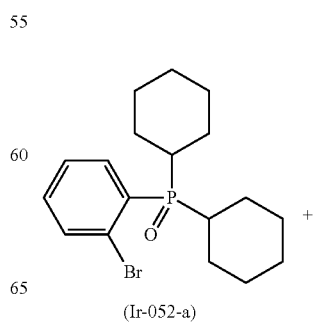

(Ir-052-a)

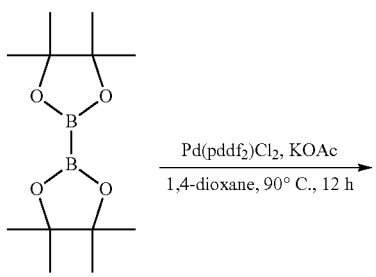

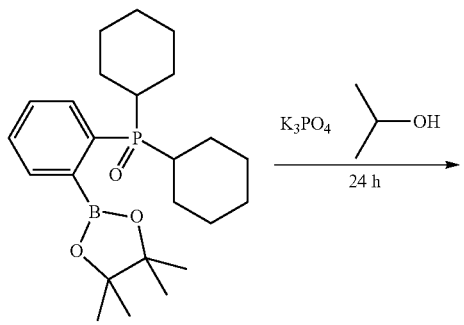

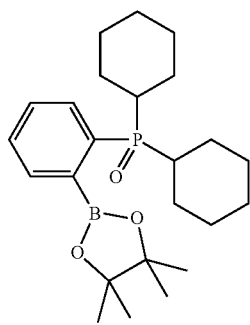

Bis(pinacolato)diborane (24.15 g, 1.5 eq), Intermediate (Ir-052-a) (23.42 g, 1 eq), Pd(dppf)$_2$Cl$_2$ (2.3 g, 0.05 eq), and potassium acetate (24 g, 4 eq) were added into a dry two-neck flask, then 1000 mL of a mixed solution of dioxane and water in a ratio of 3:1 was added. The mixture reacted under stirring at 90° C. for 12 hours, then cooled to room temperature. After the reaction was completed, the solvent was dried by rotary evaporation, and then the mixture was washed with dichloromethane and water. An organic layer was taken and dried with magnesium sulfate, and was dried by rotary evaporation, followed by the column chromatography to obtain a solid intermediate (Ir-052-b) with a yield of 78%.

Synthesis of Complex (Ir-052)

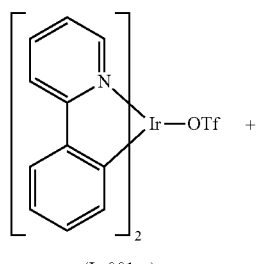

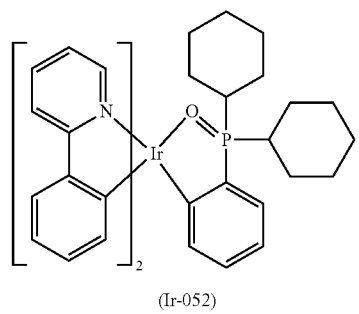

Intermediate (Ir-001-c) (0.5 g, 1 eq) and Intermediate (Ir-052-b) (1.52 g, 5 eq) were placed into a single-neck flask, 20 mL of 2-isopropanol was added. After blowing nitrogen, tripotassium phosphate (0.82 g, 5 eq) was added. The reaction was carried out at room temperature for 24 hours. The reaction was filtered with celite, washed with methanol and was dried, and then purified with column chromatography, rotary evaporation to remove solvent and then was recrystallized to obtain a yellow solid complex (Ir-052) with a yield of 41%.

Synthesis Example 6: Synthesis of Complex (Ir-103)

Synthesis of Intermediate (Ir-103-a)

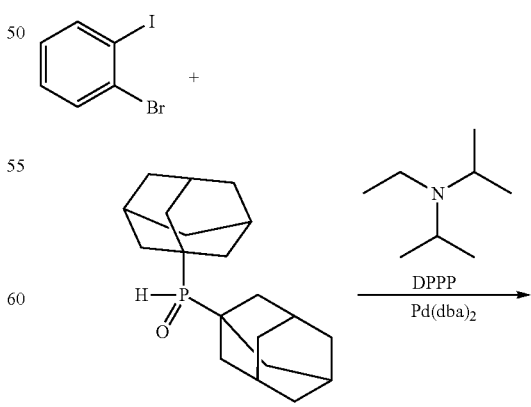

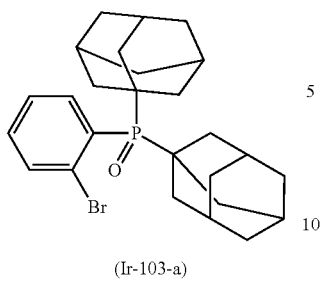

(Ir-103-a)

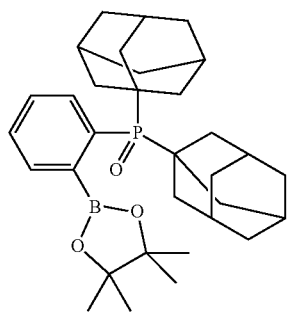

(Ir-103-b)

Dicyclohexyl phosphine oxide (108.05 g, 1 eq), bis(dibenzylideneacetone) palladium (Pd(dba)$_2$) (6.83 g, 0.035 eq), and 1,3-bis(diphenyphosphino)propane (DPPP) (4.90 g, 0.035 eq) were added into a dry two-necked flask, the flask was vacuumed and filled with nitrogen for three cycles, and then the mixture was dissolved in 500 mL toluene. Then o-bromoiodobenzene (95.99 g, 1 eq) and N,N-diisopropylethylamine (65.78 g, 1.5 eq) were added by syringe injection until the reaction started. The mixture reacted under stirring at 120° C. for 96 hours, then cooled to room temperature. After the reaction was completed, the solvent was dried by rotary evaporation, and then the mixture was washed with dichloromethane and water. An organic layer was taken and dried with magnesium sulfate, and was dried by rotary evaporation, followed by the column chromatography to obtain a solid intermediate (Ir-103-a) with a yield of 59%.

Synthesis of Intermediate (Ir-103-b)

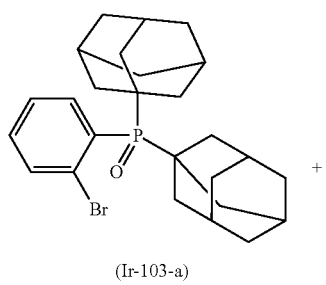

Bis(pinacolato)diborane (24.15 g, 1.5 eq), intermediate (Ir-103-a) (30.03 g, 1 eq), Pd(dppf)$_2$Cl$_2$ (2.3 g, 0.05 eq), and potassium acetate (24 g, 4 eq) were added into a dry two-neck flask, then 1000 mL of a mixed solution of dioxane and water in a ratio of 3:1 was added. The mixture reacted under stirring at 90° C. for 12 hours, then cooled to room temperature. After the reaction was completed, the solvent was dried by rotary evaporation, and then the mixture was washed with dichloromethane and water. An organic layer was taken and dried with magnesium sulfate, and was dried by rotary evaporation, followed by the column chromatography to obtain a solid intermediate (Ir-103-b) with a yield of 46%.

Synthesis of Complex (Ir-103)

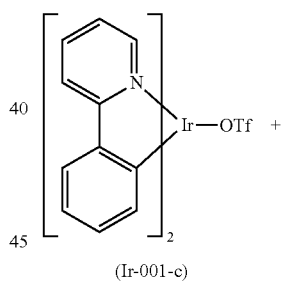

(Ir-001-c)

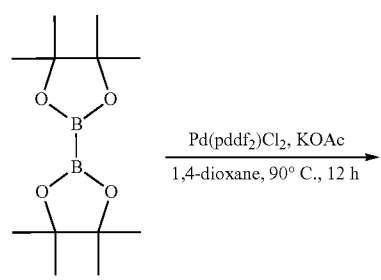

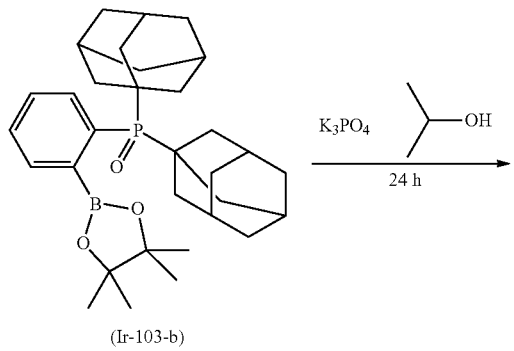

(Ir-103-b)

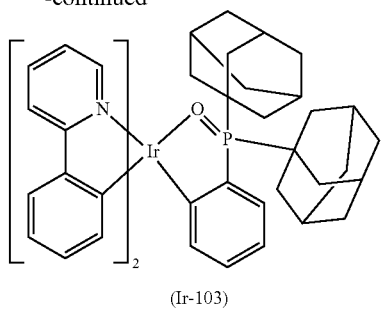

(Ir-103)

Intermediate (Ir-001-c) (0.5 g, 1 eq) and Intermediate (Ir-103-b) (1.90 g, 5 eq) were added into a single-neck flask, 20 mL of 2-isopropanol was added. After blowing nitrogen, potassium phosphate (0.82 g, 5 eq) was added. The reaction was carried out at room temperature for 24 hours. The reaction was filtered with celite, washed with methanol and was dried, and then purified with column chromatography, rotary evaporation to remove solvent and then was recrystallized to obtain a yellow solid complex (Ir-103) with a yield of 56%.

Synthesis Example 7: Synthesis of Complex (Ir-138)

Synthesis of Intermediate (Ir-138-a)

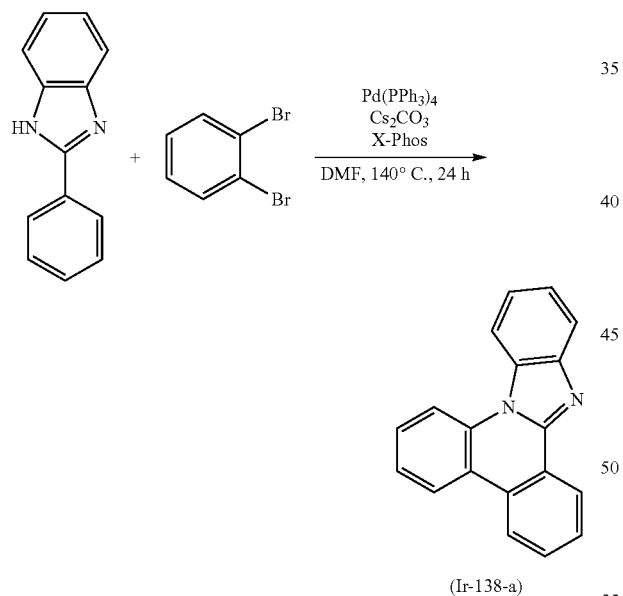

(Ir-138-a)

2-phenylbenzimidazole (49.4 g, 1.2 eq), 1,2-dibromobenzene (50 g, 1 eq), Pd(PPh₃)₄ (12.25 g, 0.05 eq), 2-Dicyclohexylphosphino-2,4,6-triisopropylbiphenyl (X-Phos) (5.05 g, 0.05 eq), and cesium carbonate (138.11 g, 2 eq) were added into a dry two-neck flask, then 500 mL of N,N-Dimethylformamide (DMF) was added. The mixture reacted under stirring at 140° C. for 24 hours, then cooled to room temperature. After the reaction was completed, the solvent was dried by rotary evaporation, and then the mixture was washed with dichloromethane and water. An organic layer was taken and dried with magnesium sulfate, and was dried by rotary evaporation, followed by the column chromatography to obtain a solid intermediate (Ir-138-a) with a yield of 74%.

Synthesis of Intermediate (Ir-138-b)

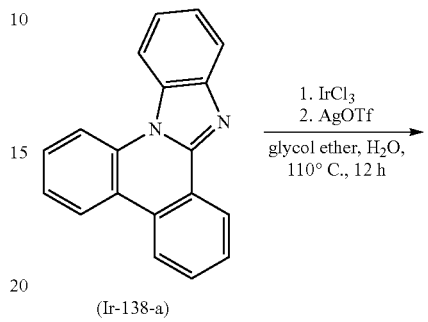

(Ir-138-a)

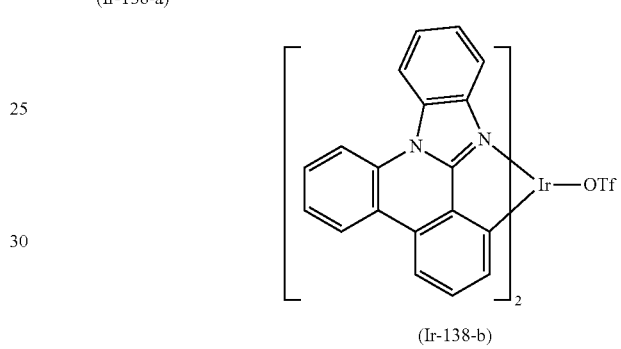

(Ir-138-b)

2-phenylbenzimidazole (14.02 g, 3 eq) was added into a single-neck flask, iridium trichloride (5.2 g, 1 eq) was added, and a mixed solution of 300 mL ethylene glycol ethyl ether and 100 mL water was added. The mixture was heated to 110° C., and reacted for 12 hours, then cooled to room temperature, poured into saturated sodium chloride aqueous solution, and a yellow substance was filtered. After dried, the solid was dissolved in a mixed solution of 300 mL dichloromethane and 100 mL methanol, and then silver trifluoromethanesulfonate (13.42 g, 3 eq) was added, reacted for 12 hours, followed by filtration, and dried to obtain a yellow solid intermediate (Ir-138-b) with a yield of 63%.

Synthesis of Complex (Ir-138)

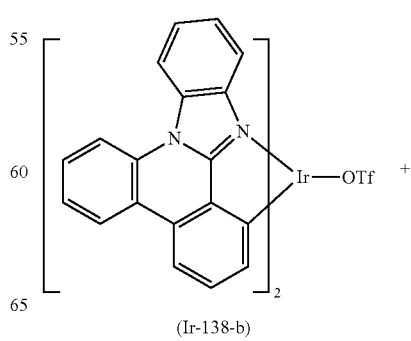

(Ir-138-b)

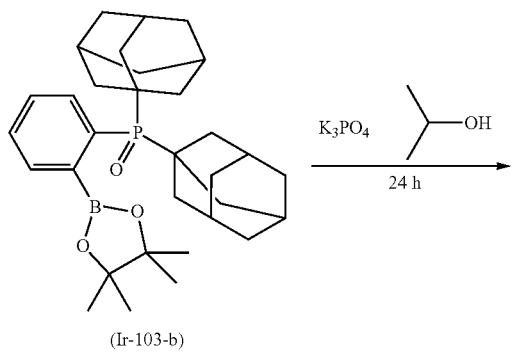

(Ir-103-b)

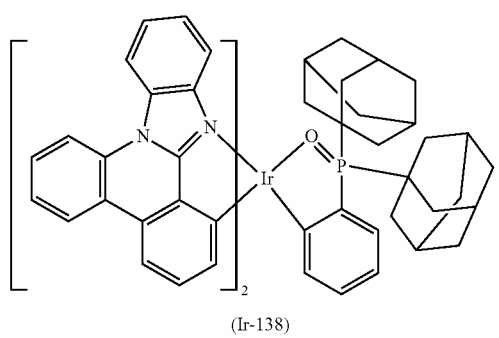

(Ir-138)

Intermediate (Ir-138-b) (0.5 g, 1 eq) and Intermediate (Ir-103-b) (1.49 g, 5 eq) were added into a single-neck flask, and 20 mL of 2-isopropanol was added. After blowing nitrogen, potassium phosphate (0.61 g, 5 eq) was added. The reaction was carried out at room temperature for 24 hours. The reaction was filtered with celite, washed with methanol and was dried, and then purified with column chromatography, rotary evaporation to remove solvent and then was recrystallized to obtain a red solid complex (Ir-138) with a yield of 72%.

Synthesis Example 8: Synthesis of Complex (Ir-154)

Synthesis of Intermediate (Ir-154-a)

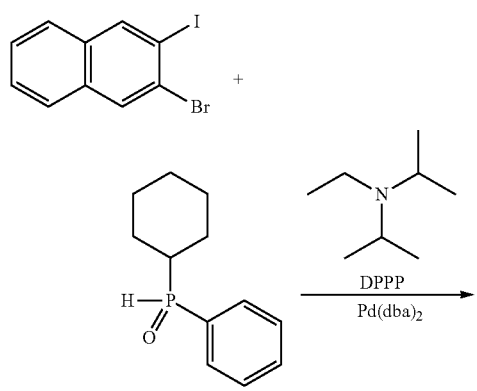

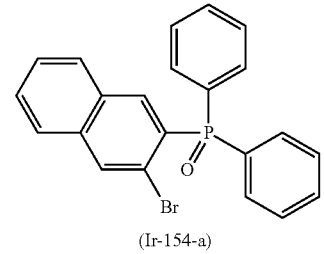

(Ir-154-a)

Diphenylphosphine oxide (68.6 g, 1 eq), bis(dibenzylideneacetone) palladium (Pd(dba)$_2$) (6.83 g, 0.035 eq), and 1,3-bis(diphenyphosphino)propane (DPPP) (4.90 g, 0.035 eq) were added into a dry two-necked flask, the flask was vacuumed and filled with nitrogen for three cycles, and then the mixture was dissolved in 500 mL toluene. Then 2-bromo-3-iodonaphthalene (112.98 g, 1 eq) and N,N-diisopropylethylamine (65.78 g, 1.5 eq) were added by syringe injection until the reaction started. The mixture reacted under stirring at 120° C. for 96 hours, then cooled to room temperature. After the reaction was completed, the solvent was dried by rotary evaporation, and then the mixture was washed with dichloromethane and water. An organic layer was taken and dried with magnesium sulfate, and was dried by rotary evaporation, followed by the column chromatography to obtain a solid intermediate (Ir-154-a) with a yield of 66%.

Synthesis of Intermediate (Ir-154-b)

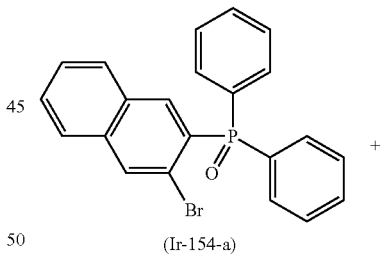

(Ir-154-a)

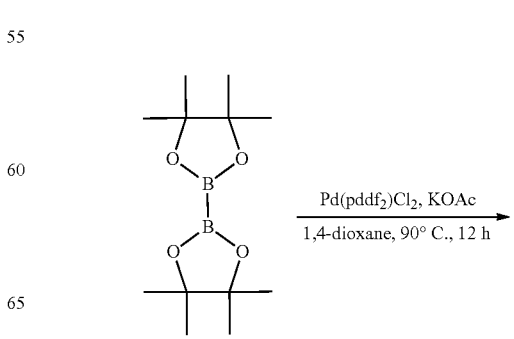

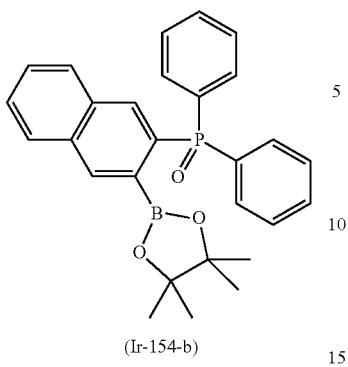

(Ir-154-b)

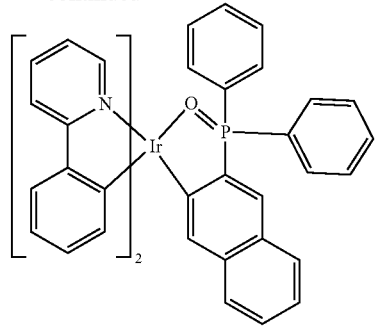

(Ir-154)

Bis(pinacolato)diborane (24.15 g, 1.5 eq), Intermediate (Ir-154-a) (25.82 g, 1 eq), Pd(dppf)$_2$Cl$_2$ (2.3 g, 0.05 eq), and potassium acetate (24.9 g, 4 eq) were added into a dry two-neck flask, then 1000 mL of a mixed solution of dioxane and water in a ratio of 3:1 was added. The mixture reacted under stirring at 90° C. for 12 hours, then cooled to room temperature. After the reaction was completed, the solvent was dried by rotary evaporation, and then the mixture was washed with dichloromethane and water. An organic layer was taken and dried with magnesium sulfate, and was dried by rotary evaporation, followed by the column chromatography to obtain a solid intermediate (Ir-154-b) with a yield of 88%.

Intermediate (Ir-001-c) (0.5 g, 1 eq) and Intermediate (Ir-154-b) (1.75 g, 5 eq) were placed into a single-neck flask, 20 mL of 2-isopropanol was added. After blowing nitrogen, tripotassium phosphate (0.82 g, 5 eq) was added. The reaction was carried out at room temperature for 24 hours. The reaction was filtered with celite, washed with methanol and was dried, and then purified with column chromatography, rotary evaporation to remove solvent and then was recrystallized to obtain a yellow solid complex (Ir-154) with a yield of 60%.

Synthesis Example 9: Synthesis of Complex (Ir-180)

Synthesis of Intermediate (Ir-180-a)

Synthesis of Complex (Ir-154)

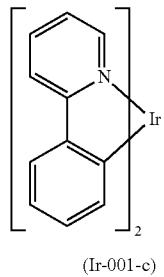

(Ir-001-c)

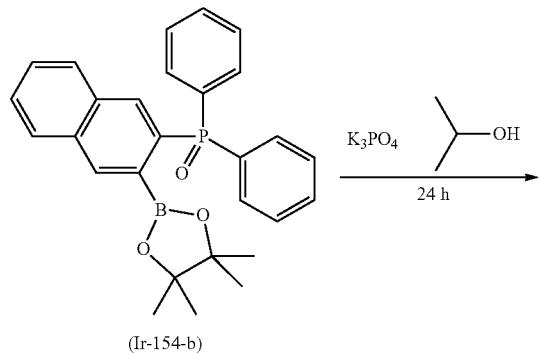

(Ir-154-b)

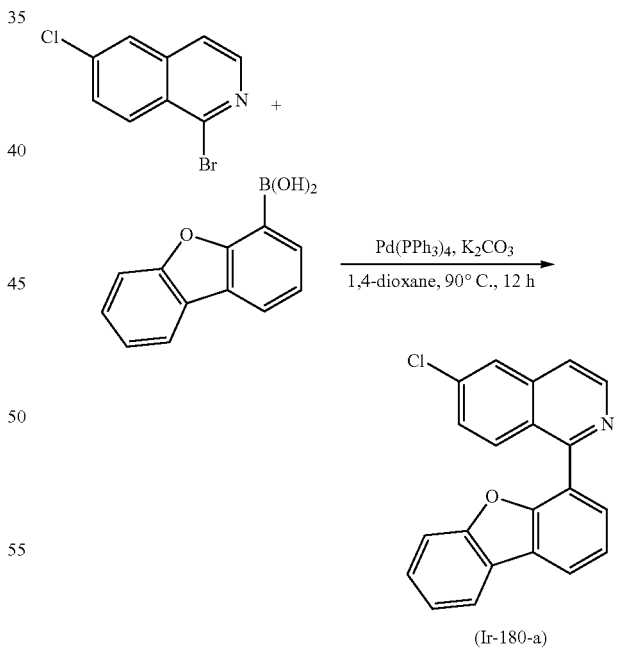

(Ir-180-a)

1-bromo-6-chloroisoquinoline (30 g, 1 eq), 4-dibenzofuran boronic acid (26.23 g, 1 eq), Pd(PPh$_3$)$_4$ (7.15 g, 0.05 eq), and potassium carbonate (68.39 g, 4 eq) were added into a dry two-neck flask, then 500 mL of a mixed solution of dioxane and water in a ratio of 3:1 was added. The mixture reacted under stirring at 90° C. for 12 hours, then cooled to room temperature. After the reaction was completed, the solvent was dried by rotary evaporation, and then the mixture was washed with dichloromethane and water. An organic layer was taken and dried with magnesium sulfate, and was dried by rotary evaporation, followed by the column chromatography to obtain a solid intermediate (Ir-180-a) with a yield of 87%.

Synthesis of Intermediate (Ir-180-b)

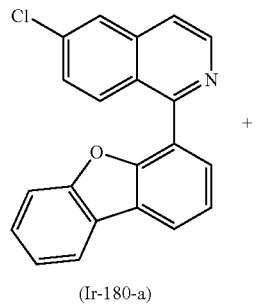

(Ir-180-a)

+

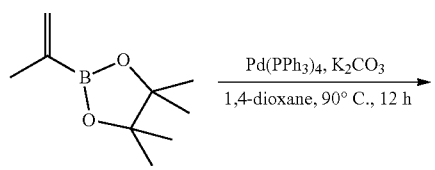

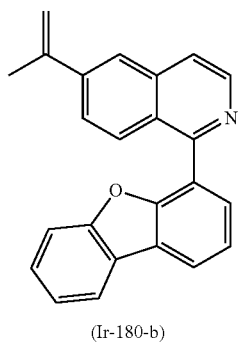

(Ir-180-b)

Intermediate (Ir-180-a) (18.47 g, 1 eq), isopropenylboronic acid pinacol ester (16.00 g, 1.7 eq), Pd(PPh$_3$)$_4$ (3.23 g, 0.05 eq), and potassium carbonate (30.97 g, 4 eq) were placed into a dry two-neck flask, then 500 mL of a mixed solution of dioxane and water in a ratio of 3:1 was added. The mixture reacted under stirring at 90° C. for 12 hours, then cooled to room temperature. After the reaction was completed, the solvent was dried by rotary evaporation, and then the mixture was washed with dichloromethane and water. An organic layer was taken and dried with magnesium sulfate, and was dried by rotary evaporation, followed by the column chromatography to obtain a solid intermediate (Ir-180-b) with a yield of 85%.

Synthesis of Intermediate (Ir-180-c)

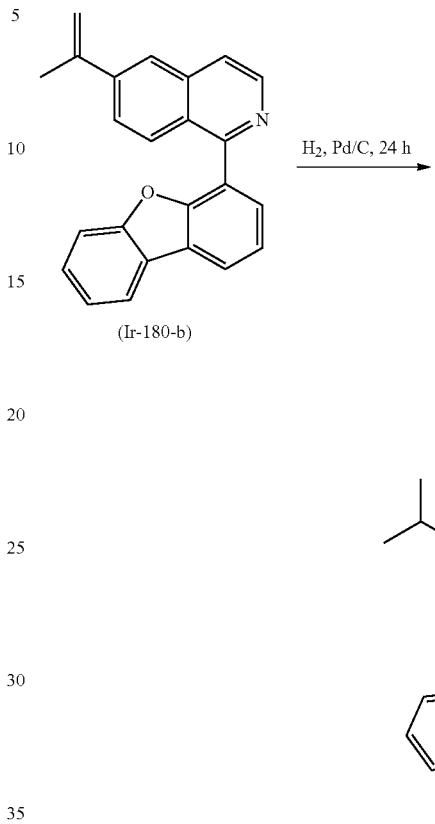

Intermediate (Ir-180-b) (15 g, 1 eq) and dry palladium-carbon (1 g) were placed into a dry two-necked flask, then 100 mL tetrahydrofuran was added, and hydrogen was continuously introduced into the reaction solution. The reaction solution was carried out for 24 hours under stirring at room temperature. After the reaction was completed, the reaction solvent was removed by rotary evaporation, followed by purification with a column chromatography to obtain a solid intermediate (Ir-180-c) with a yield of 95%.

Synthesis of Intermediate (Ir-180-d)

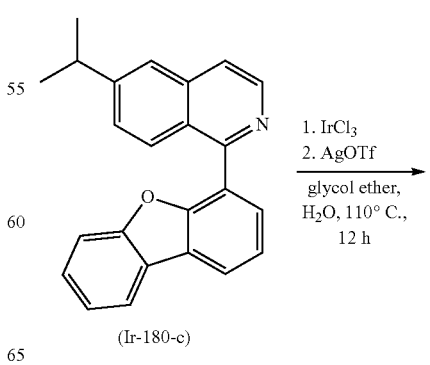

(Ir-180-c)

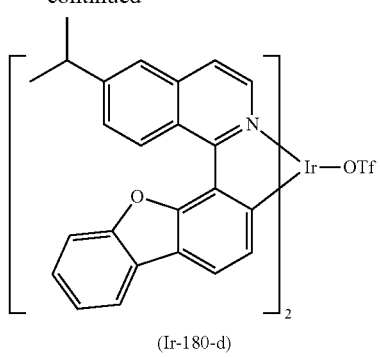

(Ir-180-d)

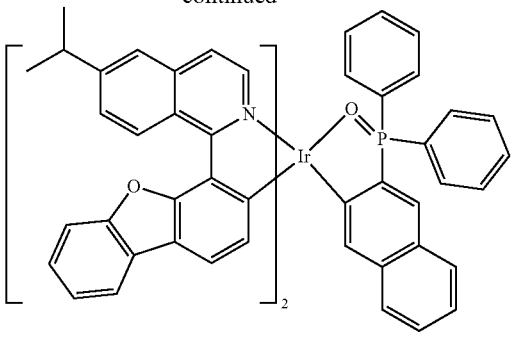

(Ir-180)

Intermediate (Ir-180-c) (17.63 g, 3 eq) was added into a single-neck flask, iridium trichloride (5.2 g, 1 eq) was added, and a mixed solution of 300 mL ethylene glycol ethyl ether and 100 mL water was added. The mixture was heated to 110° C., and reacted for 12 hours, then cooled to room temperature, poured into saturated sodium chloride aqueous solution, and a yellow substance was filtered. After dried, the solid was dissolved in a mixed solution of 300 mL dichloromethane and 100 mL methanol, and then silver trifluoromethanesulfonate (13.42 g, 3 eq) was added, reacted for 12 hours, followed by filtration, and dried to obtain a yellow solid intermediate (Ir-180-d) with a yield of 60%.

Synthesis of Complex (Ir-180)

Intermediate (Ir-180-d) (0.5 g, 1 eq) and Intermediate (Ir-154-b) (1.12 g, 5 eq) were added into a single-neck flask, 20 mL of 2-isopropanol was added. After blowing nitrogen, potassium phosphate (0.523 g, 5 eq) was added. The reaction was carried out at room temperature for 24 hours. The reaction was filtered with celite, washed with methanol and was dried, and then purified with column chromatography, rotary evaporation to remove solvent and then was recrystallized to obtain a red solid complex (Ir-180) with a yield of 73%.

Synthesis Example 10: Synthesis of Complex (Ir-195)

Synthesis of Complex (Ir-195)

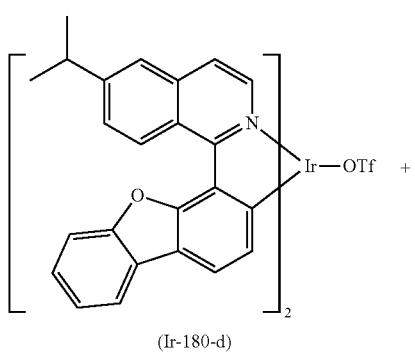

(Ir-180-d)

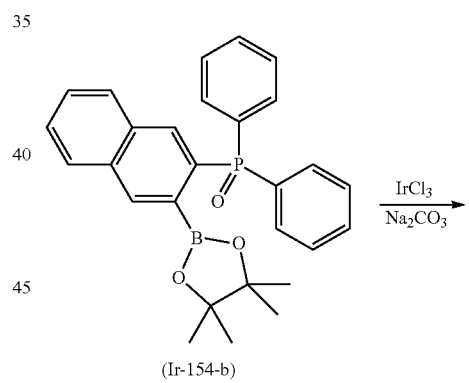

(Ir-154-b)

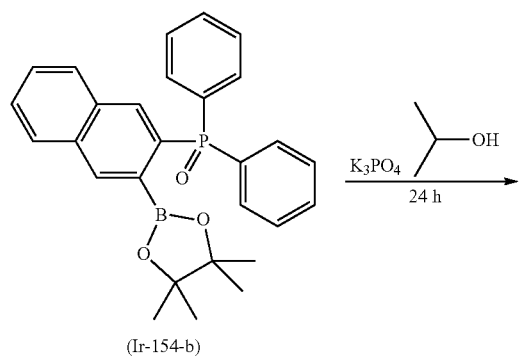

(Ir-154-b)

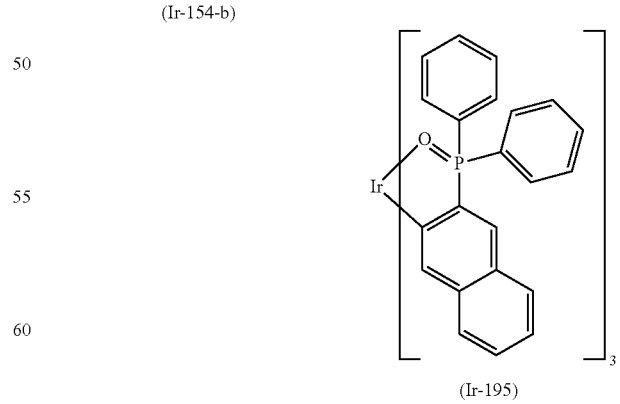

(Ir-195)

Iridium trichloride (0.52 g, 1 eq) and Intermediate (Ir-154-b) (4.75 g, 6 eq) were placed into a single-necked flask, and 20 mL of diethanol ethyl ether was added. After blowing nitrogen, sodium carbonate (1.85 g, 10 eq) was added and heated to 120° C. to react for 24 hours. After the reaction was completed, the solvent was evaporated in vacuo. Water and dichloromethane were added for extraction and liquid separation. After the dichloromethane layer was collect and solvent was removed by rotary evaporation, and the solid was washed with methanol, and then purified with column chromatography. The product was collected, the solvent was removed by rotary evaporation and was recrystallized to obtain a red solid complex (Ir-195) with a yield of 27%.

Synthesis Example 11: Synthesis of Complex (Ir-224)

Synthesis of Intermediate (Ir-224-a)

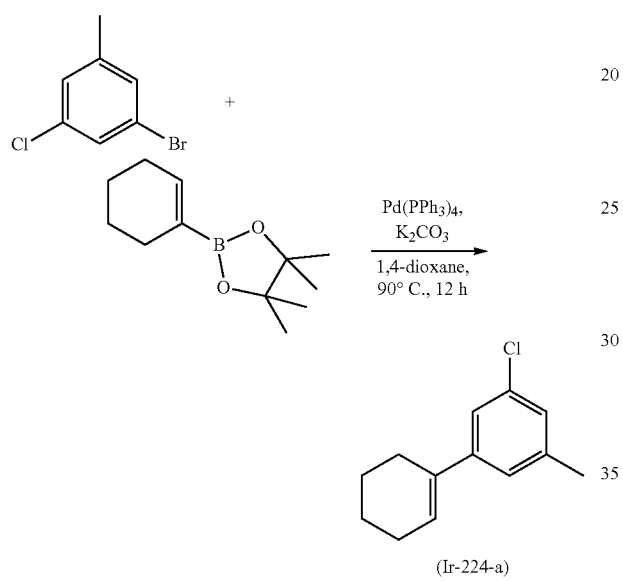

3-bromo-5-chlorotoluene (50 g, 1 eq), cyclohexene-1-boronic acid pinacol ester (86.09 g, 1.7 eq), Pd(PPh$_3$)$_4$ (14.06 g, 0.05 eq), and potassium carbonate (134.51 g, 4 eq) were added into a dry two-neck flask, then 500 mL of a mixed solution of dioxane and water in a ratio of 3:1 was added. The mixture reacted under stirring at 90° C. for 12 hours, then cooled to room temperature. After the reaction was completed, the solvent was dried by rotary evaporation, and then the mixture was washed with dichloromethane and water. An organic layer was taken and dried with magnesium sulfate, and was dried by rotary evaporation, followed by the column chromatography to obtain a solid intermediate (Ir-224-a) with a yield of 79%.

Synthesis of Intermediate (Ir-224-b)

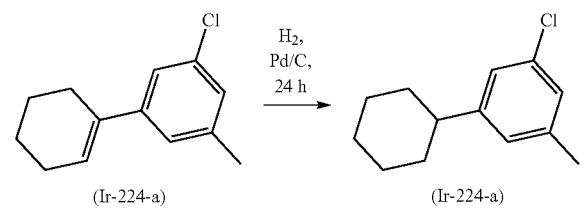

Intermediate (Ir-224-a) (40 g, 1 eq) and dry palladium-carbon (4 g) were placed into a dry two-necked flask, then 500 mL tetrahydrofuran was added, and hydrogen was continuously introduced into the reaction solution. The reaction solution was carried out for 24 hours under stirring at room temperature. After the reaction was completed, the reaction solvent was removed by rotary evaporation, followed by purification with a column chromatography to obtain a solid intermediate (Ir-224-b) with a yield of 90%.

Synthesis of Intermediate (Ir-224-c)

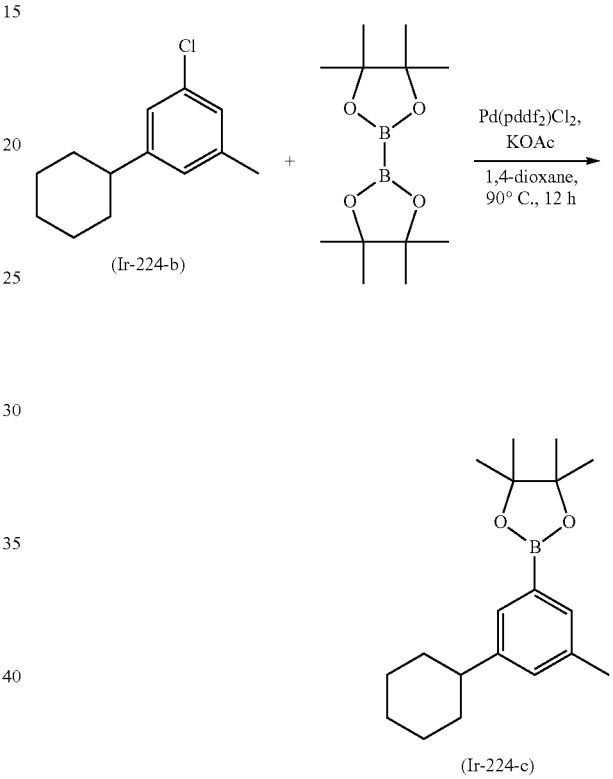

Bis(pinacolato)diborane (24.15 g, 1.5 eq), Intermediate (Ir-224-b) (13.23 g, 1 eq), Pd(dppf)$_2$Cl$_2$ (2.3 g, 0.05 eq), and potassium acetate (24.9 g, 4 eq) were added into a dry two-neck flask, then 1000 mL of a mixed solution of dioxane and water in a ratio of 3:1 was added. The mixture reacted under stirring at 90° C. for 12 hours, then cooled to room temperature. After the reaction was completed, the solvent was dried by rotary evaporation, and then the mixture was washed with dichloromethane and water. An organic layer was taken and dried with magnesium sulfate, and was dried by rotary evaporation, followed by the column chromatography to obtain a solid intermediate (Ir-224-c) with a yield of 76%.

Synthesis of Intermediate (Ir-224-d)

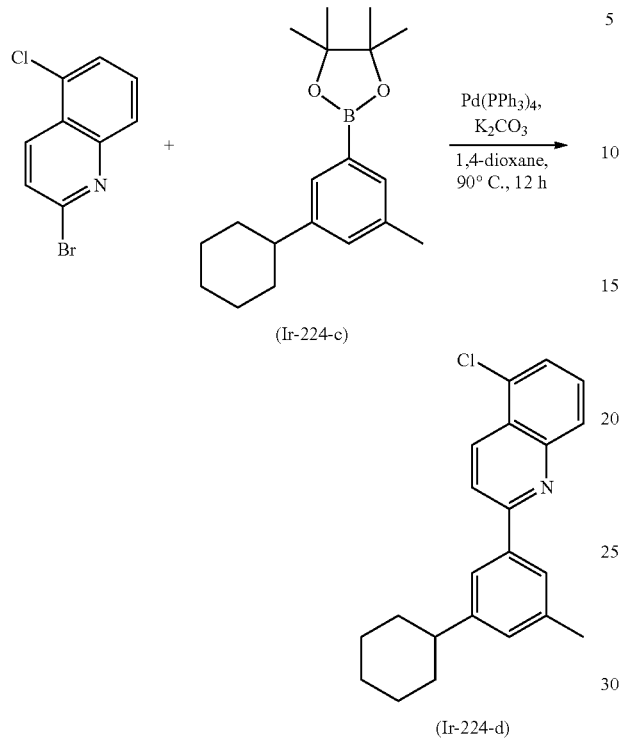

Intermediate (Ir-224-c) (15 g, 1 eq), 2-bromo-5-chloroquinoline (14.54 g, 1.2 eq), Pd(PPh₃)₄ (2.89 g, 0.05 eq), and potassium carbonate (27.62 g, 4 eq) were added into a dry two-neck flask, then 500 mL of a mixed solution of dioxane and water in a ratio of 3:1 was added. The mixture reacted under stirring at 90° C. for 12 hours, then cooled to room temperature. After the reaction was completed, the solvent was dried by rotary evaporation, and then the mixture was washed with dichloromethane and water. An organic layer was taken and dried with magnesium sulfate, and was dried by rotary evaporation, followed by the column chromatography to obtain a solid intermediate (Ir-224-d) with a yield of 65%.

Synthesis of Intermediate (Ir-224-e)

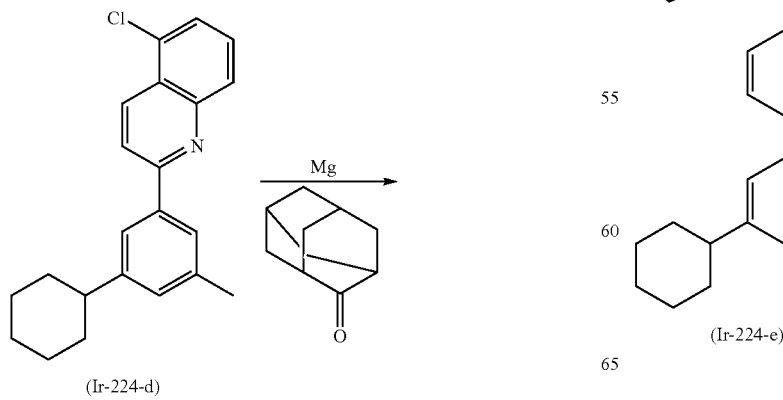

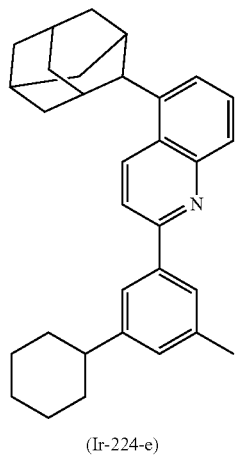

Intermediate (Ir-224-d) (15 g, 1 eq) and magnesium bar (10.86 g, 10 eq) were placed into a dry 1000 mL two-necked flask, and the flask was vacuumed and filled with nitrogen for three cycles. Then anhydrous tetrahydrofuran (300 mL) was added to dissolve. A small amount of dibromoethane and iodine were added, heated to become lukewarm until the iodine faded, and then reacted for 1 hour. Then the reactant was slowly added to 100 mL tetrahydrofuran of adamantanone (20.13 g, 3 eq), and stirred at 50° C. for 4 hours. Water and ethyl acetate were added for liquid separation. The ethyl acetate layer was collected and the solvent was removed by rotary evaporation and then purified with column chromatography to obtain a white solid intermediate (Ir-224-e) with a yield of 28%.

Synthesis of Intermediate (Ir-224-f)

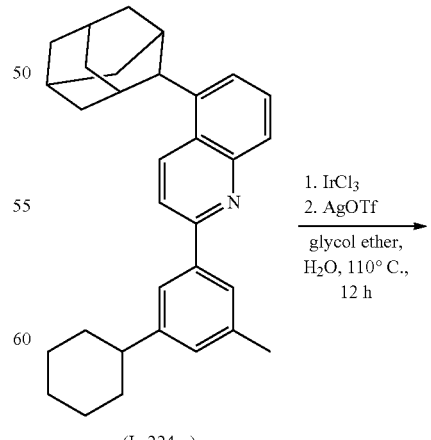

-continued

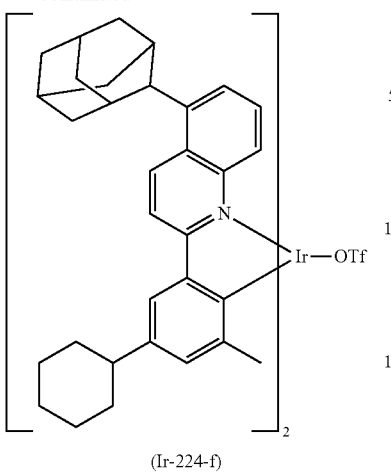

(Ir-224-f)

Intermediate (Ir-224-e) (22.76 g, 3 eq) was added into a single-neck flask, iridium trichloride (5.2 g, 1 eq) was added, and a mixed solution of 300 mL ethylene glycol ethyl ether and 100 mL water was added. The mixture was heated to 110° C., and reacted for 12 hours, then cooled to room temperature, poured into saturated sodium chloride aqueous solution, and a yellow substance was filtered. After dried, the solid was dissolved in a mixed solution of 300 mL dichloromethane and 100 mL methanol, and then silver trifluoromethanesulfonate (13.42 g, 3 eq) was added, reacted for 12 hours, followed by filtration, and dried to obtain a yellow solid intermediate (Ir-2244) with a yield of 53%.

Synthesis of Intermediate (Ir-224-g)

-continued

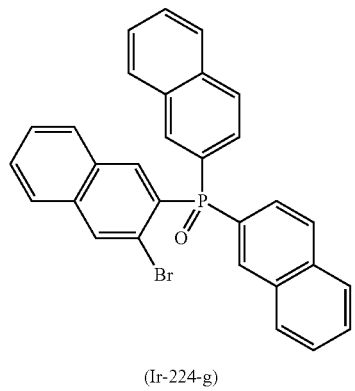

(Ir-224-g)

2,2'-bis-(2-naphthyl)phosphine oxide (20 g, 1 eq), bis (dibenzylideneacetone) palladium (Pd(dba)$_2$) (1.33 g, 0.035 eq), and 1,3-bis(diphenyphosphino)propane (DPPP) (0.96 g, 0.035 eq) were added into a dry two-necked flask, the flask was vacuumed and filled with nitrogen for three cycles, and then the mixture was dissolved in 500 mL toluene. Then 2-bromo-3-iodonaphthalene (22.03 g, 1 eq) and N,N-diisopropylethylamine (12.83 g, 1.5 eq) were added by syringe injection until the reaction started. The mixture reacted under stirring at 120° C. for 96 hours, then cooled to room temperature. After the reaction was completed, the solvent was dried by rotary evaporation, and then the mixture was washed with dichloromethane and water. An organic layer was taken and dried with magnesium sulfate, and was dried by rotary evaporation, followed by the column chromatography to obtain a solid intermediate (Ir-224-g) with a yield of 59%.

Synthesis of Intermediate (Ir-224-h)

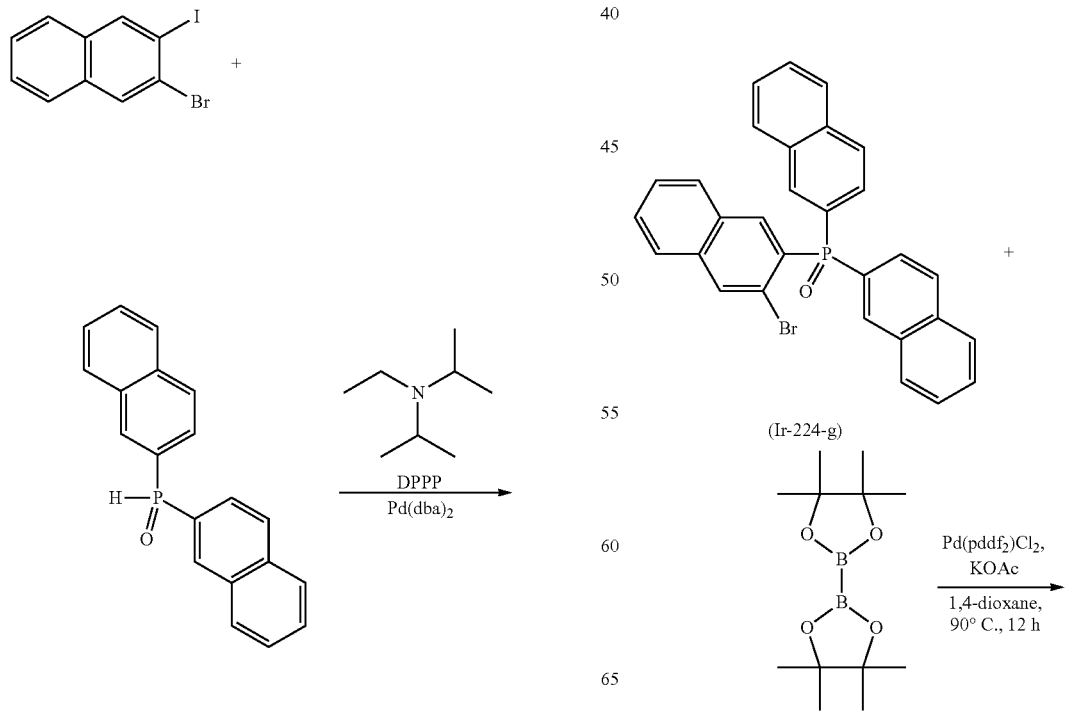

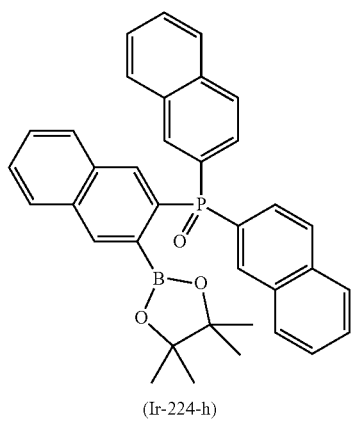

(Ir-224-h)

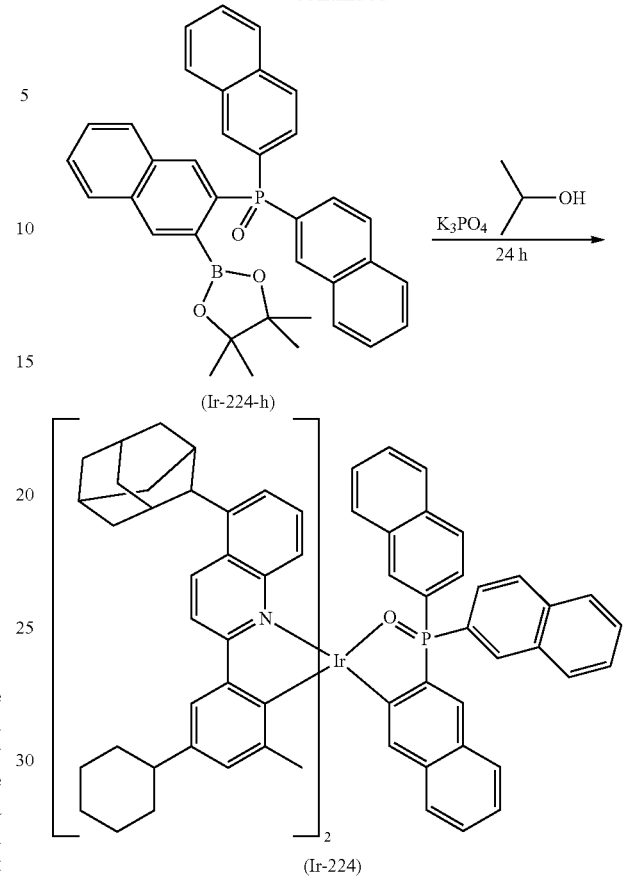

(Ir-224-h)

(Ir-224)

Bis(pinacolato)diborane (24.15 g, 1.5 eq), Intermediate (Ir-224-g) (32.17 g, 1 eq), Pd(dppf)$_2$Cl$_2$ (2.3 g, 0.05 eq), and potassium acetate (24.9 g, 4 eq) were added into a dry two-neck flask, then 1000 mL of a mixed solution of dioxane and water in a ratio of 3:1 was added. The mixture reacted under stirring at 90° C. for 12 hours, then cooled to room temperature. After the reaction was completed, the solvent was dried by rotary evaporation, and then the mixture was washed with dichloromethane and water. An organic layer was taken and dried with magnesium sulfate, and was dried by rotary evaporation, followed by the column chromatography to obtain a solid intermediate (Ir-224-h) with a yield of 64%.

Synthesis of Complex (Ir-224)

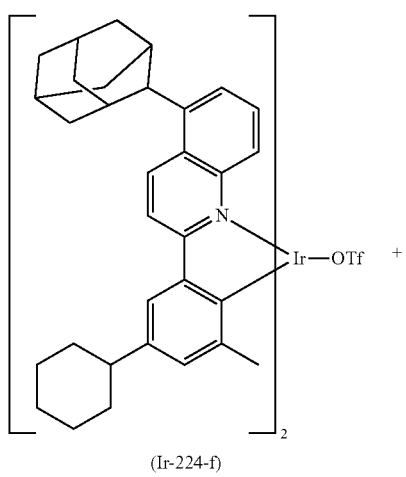

(Ir-224-f)

Intermediate (Ir-2244) (0.5 g, 1 eq) and Intermediate (Ir-224-h) (1.145 g, 5 eq) were added into a single-neck flask, and 20 mL of 2-isopropanol was added. After blowing nitrogen, tripotassium phosphate (0.438 g, 5 eq) was added. The reaction was carried out at room temperature for 24 hours. The reaction was filtered with celite, washed with methanol and was dried, and then purified with column chromatography, rotary evaporation to remove solvent and then was recrystallized to obtain a red solid complex (Ir-224) with a yield of 36%.

3. Preparation and Characterization of OLED Devices:

The structure of OLED device is as follow:

ITO/HIL (100Å)/HTL (450Å)/EBM (50 Å)/EML (400Å)/ETL (350 Å)/cathode

The EML is composed of H-Host and E-Host with a ratio of 6:4 and doped with 10% w/w (Ir-001) or (Ir-002) or (Ir-025) or (Ir-049) or (Ir-052) or (Ir-103) or (Ir-138) or (Ir-154) or (Ir-180) or (Ir-195) or (Ir-224) or Ir(ppy)$_3$ or Ir(acac)(pq)$_2$. The ETL is composed of LiQ (8-hydroxyquinoline-lithium) doped with 40% w/w ETM. The chemical structures of the materials used in the device are shown as follows:

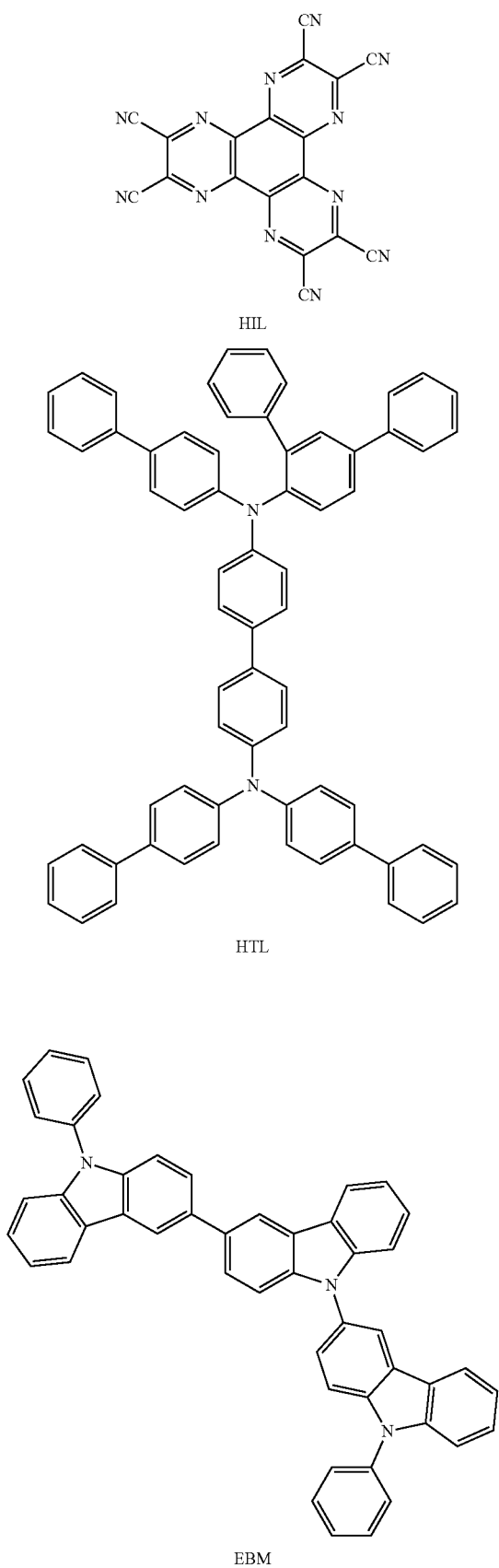 [SMILES: N#Cc1nc2c3nc(C#N)c(C#N)nc3c3nc(C#N)c(C#N)nc3c2nc1C#N ; c1ccc(-c2ccc(N(c3ccc(-c4ccccc4)cc3)c3ccc(-c4ccc(N(c5ccc(-c6ccccc6)cc5)c5ccc(-c6ccccc6)cc5-c5ccccc5)cc4)cc3)cc2)cc1 ; c1ccc(-n2c3ccccc3c3cc(-c4ccc5c(c4)c4ccccc4n5-c4ccc5c(c4)c4ccccc4n5-c4ccccc4)ccc32)cc1]

HIL

HTL

EBM

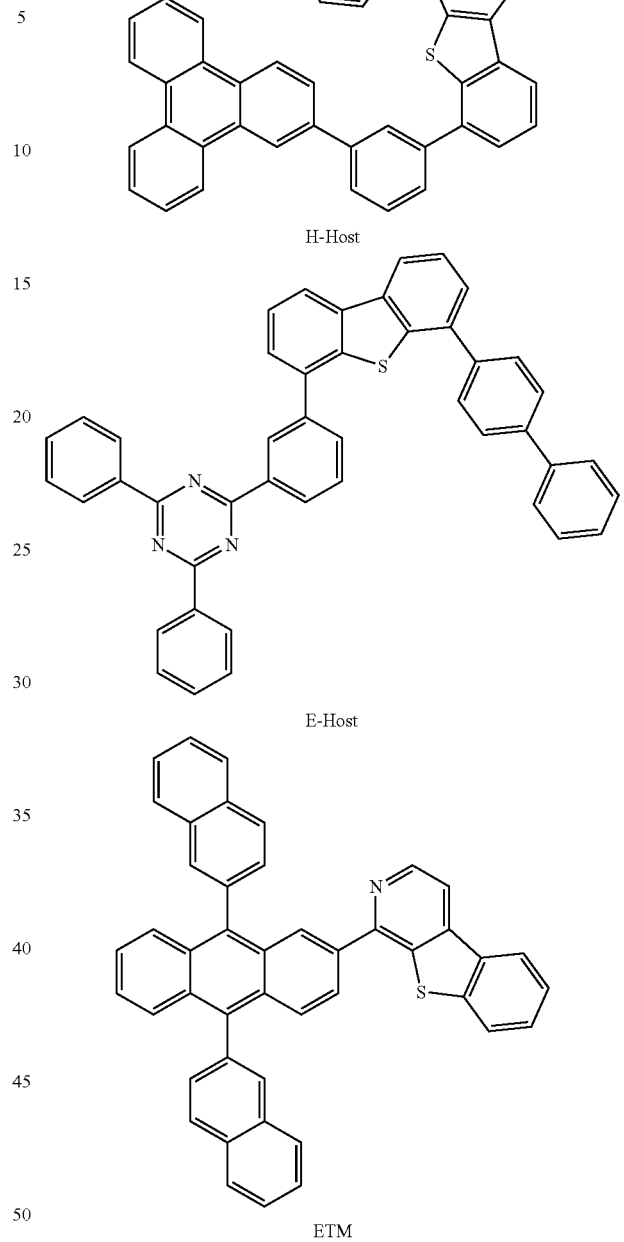

H-Host

E-Host

ETM

The preparation steps of the OLED devices are as follows:
a. Cleaning of conductive glass substrate: in first use, the conductive glass substrate may be cleaned with various solvents such as chloroform, ketone and isopropanol, and then ultraviolet ozone treatment and plasma treatment were performed;
b. HIL (100 Å), HTM (450 Å), EML (400 Å), and ETL (350 Å) were formed by thermal evaporation in high vacuum ($1\times10^{-6}$ mbar);
c. Cathode: LiF/Al (1 nm/150 nm) was formed by thermal evaporation in a high vacuum ($1\times10^{-6}$ mbar);
d. Encapsulating: the device was encapsulated with UV-curable resin in a glove box filled with nitrogen gas.

The current-voltage-luminance (JVL) characteristics of the OLED devices are characterized by characterization equipment, and important parameters such as maximum light-emitting wavelength and external quantum efficiency are recorded. As tested, compared with the typical phosphorescent green dopant Ir(ppy)$_3$, the relative starting voltage, relative external quantum efficiency parameters and relative life span T$_{95}$@50 mA·cm$^{-2}$ of OLED devices are shown in Table 2.

TABLE 2

Green light complex data

| Dopants of OLED devices | Relative starting voltage | Relative external quantum efficiency | Relative life span T$_{95}$@50 mA · cm$^{-2}$ |
|---|---|---|---|
| (Ir-001) | 92% | 115% | 113% |
| (Ir-002) | 91% | 117% | 115% |
| (Ir-052) | 96% | 112% | 108% |
| (Ir-103) | 96% | 105% | 107% |
| (Ir-138) | 97% | 108% | 105% |
| (Ir-154) | 95% | 113% | 110% |
| Ir(ppy)$_3$ | 100% | 100% | 100% |

As tested, compared with the typical phosphorescent red dopant Ir(acac)(pq)$_2$, the relative starting voltage, relative external quantum efficiency parameters and relative life span T$_{95}$@50 mA·cm$^{-2}$ of OLED devices are shown in Table 3.

TABLE 3

Red light complex data

| Dopants of OLED devices | Relative starting voltage | Relative external quantum efficiency | Relative life span T$_{95}$@50 mA · cm$^{-2}$ |
|---|---|---|---|
| (Ir-025) | 95% | 111% | 108% |
| (Ir-049) | 90% | 120% | 119% |
| (Ir-180) | 93% | 109% | 113% |
| (Ir-195) | 91% | 106% | 115% |
| (Ir-224) | 94% | 110% | 109% |
| Ir(acac)(pq)$_2$ | 100% | 100% | 100% |

It can be seen from the devices made of various red and green Ir(III) complexes, etc., that if phosphine oxide groups are used as auxiliary ligands to replace diketone type ligands of Ir(III) complex in OLED devices, especially when used as a dopant material for the light-emitting layer, the starting voltage can be reduced by at least 3%, and the external quantum efficiency of light-emitting and the device life span T$_{95}$ can be increased by at least 5%. It is estimated that since compounds containing a phosphine oxide group have excellent electron transport capabilities, complexes containing such group can also improve the brightness and current efficiency of the device, and at the same time reduce the starting voltage to increase the life span of the device.

Further optimization, such as optimization of device structure, optimization of the combination of HTM, ETM and host materials can further improve the properties of the device, especially efficiency, driving voltage and life span.

Each of the technical features of the above-mentioned embodiments may be combined arbitrarily. To simplify the description, not all the possible combinations of each of the technical features in the above examples are described. However, all of the combinations of these technical features should be considered as within the scope of this disclosure, as long as such combinations do not contradict with each other.

The above-mentioned embodiments are merely illustrative of several embodiments of the present disclosure, which are described specifically and in detail, but it cannot be understood to limit the scope of the present disclosure. It should be understood that, the applications of the present disclosure are not limited to the above-described examples, and those skilled in the art can make modifications and changes in accordance with the above description, all of which are within the protection scope of the present disclosure. Therefore, the protection scope of the present disclosure shall be defined by the appended claims.

What is claimed is:

1. A phosphine oxide-containing transition metal complex having a structural formula represented by Chemical Formula (1):

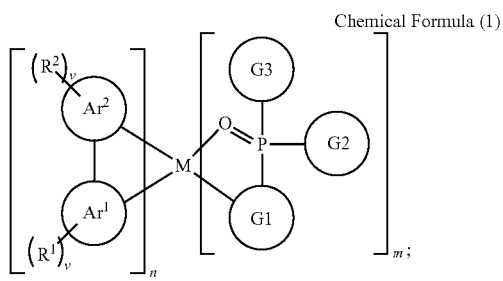

Chemical Formula (1)

wherein:

P is a phosphorus atom, O is an oxygen atom, P and O form a phosphine oxide group with a double bond;

M is a metal atom selected from iridium, gold, platinum, ruthenium, rhodium, osmium, rhenium, nickel, copper, silver, zinc, or tungsten or palladium;

n is 0, 1 or 2; m is selected from 1, 2 or 3;

at each occurrence, Ar$^1$, Ar$^2$, and G1 are independently selected from the group consisting of substituted or unsubstituted aromatic groups containing 5 to 20 ring atoms, substituted or unsubstituted heteroaromatic groups containing 5 to 20 ring atoms, or substituted or unsubstituted non-aromatic ring systems containing 5 to 20 ring atoms;

at each occurrence, G2 is independently selected from the group consisting of hydrogen, deuterium, a halogen atom, a linear alkane containing 1 to 30 carbon atoms, a branched or cyclic alkane containing 3 to 30 carbon atoms, and a linear alkene containing 1 to 30 carbon atoms, a branched alkene containing 1 to 30 carbon atoms, an alkane ether containing 1 to 30 carbon atoms, an aromatic group containing 6 to 30 carbon atoms, a heteroaromatic group containing 5 to 30 ring atoms or a non-aromatic ring system containing 3 to 30 ring atoms;

at each occurrence, G3 is independently selected from the group consisting of hydrogen, deuterium, a halogen atom, a linear alkane containing 1 to 30 carbon atoms, a branched or cyclic alkane containing 3 to 30 carbon atoms, and a linear alkene containing 1 to 30 carbon atoms, a branched alkene containing 1 to 30 carbon atoms, an alkane ether containing 1 to 30 carbon atoms, an aromatic group containing 6 to 30 carbon atoms, a heteroaromatic group containing 5 to 30 ring atoms or a non-aromatic ring system containing 3 to 30 ring atoms;

at each occurrence, R$^1$ and R$^2$ are independently selected from the group consisting of deuterium, a halogen atom, a linear alkane containing 1 to 30 carbon atoms, a branched or cyclic alkane containing 3 to 30 carbon atoms, and a linear alkene containing 1 to 30 carbon atoms, a branched alkene containing 1 to 30 carbon atoms, an alkane ether containing 1 to 30 carbon atoms, an aromatic group containing 6 to 30 carbon atoms, a heteroaromatic group containing 5 to 30 ring atoms or a non-aromatic ring system containing 3 to 30 ring atoms, $R^1$ and $R^2$ may be directly connected to each other to form a ring; and v is selected from any integer from 0 to 4.

2. The transition metal complex of claim 1, wherein at each occurrence, $Ar^1$, $Ar^2$, and G1 are each independently selected from the following groups:

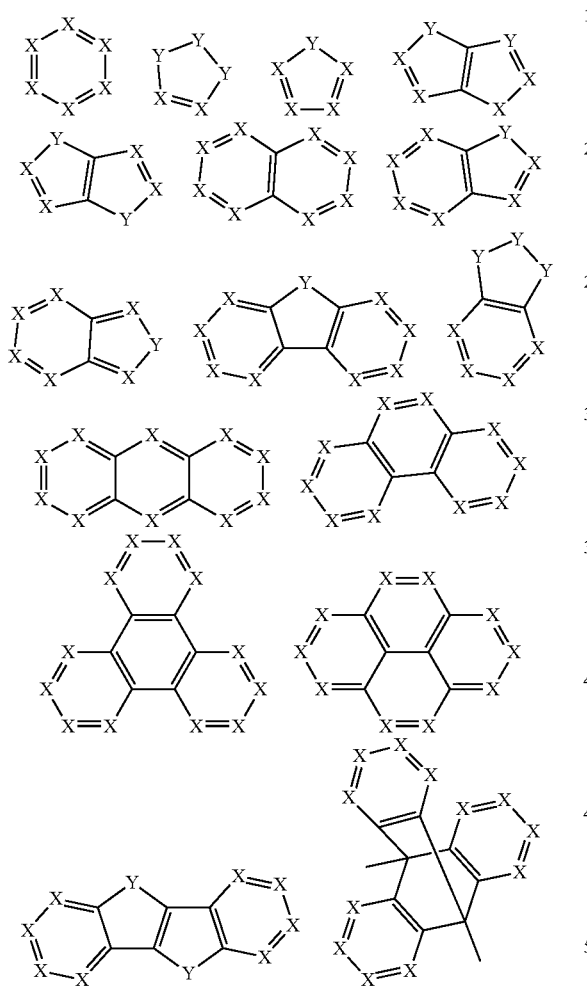

wherein:
X is selected from $CR^3$, N or C;
Y is selected from $CR^4R^5$, $NR^5$, O, S, $PR^5$, $BR^5$ or $SiR^4R^5$,
at each occurrence, $R^3$ to $R^5$ are independently selected from the group consisting of hydrogen, deuterium, a linear alkyl containing 1 to 20 carbon atoms, a linear alkoxy group containing 1 to 20 carbon atoms, or a linear thioalkoxy group containing 1 to 20 carbon atoms, a branched or cyclic alkyl containing 3 to 20 carbon atoms, a branched or cyclic alkoxy group containing 3 to 20 carbon atoms, or a branched or cyclic thioalkoxy group containing 3 to 20 carbon atoms, or a branched or cyclic silyl group containing 3 to 20 carbon atoms, or a substituted keto group containing 1 to 20 carbon atoms, alkoxycarbonyl group containing 2 to 20 carbon atoms, aryloxycarbonyl group containing 7 to 20 carbon atoms, cyano group, carbamoyl group, haloformyl group, formyl group, isocyano group, isocyanate group, thiocyanate group, or isothiocyanate group, hydroxyl group, nitro group, $CF_3$ group, Cl, Br, F, a cross-linkable group, a substituted or unsubstituted aromatic or heteroaromatic ring system containing 5 to 40 ring atoms, an aryloxy or heteroaryloxy group containing 5 to 40 ring atoms, and combination of these systems.

3. The transition metal complex of claim 2, wherein $Ar^1$ and $Ar^2$ are independently selected from the following groups:

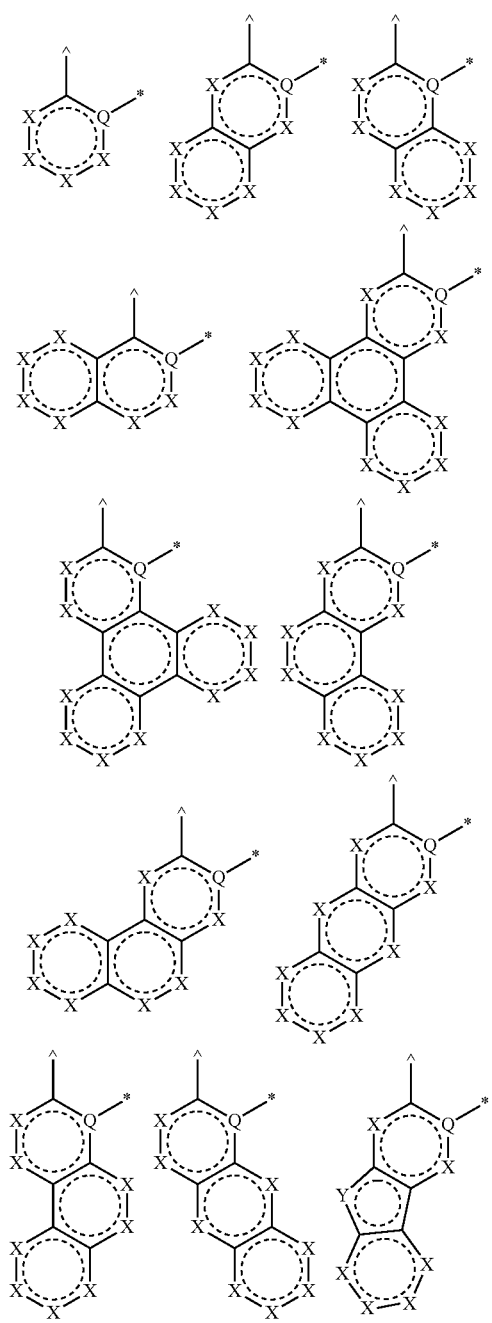

-continued
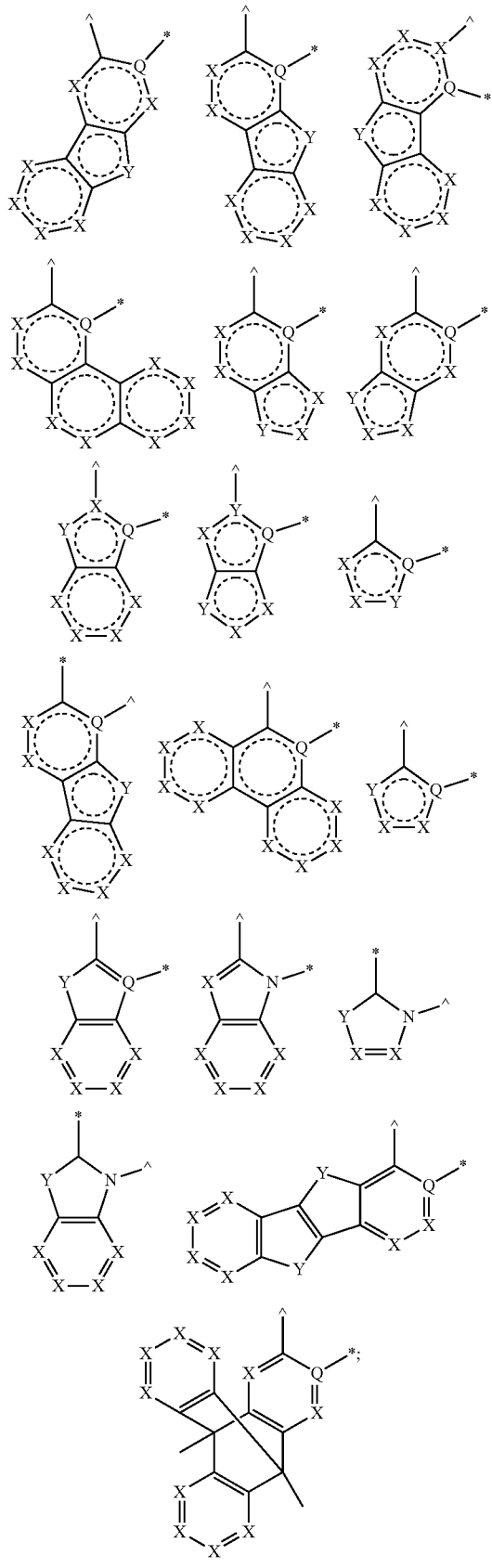
wherein:
Q is selected from C or N; ^represents a connection site between $Ar^1$ and $Ar^2$; and * represents a connection site between $Ar^1$ or $Ar^2$ and M in Chemical Formula (1).
4. The transition metal complex of claim 3, wherein
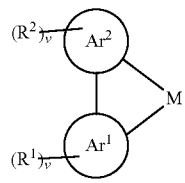
is any structure selected from (A-1) to (A-24):
(A-1)
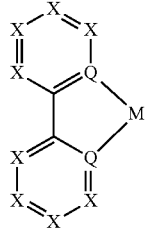
(A-2)
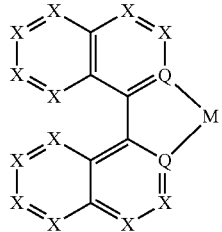
(A-3)
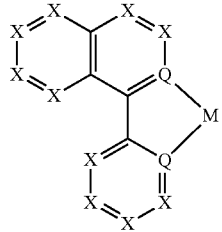
(A-4)
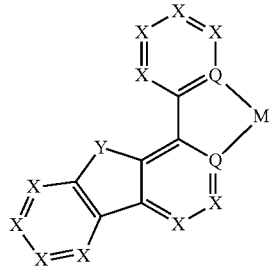

(A-5) 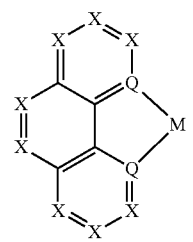
(A-6) 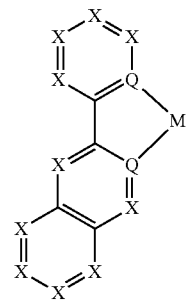
(A-7) 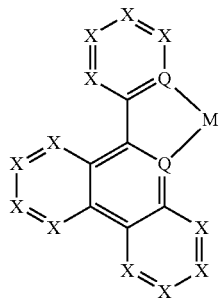
(A-8) 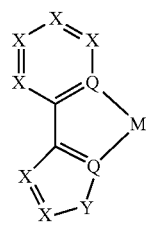
(A-9) 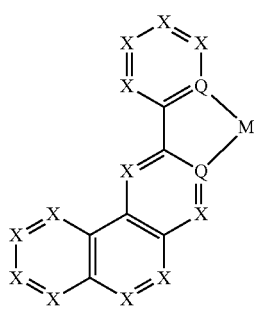
(A-10) 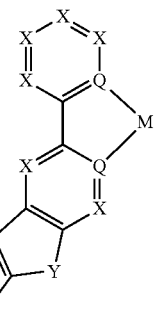
(A-11) 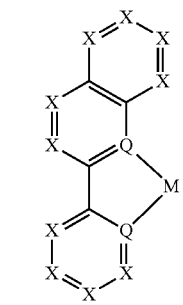
(A-12) 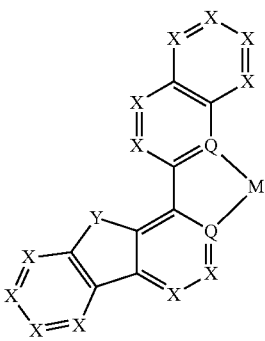
(A-13)
(A-14)

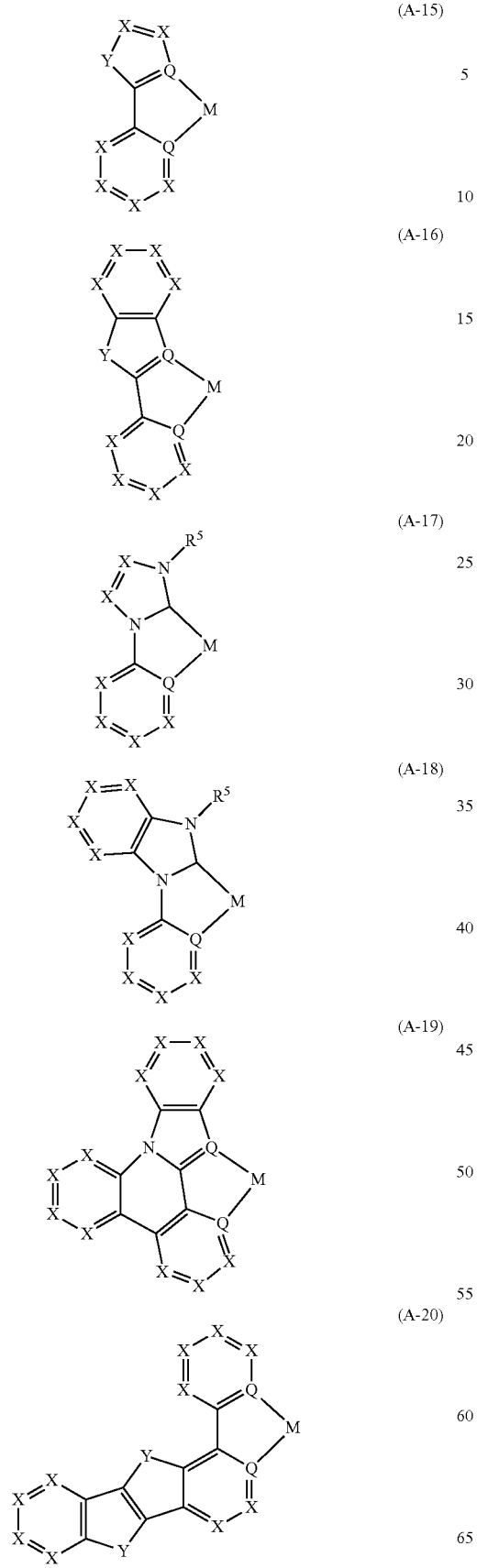
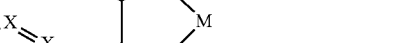
5. The transition metal complex of claim 4, wherein in structures (A-1) to (A-16), (A-19), (A-20), (A-22) to (A-24), one of Q is C, and the other Q is N.

6. The transition metal complex of claim 2, wherein
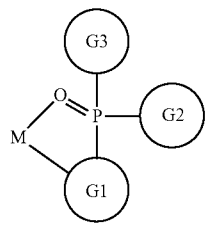
is selected from the following groups:
(B-1)
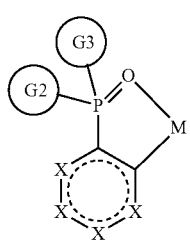
(B-2)
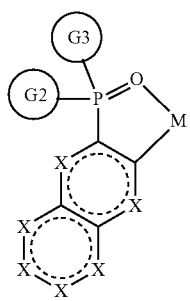
(B-3)
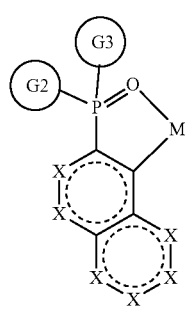
(B-4)
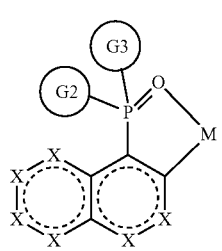
(B-5)
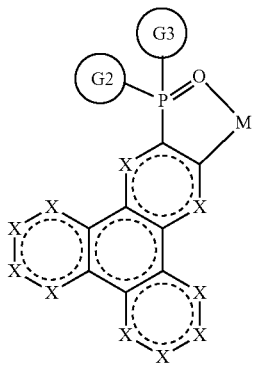
(B-6)
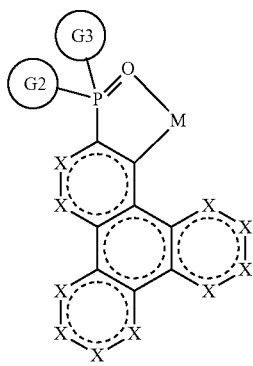
(B-7)
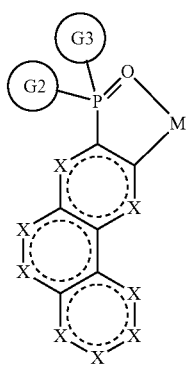
(B-8)
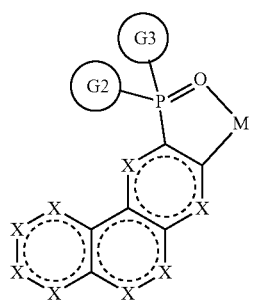

-continued
(B-9)
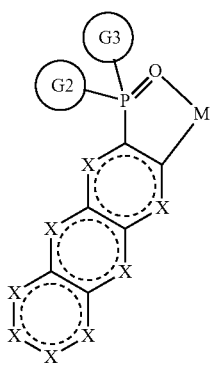
(B-10)
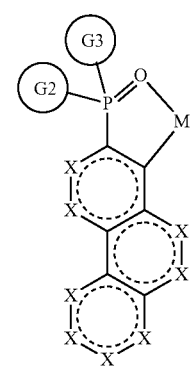
(B-11)
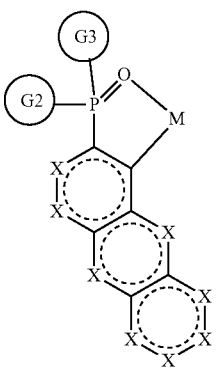
(B-12)
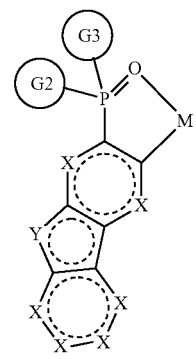
(B-13)
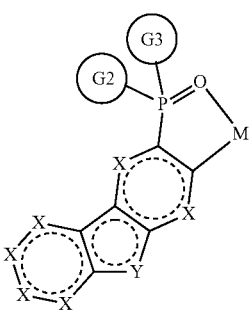
(B-14)
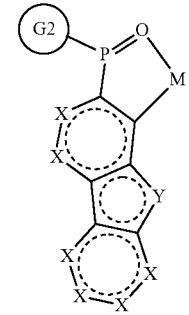
(B-15)
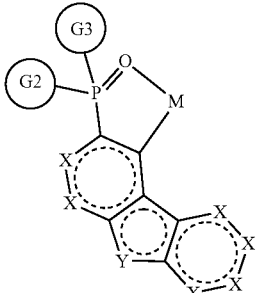
(B-16)
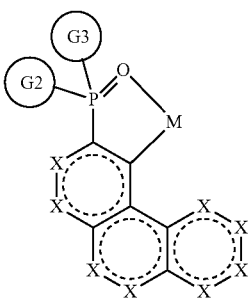
(B-17)
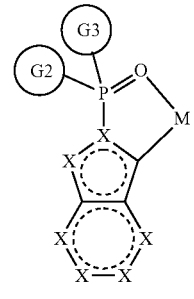

-continued (B-18)
(B-19)
(B-20)
(B-21)

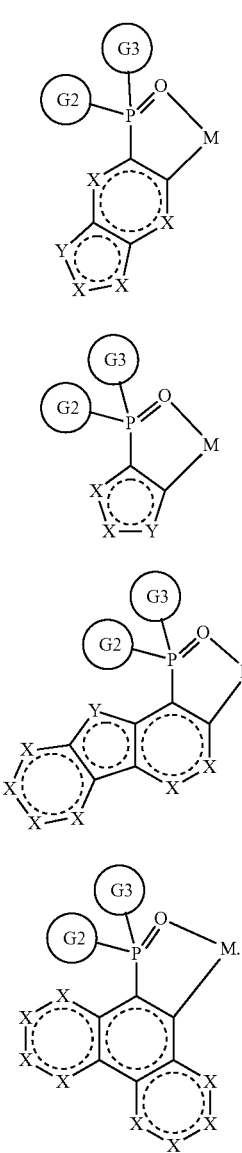

-continued

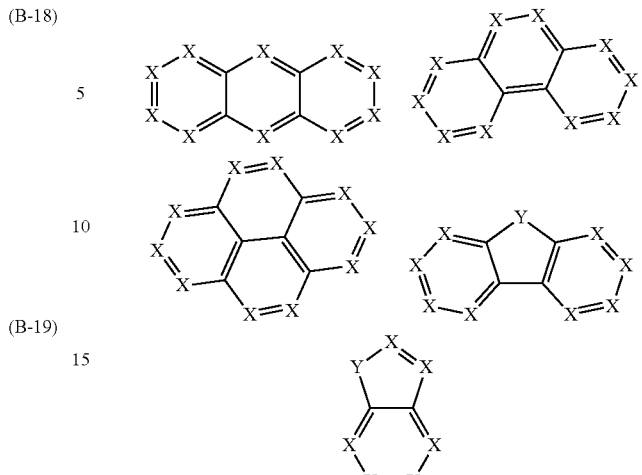

wherein:

X is selected from $CR^3$, N or C;

Y is selected from $CR^4R^5$, $NR^5$, O, S, $PR^5$, $BR^5$ or $SiR^4R^5$; and at each occurrence, $R^3$ to $R^5$ are independently selected from the group consisting of hydrogen, deuterium, a linear alkyl containing 1 to 20 carbon atoms, a linear alkoxy group containing 1 to 20 carbon atoms, or a linear thioalkoxy group containing 1 to 20 carbon atoms, a branched or cyclic alkyl containing 3 to 20 carbon atoms, a branched or cyclic alkoxy group containing 3 to 20 carbon atoms, or a branched or cyclic thioalkoxy group containing 3 to 20 carbon atoms, or a branched or cyclic silyl group containing 3 to 20 carbon atoms, or a substituted keto group containing 1 to 20 carbon atoms, alkoxycarbonyl group containing 2 to 20 carbon atoms, aryloxycarbonyl group containing 7 to 20 carbon atoms, cyano group, carbamoyl group, haloformyl group, formyl group, isocyano group, isocyanate group, thiocyanate group, or isothiocyanate group, hydroxyl group, nitro group, $CF_3$ group, Cl, Br, F, a cross-linkable group, a substituted or unsubstituted aromatic or heteroaromatic ring system containing 5 to 40 ring atoms, an aryloxy or heteroaryloxy group containing 5 to 40 ring atoms, and combination of these systems.

7. The transition metal complex of claim 1, wherein at each occurrence, G2 and G3 are independently selected from the following general formulas:

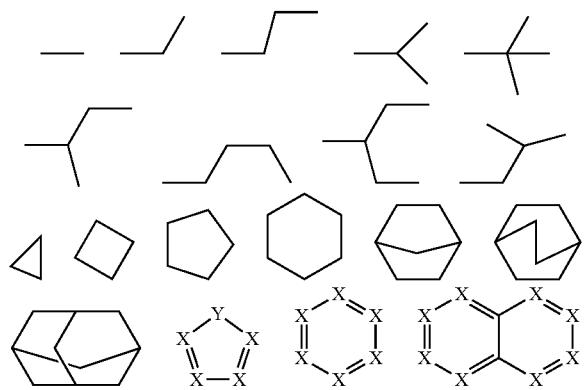

8. The transition metal complex of claim 1, wherein at each occurrence, G2 and G3 are selected from the same structure.

9. The transition metal complex of claim 8, wherein at each occurrence, G2 and G3 are simultaneously selected from the following groups:

10. The transition metal complex of claim 2, wherein at each occurrence, $Ar^1$, $Ar^2$, and G1 are each independently selected from the following groups:

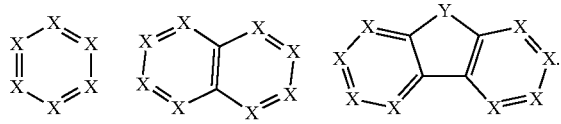

11. The transition metal complex of claim 1, wherein the Chemical Formula (1) is any one selected from Chemical Formulas (2-1) to (2-5):

(2-1)
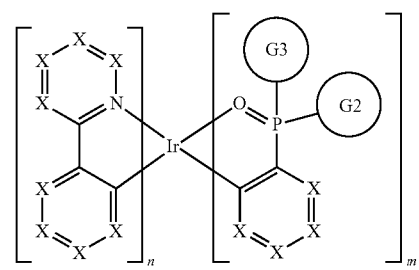

(2-2)
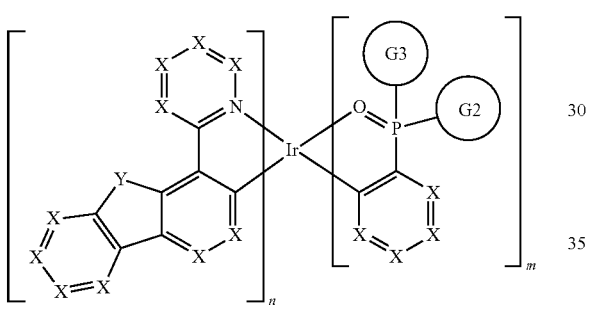

(2-3)
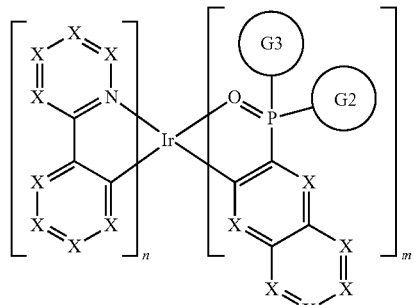

(2-4)
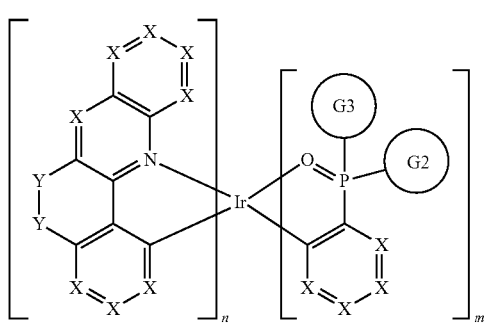

(2-5)
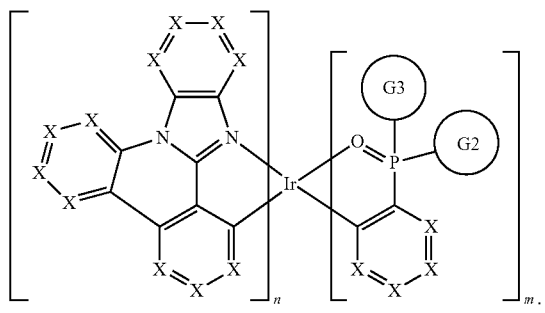

12. A mixture comprising the transition metal complex of claim 1 and at least one organic functional material selected from the group consisting of a hole injection material, a hole transport material, an electron transport material, an electron injection material, an electron blocking material, a hole blocking material, a light-emitting material, a host material, or a dopant material.

13. The mixture of claim 12, further comprising at least one organic solvent.

14. An organic electronic device comprising at least one functional layer, the functional layer comprising the transition metal complex of claim 1.

15. The organic electronic device of claim 14, wherein the functional layer is a light-emitting layer.

16. The transition metal complex of claim 1, wherein the Chemical Formula (1) is selected from the following general formulas:

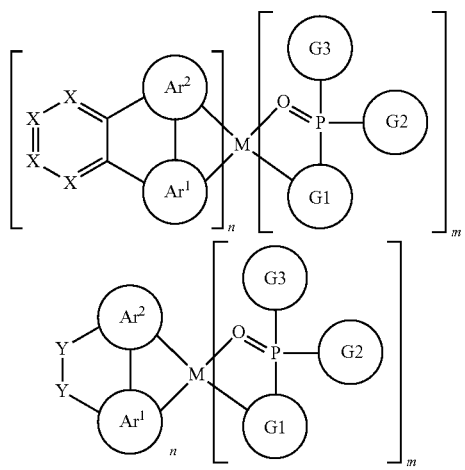

wherein:
X is selected from $CR^3$, or N;
Y is selected from $CR^4R^5$, $NR^5$, O, S, $PR^5$, $BR^5$ or $SiR^4R^5$; and
at each occurrence, $R^3$ to $R^5$ are independently selected from the group consisting of hydrogen, deuterium, a linear alkyl containing 1 to 20 carbon atoms, a linear alkoxy group containing 1 to 20 carbon atoms, or a linear thioalkoxy group containing 1 to 20 carbon atoms, a branched or cyclic alkyl containing 3 to 20 carbon atoms, a branched or cyclic alkoxy group containing 3 to 20 carbon atoms, or a branched or cyclic thioalkoxy group containing 3 to 20 carbon atoms, or a branched or cyclic silyl group containing 3 to 20 carbon atoms, or a substituted keto group containing 1 to 20 carbon atoms, alkoxycarbonyl group containing 2 to 20 carbon atoms, aryloxycarbonyl group containing 7 to 20 carbon atoms, cyano group, carbamoyl group, haloformyl group, formyl group, isocyano group, isocyanate group, thiocyanate group, or isothiocyanate group, hydroxyl group, nitro group, $CF_3$ group, Cl, Br, F, a cross-linkable group, a substituted or unsubstituted aromatic or heteroaromatic ring system containing 5 to 40 ring atoms, an aryloxy or heteroaryloxy group containing 5 to 40 ring atoms, and combination of these systems.

17. The transition metal complex of claim 6, wherein

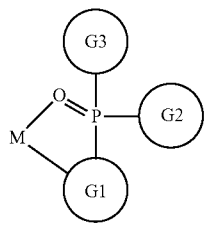

is selected from (C-1) to (C-24):

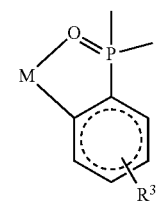
(C-1)

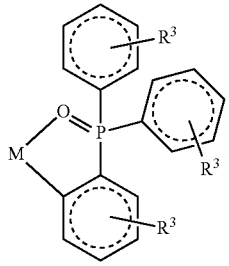
(C-2)

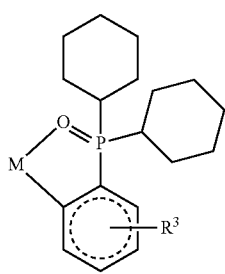
(C-3)

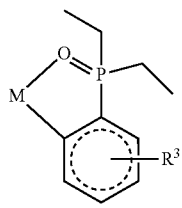
(C-4)

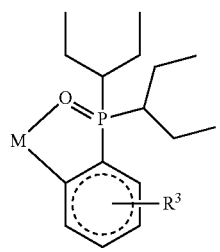
(C-5)

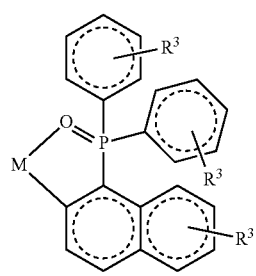
(C-6)

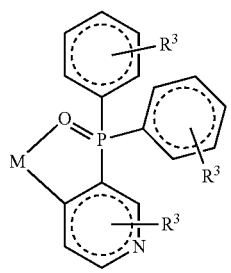
(C-7)

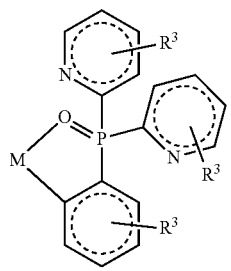
(C-8)

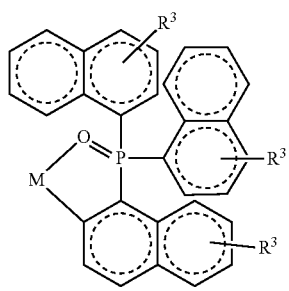
(C-9)

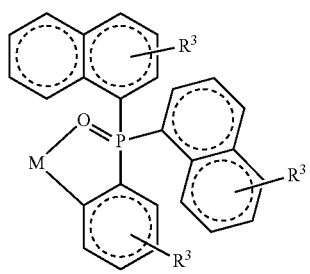 (C-10)
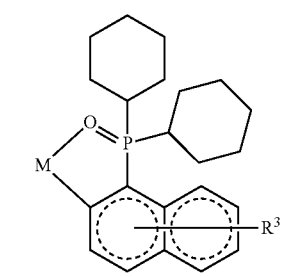 (C-11)
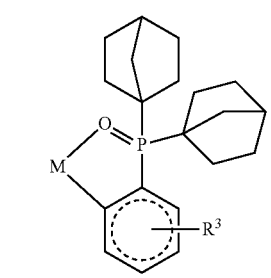 (C-12)
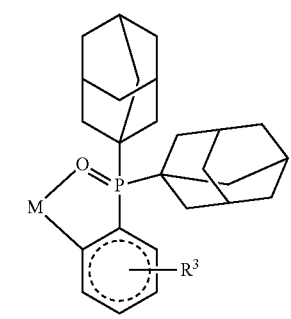 (C-13)
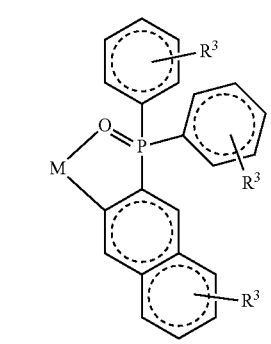 (C-14)
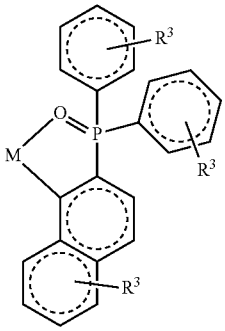 (C-15)
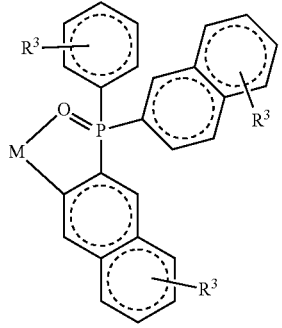 (C-16)
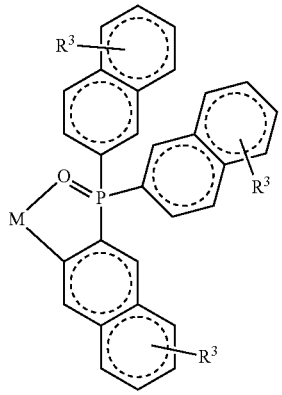 (C-17)
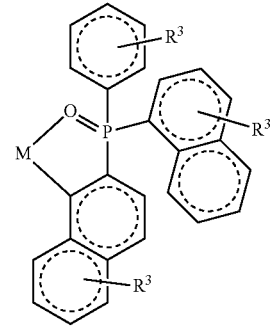 (C-18)
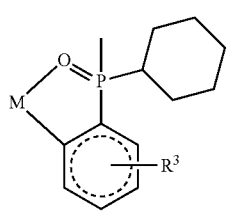 (C-19)

(C-20) 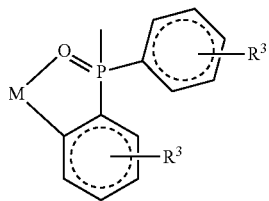
(C-21) 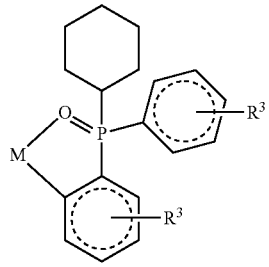
(C-22) 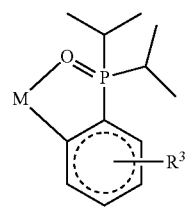
(C-23) 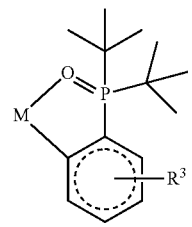
(C-24) 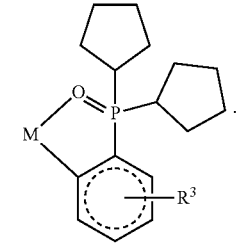
18. The transition metal complex of claim 11, wherein at each occurrence, G2 and G3 are simultaneously selected from the following groups:
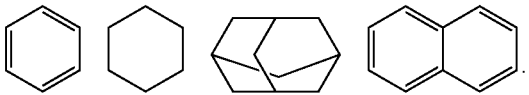
* * * * *